US010854499B2

(12) United States Patent
Yang et al.

(10) Patent No.: US 10,854,499 B2
(45) Date of Patent: Dec. 1, 2020

(54) INTEGRATED CIRCUIT, SYSTEM FOR AND METHOD OF FORMING AN INTEGRATED CIRCUIT

(71) Applicant: TAIWAN SEMICONDUCTOR MANUFACTURING COMPANY, LTD., Hsinchu (TW)

(72) Inventors: Jung-Chan Yang, Taoyuan County (TW); Ting-Wei Chiang, New Taipei (TW); Cheng-I Huang, Hsinchu (TW); Hui-Zhong Zhuang, Kaohsiung (TW); Chi-Yu Lu, New Taipei (TW); Stefan Rusu, Sunnyvale, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 351 days.

(21) Appl. No.: 15/643,825

(22) Filed: Jul. 7, 2017

(65) Prior Publication Data
US 2018/0151411 A1    May 31, 2018

Related U.S. Application Data

(60) Provisional application No. 62/427,749, filed on Nov. 29, 2016.

(51) Int. Cl.
*G06F 30/394* (2020.01)
*H01L 21/76* (2006.01)
(Continued)

(52) U.S. Cl.
CPC ............ *H01L 21/76* (2013.01); *G06F 30/394* (2020.01); *H01L 23/528* (2013.01);
(Continued)

(58) Field of Classification Search
USPC ......................................................... 716/127
See application file for complete search history.

(56) References Cited

U.S. PATENT DOCUMENTS 7,240,314 B1 * 7/2007 Leung ................. G06F 17/5068
257/773
8,423,946 B1 * 4/2013 Jin ...................... G06F 17/5045
716/126
(Continued)

FOREIGN PATENT DOCUMENTS

| CN | 102623436 | 8/2012 |
|----|-----------|--------|
| JP | 2006-190732 | 7/2006 |

(Continued)

OTHER PUBLICATIONS

Office Action dated Sep. 6, 2018 from corresponding application No. KR 10-2017-0128028.
(Continued)

*Primary Examiner* — Eric D Lee
(74) *Attorney, Agent, or Firm* — Hauptman Ham, LLP

(57) ABSTRACT

An integrated circuit structure includes a set of rails, a first and second set of conductive structures and a first set of vias. The set of rails extends in a first direction and is located at a first level. Each rail of the set of rails is separated from one another in a second direction. The first set of conductive structures extends in the second direction, overlaps the set of rails and is located at a second level. The first set of vias is between the set of rails and the first set of conductive structures. Each of the first set of vias is located where each of the first set of conductive structures overlaps each of the set of rails. The first set of vias couple the first set of conductive structures to the set of rails. The second set of conductive structures is between the set of rails.

20 Claims, 26 Drawing Sheets

(51) Int. Cl.
    *H01L 23/528* (2006.01)
    *H03K 19/094* (2006.01)
    *H01L 23/522* (2006.01)

(52) U.S. Cl.
    CPC ....... *H01L 23/5286* (2013.01); *H03K 19/094* (2013.01); *H01L 23/5226* (2013.01); *H01L 2924/0002* (2013.01)

(56) References Cited

U.S. PATENT DOCUMENTS

2002/0170020 A1* 11/2002 Darden ............... H01L 23/5286
                                                            716/120
2006/0166434 A1    7/2006 Kinoshita et al.

FOREIGN PATENT DOCUMENTS

| JP | 2008-227130 | 9/2008 |
|----|-------------|--------|
| TW | 201405351   | 2/2014 |

OTHER PUBLICATIONS

Office Action dated Sep. 26, 2018 from corresponding application No. TW 106136039.

* cited by examiner

INTEGRATED CIRCUIT, SYSTEM FOR AND METHOD OF FORMING AN INTEGRATED CIRCUIT

BACKGROUND

In many integrated circuits (ICs), power rails are used to distribute power to functional circuit elements formed in a substrate. Power is often delivered to power rails using metal layers between the power rails and power straps at a level above the level of the power rails.

The resistance of an IC structure including such metal layers can affect the efficiency of power delivery, heat generation, and susceptibility to electromigration (EM). Routing of the metal layers can also impact the routing of additional electrical connections to the functional circuit elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
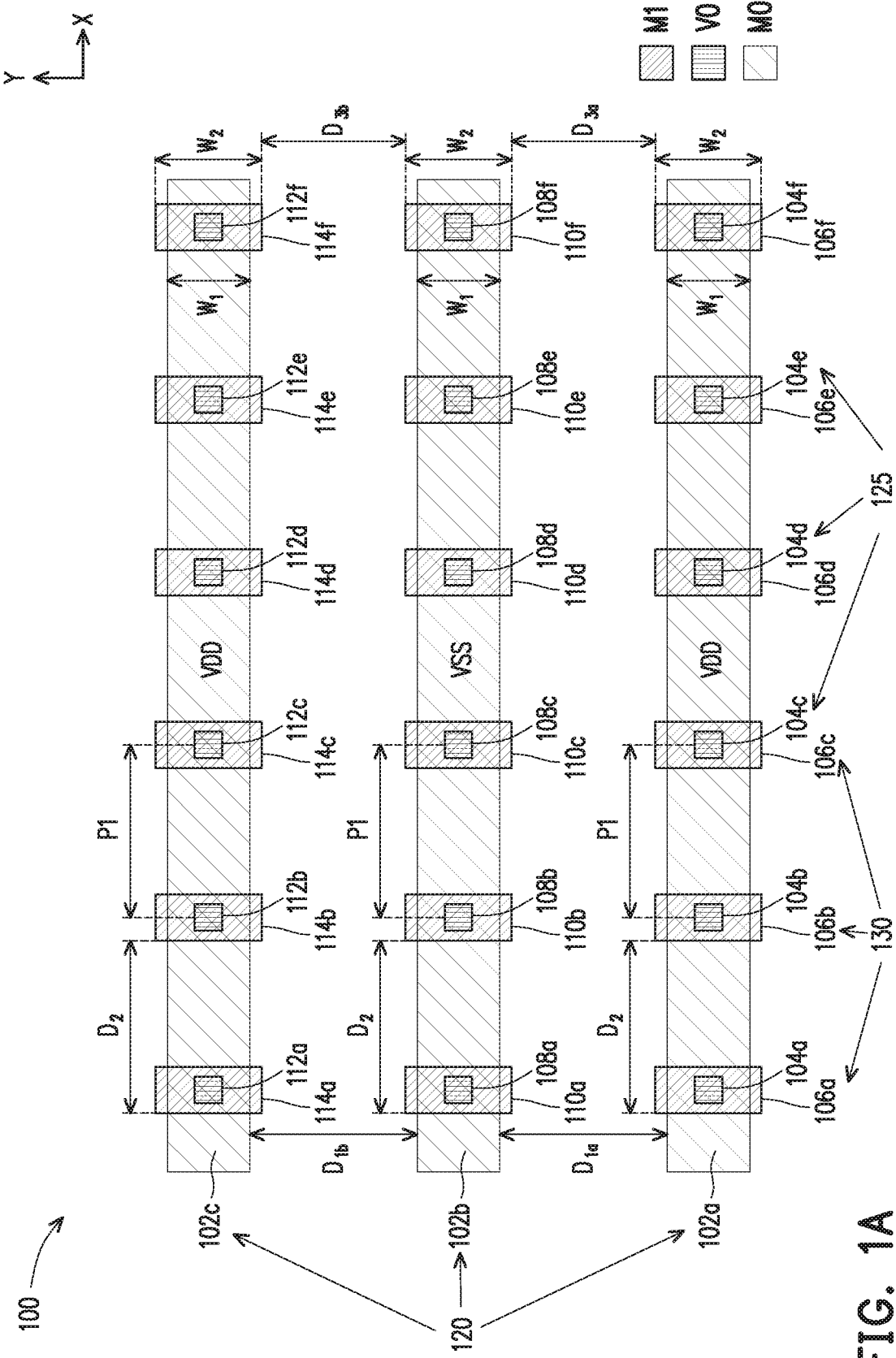
FIG. 1A is a top view of an IC structure, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an IC structure includes a set of rails extending in a first direction and being located at a first level, a first set of conductive structures extending in a second direction and being located at a second level different than the first level, and a first set of vias between the set of rails and the first set of conductive structures. The first set of conductive structures overlap the set of rails. The first set of vias electrically couple the set of rails to the first set of conductive structures.

In some embodiments, the set of rails corresponds to a power rail configured to supply voltages VDD/VSS to other portions of the IC. In some embodiments, the first set of conductive structures corresponds to a stub power structure located on a metal 1 (M1) layer of an IC. In some embodiments, the stub power structure is electrically coupled to higher layers (e.g., metal 2 (M2) or metal 3 (M3)) within ICs. In some embodiments, M2 or M3 layers are configured as power straps. Other configurations of via layers or metal layers are within the scope of the present disclosure.

In some embodiments, the stub power structure is configured to supply VDD/VSS to other portions of the IC. In some embodiments, in comparison with other approaches, the stub power structure provides more metal routing areas and via access points resulting in more electrical connections to other portions of the IC and better electromigration performance.

FIG. 1A is a top view of a portion of an IC structure 100, in accordance with some embodiments. IC structure 100 includes a first rail 102a, a second rail 102b, and a third rail 102c (hereinafter referred to as "a set of rails 120") each extending in a first direction X and separated from one another in a second direction Y. IC structure 100 also includes a first set of vias 125 and a first set of conductive structures 130 arranged in rows and columns. The first set of vias 125 includes one or more of vias 104a, ..., 104f, 108a, ..., 108f, or 112a, ..., 112f. For ease of illustration, the arrow identifying the first set of vias 125 in FIGS. 1A-1B, 2A & 3A points to vias 104c, 104d and 104e. However, the first set of vias 125 also refers to one or more members not identified in FIGS. 1A-1B, 2A & 3A (e.g., one or more of vias 104a, 104b, 104f, 108a, ..., 108f, or 112a, ..., 112f). The first set of conductive structures 130 includes one or more of conductive structures 106a, ..., 106f, 110a, ..., 110f, or 114a, ..., 114f. For ease of illustration, the arrow identifying the first set of conductive structures 130 in FIGS. 1A-1B, 2A & 3A points to conductive structures 106a, 106b and 106c. However, the first set of conductive structures 130 also refers to one or more members not identified in FIGS. 1A-1B, 2A & 3A (e.g., one or more of conductive structures 106d, ..., 106f, 110a, ..., 110f, or 114a, ..., 114f). Three rows and six columns are used for illustration. A different number of rows or columns is within the contemplated scope of the present disclosure.

Each row of vias of the first set of vias 125 is directly over and directly coupled with a rail of the set of rails 120. Each row of conductive structures of the first set of conductive structures 130 is directly over and directly coupled with a corresponding via of the first set of vias 125. Each rail of the set of rails 120 is electrically coupled with conductive structures of the first set of conductive structures 130 by corresponding vias of the first set of vias 125.

In an exemplary manner, first rail 102a is electrically coupled with conductive structures 106a, 106b, ..., 106f by corresponding vias 104a, 104b, ..., 104f. Similarly, second and third rails 102b, 102c are electrically coupled with corresponding conductive structures 110a, 110b, ..., 110f and 114a, 114b, ..., 114f by corresponding vias 108a, 108b, ..., 108f and 112a, 112b, ..., 112f. In some embodiments, integrated circuit structure 100 is configured to supply a first supply voltage VDD, a second supply voltage VSS or a current to at least a portion of an IC (not shown).

Second rail 102b is between first rail 102a and third rail 102c. First rail 102a is separated from second rail 102b in the second direction Y by a distance $D_{1a}$. Second rail 102b is separated from third rail 102c in the second direction Y by a distance $D_{1b}$. In some embodiments, distance $D_{1a}$ is the same as distance $D_{1b}$. In some embodiments, distance $D_{1a}$ differs from distance $D_{1b}$.

First rail 102a or third rail 102c is configured to supply a first supply voltage VDD to other elements of an IC (not shown). Second rail 102b is configured to supply a second supply voltage VSS to other elements of an IC (not shown). Other configurations for the first rail 102a, second rail 102b or third rail 102c are within the contemplated scope of the present disclosure. In some embodiments, first rail 102a or third rail 102c is configured to supply the second supply voltage VSS to other elements of an IC (not shown), and second rail 102b is configured to supply the first supply voltage VDD to other elements of an IC (not shown). In some embodiments, first rail 102a, second rail 102b or third rail 102c is referred to as a power rail. Second rail 102b alternates with first rail 102a or third rail 102c to supply corresponding second supply voltage VSS or first supply voltage VDD.

Each rail of the set of rails 120 has a corresponding width $W_1$ in the second direction Y. In some embodiments, each width $W_1$ of the rails 120 is uniform. In some embodiments, at least one width $W_1$ of a rail differs from at least one width $W_1$ of another rail.

Each of vias 104a, 104b, ..., 104f is directly over and directly coupled to first rail 102a. Similarly, each of vias 108a, 108b, ..., 108f and 112a, 112b, ..., 112f is directly over and directly coupled to corresponding second rail 102b and third rail 102c.

A pitch P1 between all adjacent vias of the first set of vias 125 coupled with a same rail is uniform. In some embodiments, the pitch P1 between a pair of adjacent vias coupled with the same rail differs from the pitch P1 between another pair of adjacent vias coupled with the same rail. For example, in these embodiments, the pitch P1 between via 104a and via 104b of rail 102a differs from the pitch P1 between via 104b and via 104c of rail 102a. In some embodiments, the pitch P1 between a pair of adjacent vias coupled with a rail differs from the pitch P1 between another pair of adjacent vias coupled with another rail. For example, in these embodiments, the pitch P1 between via 104a and via 104b of first rail 102a differs from the pitch P1 between via 108b and via 108c of second rail 102b.

The first set of conductive structures 130 extends in the second direction Y, and is also referred to as stubs. Each of conductive structures 106a, 106b, ..., 106f overlap the first rail 102a. Similarly, each of conductive structures 110a, 110b, ..., 110f and 114a, 114b, ..., 114f overlap the corresponding second and third rail 102b, 102c.

Each of vias 104a, 104b, ..., 104f is located where corresponding conductive structures 106a, 106b, ..., 106f overlap the first rail 102a. Similarly, each of vias 108a, 108b, ..., 108f and 112a, 112b, ..., 112f is located where corresponding conductive structures 110a, 110b, ..., 110f and 114a, 114b, ..., 114f overlap the corresponding second and third rails 102b, 102c.

A distance $D_2$ between all adjacent conductive structures of the first set of conductive structures 130 coupled with a same rail is uniform. In some embodiments, the distance $D_2$ between a pair of adjacent conductive structures of the first set of conductive structures 130 coupled with the same rail differs from the distance $D_2$ between another pair of adjacent conductive structures of the first set of conductive structures 130 coupled with the same rail. For example, in these embodiments, the distance $D_2$ between conductive structure 106a and conductive structure 106b of rail 102a differs from the distance $D_2$ between conductive structure 106b and conductive structure 106c of rail 102a.

In some embodiments, the distance $D_2$ between a pair of adjacent conductive structures of the first set of conductive structures 130 coupled with a rail differs from the distance $D_2$ between another pair of adjacent conductive structures of the first set of conductive structures 130 coupled with another rail. For example, in these embodiments, the distance $D_2$ between conductive structure 106a and conductive structure 106b of first rail 102a differs from the distance $D_2$ between conductive structure 108b and conductive structure 108c of second rail 102b.

Each conductive structure of the first set of conductive structures 130 has a corresponding width $W_2$ in the second direction Y. In some embodiments, each width $W_2$ of the first set of conductive structures 130 is uniform. In some embodiments, at least one width $W_2$ of a conductive structure of the first set of conductive structures 130 differs from at least one width $W_2$ of another conductive structure of the first set of conductive structures 130.

In some embodiments, at least one width $W_2$ of a conductive structure of the first set of conductive structures 130 is the same as at least one width $W_1$ of a rail of the set of rails 120. In some embodiments, at least one width $W_2$ of a conductive structure of the first set of conductive structures 130 differs from at least one width $W_1$ of a rail of the set of rails 120.

A conductive structure of conductive structures 106a, 106b, . . . , 106f is separated from a corresponding conductive structure of conductive structures 110a, 110b, . . . , 110f in the second direction Y by a distance $D_{3a}$. A conductive structure of conductive structures 110a, 110b, . . . , 110f is separated from a corresponding conductive structure of conductive structures 114a, 114b, . . . , 114f in the second direction Y by a distance $D_{3b}$. In some embodiments, distance $D_{3a}$ is the same as distance $D_{3b}$. In some embodiments, distance $D_{3a}$ differs from distance $D_{3b}$. In some embodiments, at least one distance of distances $D_{1a}$ or $D_{1b}$ is the same as at least one distance of distances $D_{3a}$ or $D_{3b}$. In some embodiments, at least one distance of distances $D_{1a}$ or $D_{1b}$ differs from at least one distance of distances $D_{3a}$ or $D_{3b}$.

In some embodiments, by not coupling one or more of conductive structures 106a, . . . , 106f, 110a, . . . , 110f, 114a, . . . , 114f to other conductive structures of conductive structures 106a, . . . , 106f, 110a, . . . , 110f, 114a, . . . , 114f on the same metal layer, the space between two or more of conductive structures 106a, . . . , 106f, 110a, . . . , 110f, 114a, . . . , 114f can be utilized for additional routing resources on the same metal layer, and the additional routing resources can provide additional via access points to other metal layers resulting in IC structure 100 having a reduced size compared with other approaches.

Figure 1B:
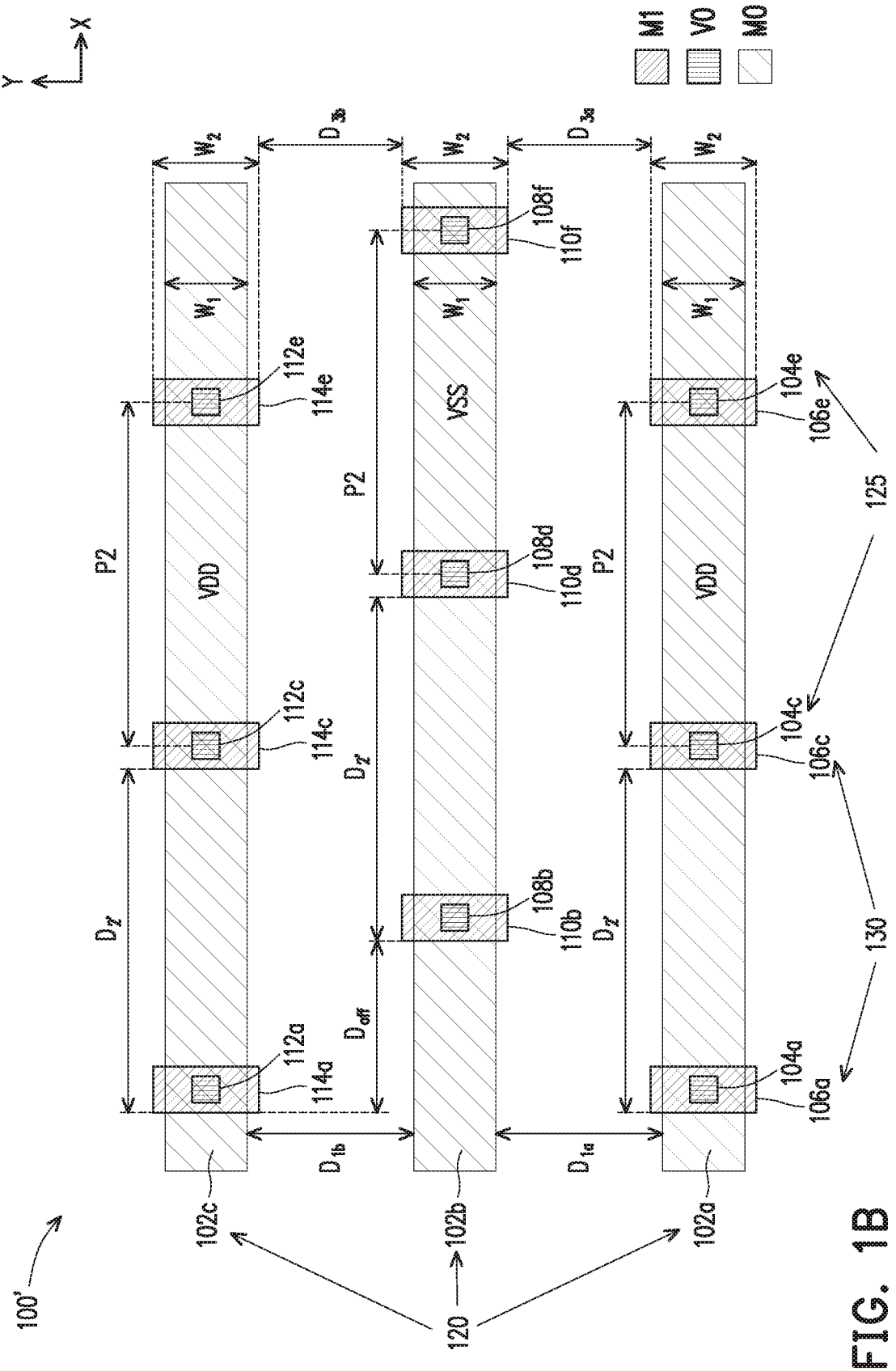
FIG. 1B is a top view of another IC structure, in accordance with some embodiments.

FIG. 1B is a top view of a portion of another IC structure 100', in accordance with some embodiments. Components that are the same or similar to those in FIG. 1A are given the same reference numbers, and detailed description thereof is thus omitted.

In comparison with IC structure 100 of FIG. 1A, IC structure 100' includes fewer vias of the first set of vias 125 and fewer conductive structures of the first set of conductive structures 130. For example, IC structure 100' does not include vias 104b, 104d and 104f, vias 108a, 108c and 108e, vias 112b, 112d and 112f, conductive structures 106b, 106d and 106f, conductive structures 110a, 110c and 110e and conductive structures 114b, 114d and 114f.

Each row of vias of the first set of vias 125 is offset from an adjacent row of vias by an offset distance $D_{off}$. For example, vias 104a, 104c and 104e alternate with vias 108b, 108d and 108f in the first direction X. Similarly, vias 112a, 112c and 112e alternate with vias 108b, 108d and 108f in the first direction X.

Each row of conductive structures of the first set of conductive structures 130 is offset from an adjacent row of conductive structures by offset distance $D_{off}$. For example, conductive structures 106a, 106c and 106e alternate with conductive structures 110b, 110d and 110f in the first direction X. Similarly, conductive structures 114a, 114c and 114e alternate with conductive structures 110b, 110d and 110f in the first direction X.

By including fewer vias of the first set of vias 125 in IC structure 100', a pitch P2 between adjacent vias of a same rail is increased when compared with IC structure 100. A pitch P2 between all adjacent vias of the first set of vias 125 coupled with a same rail is uniform. In some embodiments, the pitch P2 between a pair of adjacent vias coupled with the same rail differs from the pitch P2 between another pair of adjacent vias coupled with the same rail. For example, in these embodiments, the pitch P2 between via 104a and via 104c of rail 102a differs from the pitch P2 between via 104c and via 104e of rail 102a. In some embodiments, the pitch P2 between a pair of adjacent vias coupled with a rail differs from the pitch P2 between another pair of adjacent vias coupled with another rail. For example, in these embodiments, the pitch P2 between via 104a and via 104c of first rail 102a differs from the pitch P2 between via 108b and via 108d of second rail 102b.

By including fewer conductive structures of the first set of conductive structures 130 in IC structure 100', a distance $D_{2'}$ between adjacent conductive structures of a same rail is increased when compared with IC structure 100. A distance $D_{2'}$ between all adjacent conductive structures of the first set of conductive structures 130 coupled with a same rail is uniform. In some embodiments, the distance $D_{2'}$ between a pair of adjacent conductive structures of the first set of conductive structures 130 coupled with the same rail differs from the distance $D_{2'}$ between another pair of adjacent conductive structures of the first set of conductive structures 130 coupled with the same rail. For example, in these embodiments, the distance $D_{2'}$ between conductive structure 106a and conductive structure 106c of rail 102a differs from the distance $D_{2'}$ between conductive structure 106c and conductive structure 106e of rail 102a.

In some embodiments, the distance $D_{2'}$ between a pair of adjacent conductive structures of the first set of conductive structures 130 coupled with a rail differs from the distance $D_{2'}$ between another pair of adjacent conductive structures of the first set of conductive structures 130 coupled with another rail. For example, in these embodiments, the distance $D_{2'}$ between conductive structure 106a and conductive structure 106c of first rail 102a differs from the distance $D_{2'}$ between conductive structure 108b and conductive structure 108d of second rail 102b.

In some embodiments, by not coupling one or more of conductive structures 106a, 106c, 106e, 110b, 110d, 110f, 114a, 114c or 114e to other conductive structures of conductive structures 106a, 106c, 106e, 110b, 110d, 110f, 114a, 114c or 114e on the same metal layer, the space between two or more of conductive structures 106a, 106c, 106e, 110b, 110d, 110f, 114a, 114c or 114e can be utilized for additional routing resources on the same metal layer, and the additional routing resources can provide additional via access points to other metal layers resulting in IC structure 100' having a reduced size compared with other approaches.

Figure 2A:
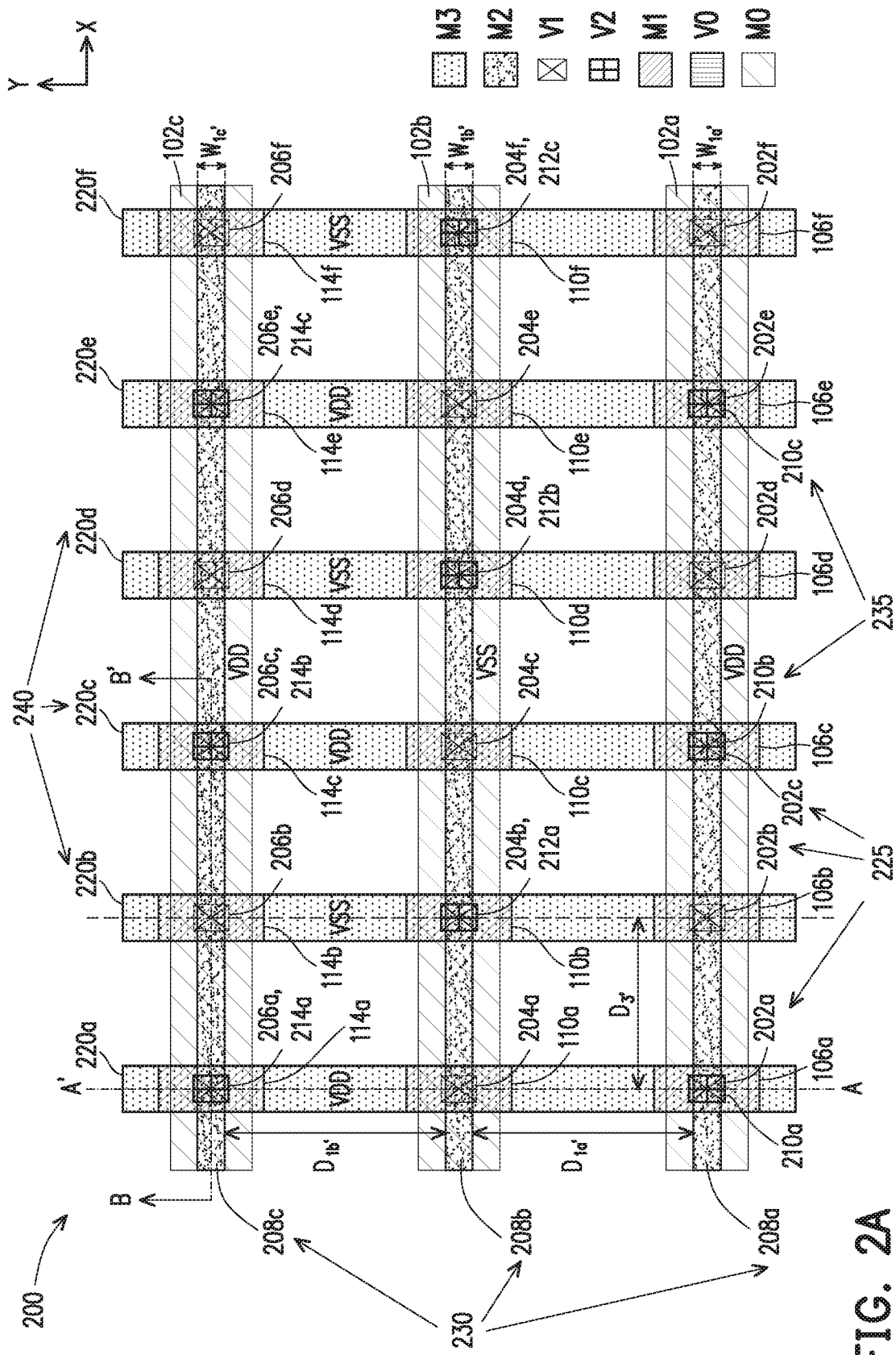
FIGS. 2A, 2B and 2C are diagrams of an IC structure, in accordance with some embodiments.
Figure 2B:
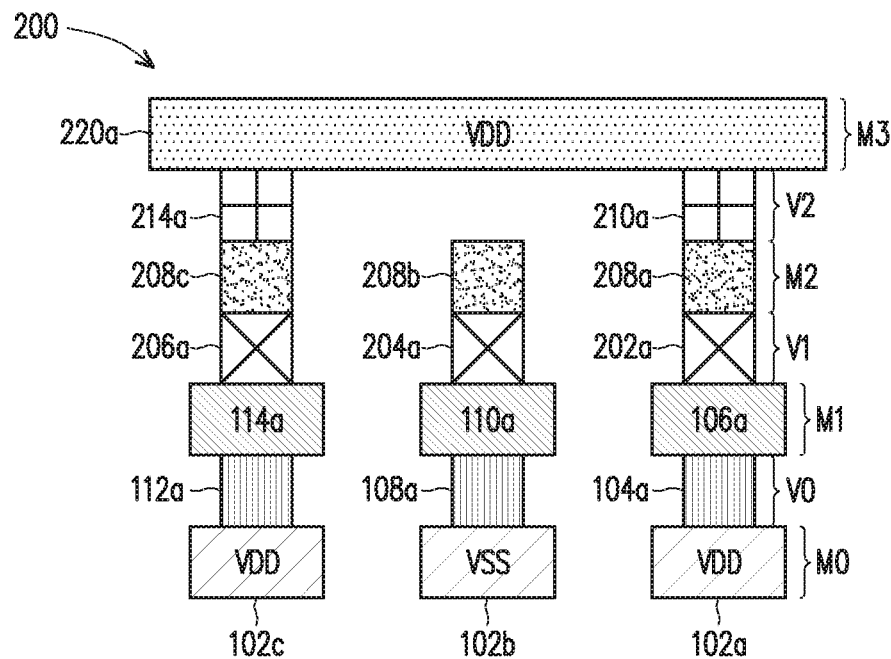
Figure 2C:
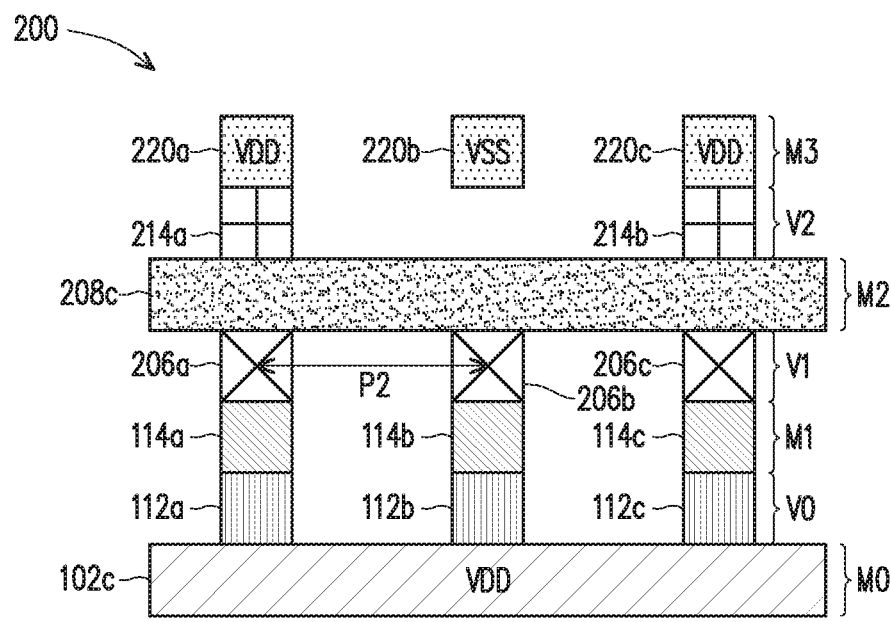

FIGS. 2A, 2B and 2C are diagrams of an IC structure 200, in accordance with some embodiments. FIG. 2A is a top view of IC structure 200, FIG. 2B is a cross-sectional view of IC structure 200 as intersected by plane A-A', and FIG. 2C is a cross-sectional view of IC structure 200 as intersected by plane B-B'.

Components that are the same or similar to those in FIGS. 1A-1B, 3A-3C (shown below), 4A-4B (shown below), 5A-5B (shown below) are given the same reference numbers, and detailed description thereof is thus omitted.

IC structure 200 includes IC structure 100 and a second set of vias 225 arranged in the same rows and columns of FIG. 1A. The second set of vias 225 includes one or more of vias 202a, 202b, . . . , 202f, vias 204a, 204b, . . . , 204f or vias 206a, 206b, . . . , 206f. For ease of illustration, the arrow identifying the second set of vias 225 in FIGS. 2A & 3A points to vias 202a, 202b and 202c. However, the second set of vias 225 also refers to one or more members not identified in FIGS. 2A & 3A (e.g., one or more of vias 202d, . . . , 202f, vias 204a, 204b, . . . , 204f or vias 206a, 206b, . . . , 206f).

IC structure 200 further includes a second set of conductive structures 230 arranged in rows, a third set of conductive structures 240 arranged in columns and a third set of vias 235.

The second set of conductive structures 230 includes one or more of a first conductive structure 208a, a second conductive structure 208b or a third conductive structure 208c.

The third set of conductive structures 240 includes one or more of conductive structures 220a, 220b, . . . , 220f. For ease of illustration, the arrow identifying the third set of conductive structures 240 in FIGS. 2A & 3A points to conductive structures 220b, 220c and 220d. However, the third set of conductive structures 240 also refers to one or more members not identified in FIGS. 2A & 3A (e.g., one or more of conductive structures 220a, 220e, 220f).

The third set of vias 235 includes one or more of vias 210a, 210b, 210c, vias 212a, 212b, 212c or vias 214a, 214b, 214c. For ease of illustration, the arrow identifying the third set of vias 235 in FIGS. 2A & 3A points to vias 210b and 210c. However, the third set of vias 235 also refers to one or more members not identified in FIGS. 2A & 3A (e.g., one or more of vias 210a, vias 212a, 212b, 212c or vias 214a, 214b, 214c).

Each row of vias of the second set of vias 225 is directly over and directly coupled with a corresponding conductive structure of the first set of conductive structures 130. In an exemplary manner, each of vias 202a, 202b, . . . , 202f is directly over and directly coupled to corresponding conductive structures 106a, 106b, . . . , 106f. Similarly, each of vias 204a, 204b, . . . , 204f, 206a, 206b, . . . , 206f, is directly over and directly coupled to corresponding conductive structures 110a, 110b, . . . , 110f, 114a, 114b, . . . , 114f.

Each row of conductive structures of the second set of conductive structures 230 is directly over and directly coupled with a corresponding row of vias of the second set of vias 225. In an exemplary manner, each of vias 202a, 202b, . . . , 202f is directly below and directly coupled to first conductive structure 208a. Similarly, each of vias 204a, 204b, . . . , 204f, and vias 206a, 206b, . . . , 206f is directly below and directly coupled to corresponding second and third conductive structure 208b, 208c.

Each conductive structure of the second set of conductive structures 230 is electrically coupled with conductive structures of the first set of conductive structures 130 by corresponding vias of the second set of vias 225. In an exemplary manner, first conductive structure 208a is electrically coupled to conductive structures 106a, 106b, . . . , 106f by corresponding vias 202a, 202b, . . . , 202f. Similarly, second and third conductive structures 208b, 208c are electrically coupled to corresponding conductive structures 110a, 110b, . . . , 110f, and 114a, 114b, . . . , 114f by corresponding vias 204a, 204b, . . . , 204f and vias 206a, 206b, . . . , 206f.

The second set of vias 225 has the same pitch P1 as the pitch P1 for the first set of vias 125. In some embodiments, at least one pitch P1 between a pair of adjacent vias of the second set of vias 225 differs from at least one pitch P1 between a pair of adjacent vias of the first set of vias 125. For example, in these embodiments, the pitch P1 between via 104a and via 104b of rail 102a differs from the pitch P1 between via 202a and via 202b of first conductive structure 208a.

Each of first conductive structure 208a, second conductive structure 208b and third conductive structure 208c extend in the first direction X and are separated from one another in the second direction Y. Second conductive structure 208b is between first conductive structure 208a and third conductive structure 208c. First conductive structure 208a is separated from second conductive structure 208b in the second direction Y by a distance $D_{1a'}$. Second conductive structure 208b is separated from third conductive structure 208c in the second direction Y by a distance $D_{1b''}$. In some embodiments, distance $D_{1a'}$ is the same as distance $D_{1b''}$. In some embodiments, distance $D_{1a'}$ differs from distance $D_{1b''}$.

Each conductive structure of the second set of conductive structures 230 has a corresponding width $W_{1'}$ in the second direction Y. In some embodiments, each width $W_{1'}$ of the second set of conductive structures 230 is uniform. In some embodiments, at least one width $W_{1'}$ of a conductive structure of the second set of conductive structures 230 differs from at least one width $W_{1'}$ of another conductive structure of the second set of conductive structures 230.

Each of vias 210a, 210b, 210c is directly over and directly coupled to first conductive structure 208a. Similarly, vias 212a, 212b, 212c and vias 214a, 214b, 214c are directly over and directly coupled to corresponding second and third conductive structures 208b, 208c.

Each of vias 210a, 210b, 210c is directly below and directly coupled to a corresponding conductive structure of conductive structures 220a, 220c, 220e. Similarly, each of vias 212a, 212b, 212c, 214a, 214b, 214c is directly below and directly coupled to a corresponding conductive structure of conductive structures 220b, 220d, 220f, 220a, 220c, 220e.

An arrangement of the third set of vias 235 is similar to the arrangement of the first set of vias 125 shown in FIG. 1B. For example, each of vias 210a, 210b, 210c, 212a, 212b, 212c, 214a, 214b, 214c is located at a same corresponding location in the x-y plane as corresponding vias 104a, 104c, 104e, 108b, 108d, 108f, 112a, 112c, 112e shown in FIG. 1B. In some embodiments, a location of a via of the third set of vias 235 differs from a location of a corresponding via of the first set of vias 125. Furthermore, a pitch P1 between adjacent vias of the third set of vias 235 is the same as pitches P1 between adjacent vias of the first set of vias 125. In some embodiments, a pitch P1 between adjacent vias of the third set of vias 235 differs from a pitch P1 between adjacent vias of the first set of vias 125.

Each of conductive structures 220a, 220b, . . . , 220f extend in the second direction Y. The fourth set of conductive structures 240 is also referred to as straps. In some embodiments, a strap is a conductive structure that overlaps and is electrically coupled to two or more underlying, conductive structures. Each of conductive structures 220a, 220b, . . . , 220f overlap the first conductive structure 208a, second conductive structure 208b, and third conductive structure 208c.

A distance $D_{3'}$ between all adjacent conductive structures of the third set of conductive structures 240 is the same as the distance $D_2$ (shown in FIG. 1A) between all adjacent conductive structures of the first set of conductive structures 130. In some embodiments, the distance $D_{3'}$ between a pair of adjacent conductive structures of the third set of conductive structures 240 differs from the distance $D_{3'}$ between another pair of adjacent conductive structures of the third set of conductive structures 240. In some embodiments, the distance $D_{3'}$ between a pair of adjacent conductive structures of the third set of conductive structures 240 differs from the distance $D_2$ (shown in FIG. 1A) between a pair of adjacent conductive structures of the first set of conductive structures 130 coupled to rail 102a.

Conductive structure 220a is electrically coupled to the first conductive structure 208a by via 210a, and electrically coupled to the third conductive structure 208c by via 214a. Via 210a is located where conductive structure 220a overlaps first conductive structure 208a. Via 214a is located where conductive structure 220a overlaps third conductive structure 208c.

Conductive structure 220a is configured to supply first supply voltage VDD. In some embodiments, conductive structure 220a is configured to supply second supply voltage VSS.

Conductive structure 220b is electrically coupled to the second conductive structure 208b by via 212a. Via 212a is located where conductive structure 220b overlaps second conductive structure 208b.

Conductive structure 220c is electrically coupled to the first conductive structure 208a by via 210b, and electrically coupled to the third conductive structure 208c by via 214b. Via 210b is located where conductive structure 220c overlaps first conductive structure 208a. Via 214b is located where conductive structure 220c overlaps third conductive structure 208c.

Conductive structure 220d is electrically coupled to the second conductive structure 208b by via 212b. Via 212b is located where conductive structure 220d overlaps second conductive structure 208b.

Conductive structure 220e is electrically coupled to the first conductive structure 208a by via 210c, and electrically coupled to the third conductive structure 208c by via 214c. Via 210c is located where conductive structure 220e overlaps first conductive structure 208a. Via 214c is located where conductive structure 220e overlaps third conductive structure 208c.

Conductive structure 220f is electrically coupled to the second conductive structure 208b by via 212c. Via 212c is located where conductive structure 220f overlaps second conductive structure 208b.

Conductive structure 220a, 220c or 220e is configured to supply first supply voltage VDD. In some embodiments, conductive structure 220a, 220c or 220e is configured to supply second supply voltage VSS. Conductive structure 220b, 220d or 220f is configured to supply second supply voltage VSS. In some embodiments, conductive structure 220b, 220d or 220f is configured to supply first supply voltage VDD. In some embodiments, conductive structures 220a, 220b, . . . , 220f are referred to as a power strap.

As shown in FIGS. 2B-2C (in part), first rail 102a, second rail 102b and third rail 102c are positioned at a metal zero (M0) layer of IC structure 200. Vias 104a, 104b, . . . , 104f, vias 108a, 108b, . . . , 108f and vias 112a, 112b, . . . , 112f are positioned at a via zero (V0) layer of IC structure 200. Conductive structures 106a, 106b, . . . , 106f, conductive structures 110a, 110b, . . . , 110f, and conductive structures 114a, 114b, . . . , 114f are positioned at a metal one (M1) layer of IC structure 200. Each of the conductive structures that are positioned at the M1 layer extend in the same direction. Vias 202a, 202b, . . . , 202f, vias 204a, 204b, . . . , 204f and vias 206a, 206b, . . . , 206f are positioned at a via one (V1) layer of IC structure 200. First conductive structure 208a, second conductive structure 208b and third conductive structure 208c are positioned at a metal two (M2) layer of IC structure 200. Vias 210a, 210b, 210c, vias 212a, 210b, 210c and vias 214a, 214b, 214c are positioned at a via two (V2) layer of IC structure 200. Conductive structures 220a, 220b, . . . , 220f are positioned at a metal three (M3) layer of IC structure 200. Other configurations of via layers or metal layers are within the scope of the present disclosure.

M1 layer is separated from M0 layer by V0 layer. In some embodiments, one or more metal layers (not shown) separate M0 layer and M1 layer. M2 layer is separated from M1 layer by V1 layer. In some embodiments, one or more metal layers (not shown) separate M1 layer and M2 layer. M3 layer is separated from M2 layer by V2 layer. In some embodiments, one or more metal layers (not shown) separate M2 layer and M3 layer. In some embodiments, each of the conductive structures of IC structure 100, 200 located in the M1 layer extend in the same direction. Other configurations of via layers or metal layers are within the scope of the present disclosure.

A conductive structure of the first set of conductive structures 130 or the third set of conductive structures 240 is parallel to another conductive structure of the first set of conductive structures 130 or the third set of conductive structures 240. In some embodiments, a conductive structure of the first set of conductive structures 130 or the third set of conductive structures 240 is not parallel to another conductive structure of the first set of conductive structures 130 or the third set of conductive structures 240.

A member of the set of rails 120 or the second set of conductive structures 230 is parallel to another member of the set of rails 120 or the second set of conductive structures 230. In some embodiments, a member of the set of rails 120 or the second set of conductive structures 230 is not parallel to another member of the set of rails 120 or the second set of conductive structures 230.

In some embodiments, at least one member of the set of rails 120, the first set of conductive structures 130, the second set of conductive structures 230 or the third set of conductive structures 240 is a conductive material including copper, aluminum, alloys thereof or other suitable conductive materials, that is formed in one or more metallization layers by one or more of a physical vapor deposition process, a chemical vapor deposition process, a plating process, or other suitable processes.

In some embodiments, at least one via of the first set of vias 125, the second set of vias 225 or the third set of vias 235 is a metal line, a via, a through silicon via (TSV), an inter-level via (ILV), a slot via, an array of vias, or another suitable conductive line. In some embodiments, at least one via of the first set of vias 125, the second set of vias 225 or the third set of vias 235 includes copper, aluminum, nickel, titanium, tungsten, cobalt, carbon, alloys thereof or another suitable conductive material, that is formed in one or more metallization layers by one or more of a physical vapor deposition process, a chemical vapor deposition process, a plating process, or other suitable processes. In some embodiments, at least one via of the first set of vias 125, the second set of vias 225 or the third set of vias 235 includes one or more conductive line portions.

In some embodiments, by not coupling one or more of conductive structures 106a, . . . , 106f; 110a, . . . , 110f; 114a, . . . , 114f to other conductive structures of conductive structures 106a, . . . , 106f; 110a, . . . , 110f; 114a, . . . , 114f on the same metal layer (e.g., M1), the space between two or more of conductive structures 106a, . . . , 106f; 110a, . . . , 110f; 114a, . . . , 114f can be utilized for additional M1 routing resources, and the additional routing resources can provide additional via access points to other metal layers resulting in IC structure 200 having a reduced size compared with other approaches. Other configurations of via layers or metal layers are within the scope of the present disclosure.

Figure 3A:
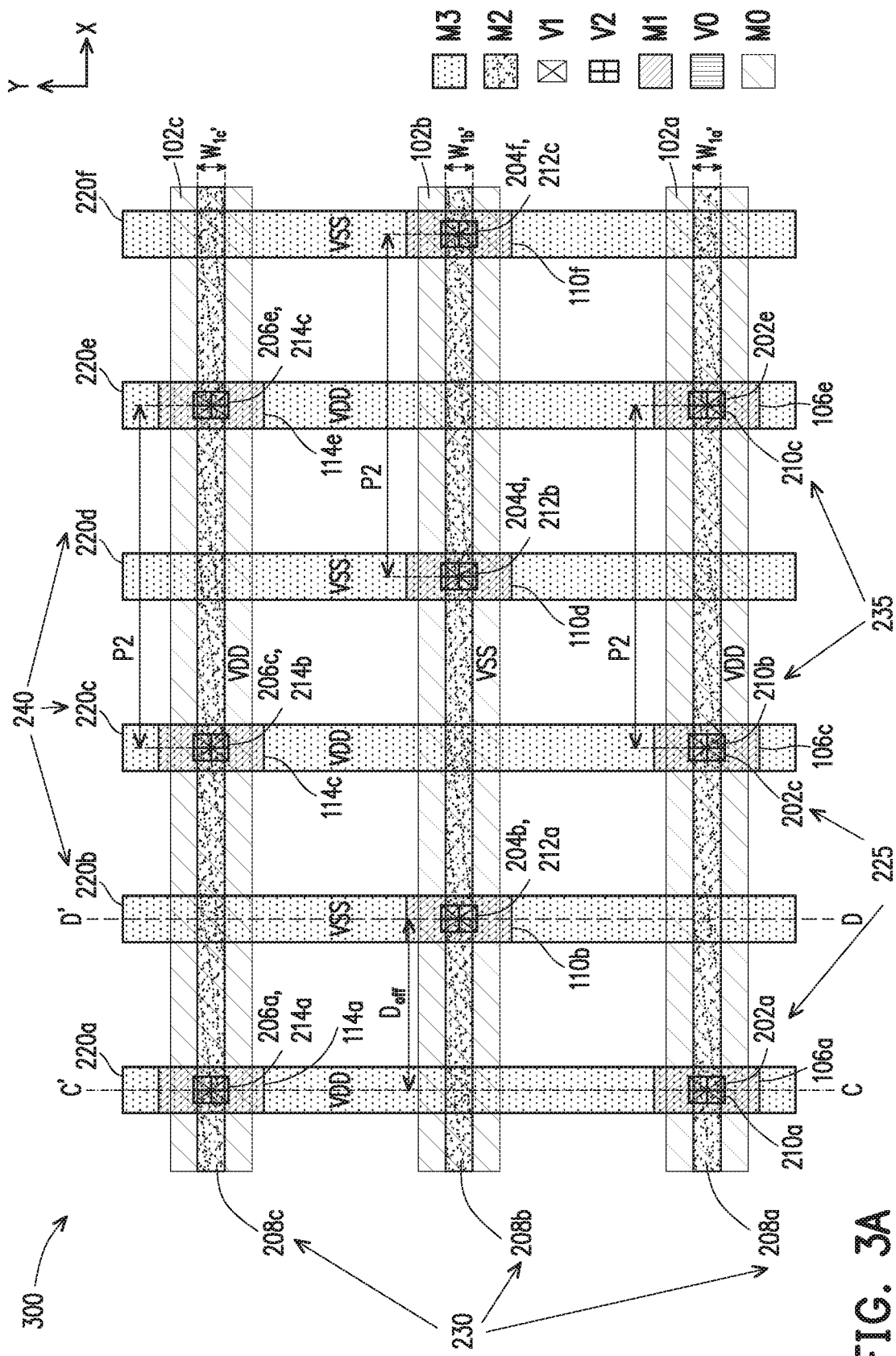
FIGS. 3A, 3B and 3C are diagrams of another IC structure, in accordance with some embodiments.
Figure 3B:
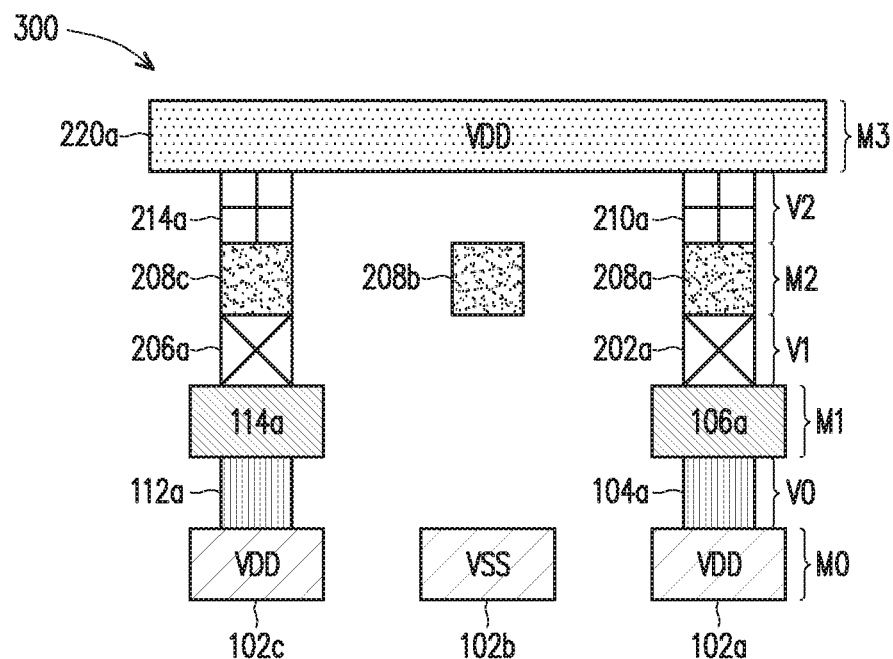
Figure 3C:
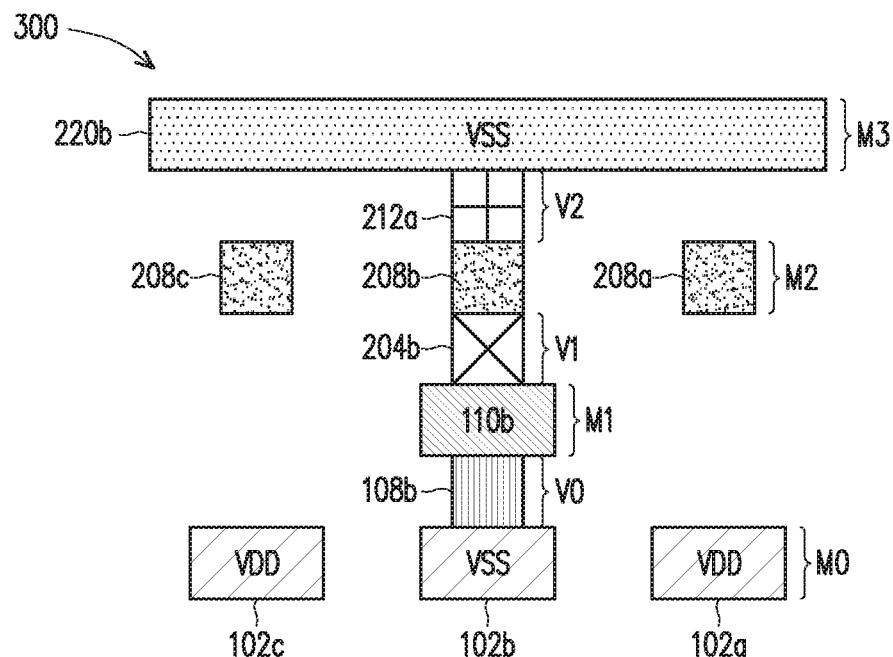

FIGS. 3A, 3B and 3C are diagrams of another IC structure 300, in accordance with some embodiments. FIG. 3A is a top view of IC structure 300, FIG. 3B is a cross-sectional view of IC structure 300 as intersected by plane C-C', and FIG. 3C is a cross-sectional view of IC structure 300 as intersected by plane D-D'.

IC structure 300 is a variation of IC structure 100' (FIG. 1B) or IC structure 200 (FIG. 2A). Components that are the same or similar to those in FIGS. 1A-1B or 2A-2C are given the same reference numbers, and detailed description thereof is thus omitted.

In comparison with IC structure 200 of FIG. 2A, IC structure 300 includes fewer vias of the first set of vias 125, fewer conductive structures of the first set of conductive structures 130 and fewer vias of the second set of vias 225. For example, IC structure 300 does not include vias 104b, 104d, 104f, vias 108a, 108c, 108e, vias 112b, 112d, 112f, conductive structures 106b, 106d, 106f, conductive structures 110a, 110c, 110e, conductive structures 114b, 114d, 114f, vias 202b, 202d, 202f, vias 204a, 204c, 204e, and vias 206b, 206d, 206f.

Each row of vias of the second set of vias 225 is offset from an adjacent row of vias by the offset distance $D_{off}$. Vias 202a, 202c and 202e alternate with vias 204b, 204d and 204f in the first direction X. Similarly, vias 204b, 204d and 204f alternate with vias 206a, 206c and 206e in the first direction X.

Vias 210a, 210c and 210e alternate with vias 212b, 212d and 212f in the first direction X. Similarly, vias 212b, 212d and 212f alternate with vias 214a, 214c and 214e in the first direction X.

By including fewer vias of the second set of vias 225 in IC structure 300, a pitch P2 between adjacent vias of the second set of vias 225 corresponds to a pitch P2 between adjacent vias of the third set of vias 235. For example, in these embodiments, the pitch P2 between via 202a and via 202c of rail 102a is the same as the pitch P2 between via 210a and via 210b.

In some embodiments, by not coupling one or more of conductive structures 106a, 106c, 106e, 110b, 110d, 110f, 114a, 114c or 114e to other conductive structures of conductive structures 106a, 106c, 106e, 110b, 110d, 110f, 114a, 114c or 114e on the same metal layer (e.g., M1), the space between two or more of conductive structures 106a, 106c, 106e, 110b, 110d, 110f, 114a, 114c or 114e can be utilized for additional M1 routing resources, and the additional M1 routing resources can provide additional via access points to other metal layers resulting in IC structure 200' having reduced size compared with other approaches. Other configurations of via layers or metal layers are within the scope of the present disclosure.

Figure 4A:
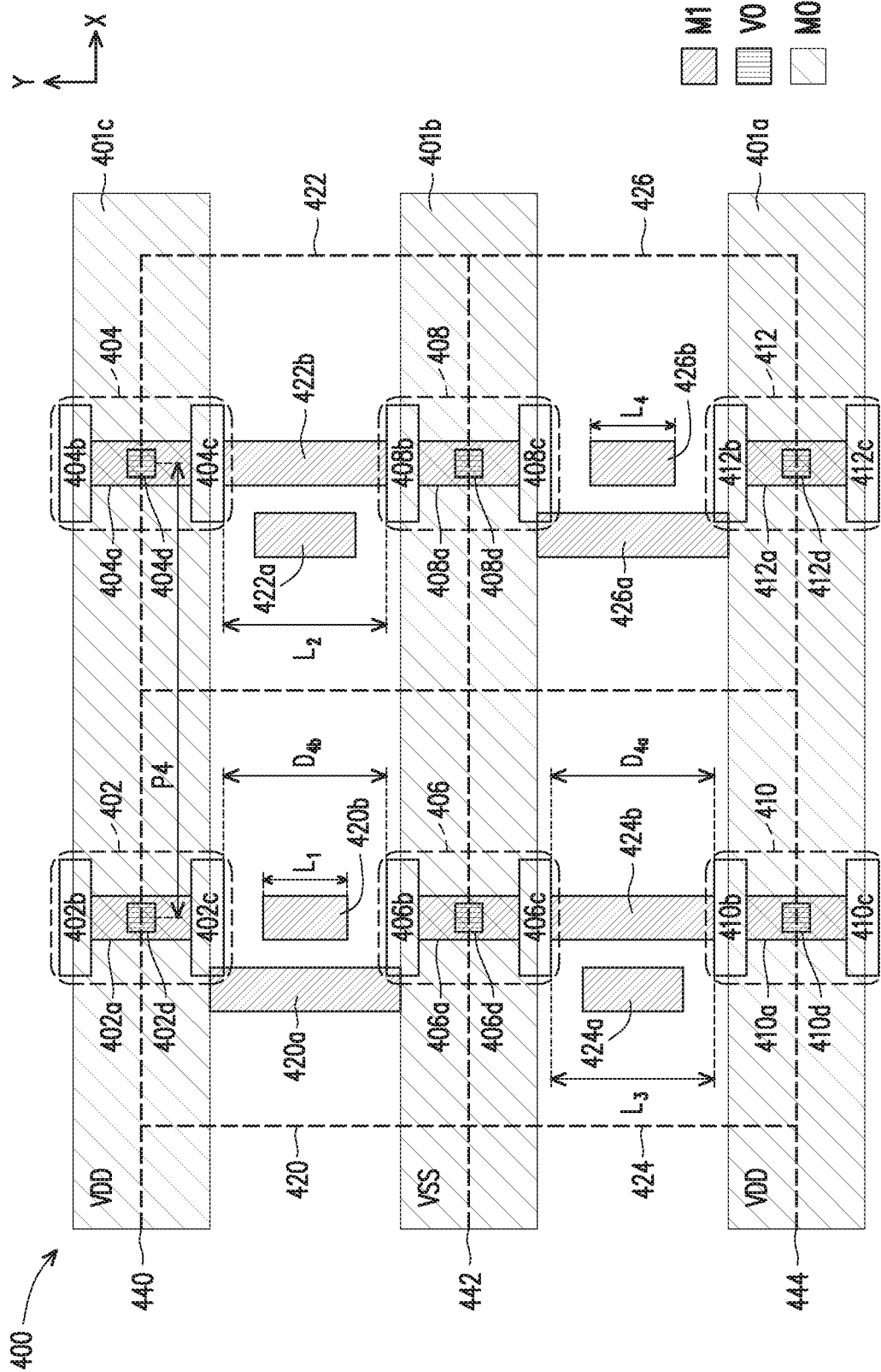
FIG. 4A is a diagram of a layout design, in accordance with some embodiments.

FIG. 4A is a diagram of a layout design 400, in accordance with some embodiments. Layout design 400 is usable to manufacture a portion of IC structure 200 (FIGS. 2A-2C). Components that are the same or similar to those in FIGS. 1A-1B or 2A-2C are given the same reference numbers, and detailed description thereof is thus omitted. In some embodiments, one or more of the layout patterns described herein (e.g., layout design 400, 400', 500, 500' or 600-1800) is usable to prepare a set of masks, that are in turn usable for manufacturing an IC structure (e.g., IC structure 100, 100', 200 or 300). The layout design 400 is a basis to be modified to form other layout designs, such as those described herein, e.g., FIGS. 4B, 5A-5B & 6-18. Layout design 400 depicts overlapping layout patterns from various layout layers. Some layout patterns and some layout layers of layout design 400 are simplified or omitted.

Layout design 400 includes a first conductive layout pattern 401a, a second conductive layout pattern 401b, a third conductive layout pattern 401c, power layout patterns 402, 404, 406, 408, 410 and 412, a first region 420, a second region 422, a third region 424 and a fourth region 426.

First, second and third conductive layout patterns 401a, 401b, 401c are usable by system 2000 (FIG. 20) to form corresponding first, second and third rails 102a, 102b, 102c (FIGS. 1A-1B, 2A-2C, 3A-3C). The arrangement of the first, second and third conductive layout patterns 401a, 401b, 401c is similar to the arrangement of the first, second and third rails 102a, 102b, 102c (FIGS. 1A-1B, 2A-2C, 3A-3C).

Power layout patterns 402, 404, 406, 408, 410, 412 are usable by system 2000 (FIG. 20) to form corresponding conductive structures 114a, 114b, 110a, 110b, 106a, 106b (FIGS. 1A-1B, 2A-2C, 3A-3C).

A center of power layout pattern 402 or 404 is symmetric or aligned with a center of third conductive layout pattern 401c. The center of third conductive layout pattern 401c is aligned with first line 440. Power layout patterns 402 and 404 are aligned with each other in the first direction X. In some embodiments, power layout patterns 402 and 404 are not aligned with each other in the first direction X. Power layout pattern 402 is offset from power layout pattern 404 in the first direction X by a pitch P4. Power layout patterns 402, 404 are over third conductive layout pattern 401c.

Power layout pattern 402 comprises a conductive feature layout pattern 402a, a cut feature layout pattern 402b, a cut feature layout pattern 402c and a via layout pattern 402d. Conductive feature layout pattern 402a is usable to manufacture conductive structure 114a, and via layout pattern 402d is usable to manufacture via 112a (FIGS. 1A-1B, 2A-2C). Via layout pattern 402d is symmetric with respect to first line 440 of third conductive layout pattern 401c. In some embodiments, the cut feature layout pattern 402b or 402c identifies a location of the conductive structure 114a (FIG. 1A-1B) that is removed during fabrication of IC structure 100, 100'. In some embodiments, the removed portion of the conductive structure 114a corresponds to a cut region (e.g., cut feature layout pattern 402b, 402c).

Power layout pattern 404 is similar to power layout pattern 402 with the reference numerals increased by 2. Conductive feature layout pattern 404a is usable to manufacture conductive structure 114b, and via layout pattern 404d is usable to manufacture via 112b (FIGS. 1A-1B, 2A-2C). Via layout pattern 404d is symmetric with respect to first line 440 of third conductive layout pattern 401c. In some embodiments, the cut feature layout pattern 404b or 404c identifies a location of the conductive structure 114b that is removed during fabrication of IC structure 100, 100'. In some embodiments, the removed portion of the conductive structure 114b corresponds to a cut region (e.g., cut feature layout pattern 404b, 404c).

Power layout patterns 406 and 408 are similar to corresponding power layout patterns 402 and 404 with the reference numerals increased by 4. A center of power layout pattern 406 or 408 is symmetric or aligned with a center of second conductive layout pattern 401b. Power layout patterns 406 and 408 are aligned with each other in the first direction X. In some embodiments, power layout patterns 406 and 408 are not aligned with each other in the first direction X. Power layout pattern 406 is offset from power layout pattern 408 in the first direction X by pitch P4. A second line 442 is aligned with a center of second conductive layout pattern 401b. Power layout patterns 406, 408 are over second conductive layout pattern 401b.

Conductive feature layout patterns 406a, 408a are usable to manufacture corresponding conductive structures 110a, 110b and via layout patterns 406d, 408d are usable to manufacture corresponding vias 108a, 108b (FIGS. 1A-1B, 2A-2C). Via layout patterns 406d, 408d are symmetric with respect to second line 442 of second conductive layout pattern 401b. In some embodiments, the cut feature layout pattern 406b or 406c identifies a location of the conductive structure 110a that is removed during fabrication of IC structure 100, 100'. In some embodiments, the removed portion of the conductive structure 110a corresponds to a cut region (e.g., cut feature layout pattern 406b, 406c). In some embodiments, the cut feature layout pattern 408b or 408c identifies a location of the conductive structure 110b that is removed during fabrication of IC structure 100, 100'. In some embodiments, the removed portion of the conductive structure 110b corresponds to a cut region (e.g., cut feature layout pattern 408b, 408c).

Power layout patterns 410 and 412 are similar to as corresponding power layout patterns 402 and 404 with the reference numerals increased by 8. A center of power layout pattern 410 or 412 is symmetric or aligned with a center of first conductive layout pattern 401a. Power layout patterns 410 and 412 are aligned with each other in the first direction X. In some embodiments, power layout patterns 410 and 412 are not aligned with each other in the first direction X. Power layout pattern 410 is offset from power layout pattern 412 in the first direction X by pitch P4. A third line 444 is aligned with a center of first conductive layout pattern 401a. Power layout patterns 410, 412 are over first conductive layout pattern 401a.

Conductive feature layout patterns 410a, 412a are usable to manufacture corresponding conductive structures 106a, 106b and via layout patterns 410d, 412d are usable to manufacture corresponding vias 104a, 104b (FIGS. 1A-1B, 2A-2C). Via layout patterns 410d, 412d are symmetric with respect to third line 444 of first conductive layout pattern 401a. In some embodiments, the cut feature layout pattern 410b or 410c identifies a location of the conductive structure 106a that is removed during fabrication of IC structure 100, 100'. In some embodiments, the removed portion of the conductive structure 106a corresponds to a cut region (e.g., cut feature layout pattern 410b, 410c). In some embodiments, the cut feature layout pattern 412b or 412c identifies a location of the conductive structure 106b that is removed during fabrication of IC structure 100, 100'. In some embodiments, the removed portion of the conductive structure 106b corresponds to a cut region (e.g., cut feature layout pattern 412b, 412c).

Power layout pattern 402 or 404 is separated from corresponding power layout pattern 406 or 408 in the second direction Y by distance $D_{4b}$. Power layout pattern 406 or 408 is separated from corresponding power layout pattern 410 or 412 in the second direction by distance $D_{4a}$.

First region 420 comprises a conductive feature layout pattern 420a and a conductive feature layout pattern 420b.

Conductive feature layout pattern 420a or conductive feature layout pattern 420b is coupled to other elements (not shown) of IC structure 100, 200. Conductive feature layout pattern 420a and conductive feature layout pattern 420b are between second conductive layout pattern 401b and third conductive layout pattern 401c. Conductive feature layout pattern 420b is between power layout pattern 402 and power layout pattern 406. In some embodiments, conductive feature layout pattern 420a is between power layout pattern 402 and power layout pattern 406. In some embodiments, conductive feature layout pattern 420b is aligned with conductive feature layout pattern 402a in the second direction Y. Conductive feature layout pattern 420b has a length $L_1$ in the second direction Y. Conductive feature layout pattern 420b does not overlap power layout pattern 402 or power layout pattern 406. Conductive feature layout pattern 420a has a first color (e.g., color A) and conductive feature layout pattern 420b has a second color (e.g., color B) different than the first color. In some embodiments, conductive feature layout pattern 420a and conductive feature layout pattern 420b have a same color (e.g., color A or B) as each other. The color (e.g., color A, color B) indicates that features with the same color are to be formed on a same mask of a multiple mask set, and features with a different color are to be formed on a different mask of the multiple mask set.

In some embodiments, by not coupling power layout pattern 402 to power layout pattern 406 on the same metal layer (e.g., M1), the space between power layout pattern 402 and power layout pattern 406 can be utilized to form additional routing resources, and the additional routing resources can provide additional via access points to other metal layers. For example, by positioning conductive feature layout patterns 420a or 420b between power layout pattern 402 and power layout pattern 406, conductive feature layout pattern 420a or 420b can be utilized to form corresponding conductive structures which provide additional M1 routing resources and via access points to other metal layers, resulting in a layout design 400 that occupies less area than other designs.

Second region 422 comprises a conductive feature layout pattern 422a and a conductive feature layout pattern 422b.

Conductive feature layout pattern 422a or conductive feature layout pattern 422b is coupled to other elements (not shown) of IC structure 100, 200. Conductive feature layout pattern 422a and conductive feature layout pattern 422b are between second conductive layout pattern 401b and third conductive layout pattern 401c. Conductive feature layout pattern 422b is between power layout pattern 404 and power layout pattern 408. In some embodiments, conductive feature layout pattern 422a is between power layout pattern 404 and power layout pattern 408. In some embodiments, conductive feature layout pattern 422b is aligned with conductive feature layout pattern 404a in the second direction Y. Conductive feature layout pattern 422b has a length $L_2$ in the second direction Y. Conductive feature layout pattern 422b does not overlap power layout pattern 404 or power layout pattern 408. Conductive feature layout pattern 422a has a first color (e.g., color A) and conductive feature layout pattern 422b has a second color (e.g., color B) different than the first color. In some embodiments, conductive feature layout pattern 422a and conductive feature layout pattern 422b have a same color (e.g., color A or B) as each other.

In some embodiments, by not coupling power layout pattern 404 to power layout pattern 408 on the same metal layer (e.g., M1), the space between power layout pattern 404 and power layout pattern 408 can be utilized to form additional routing resources, and the additional routing resources can provide additional via access points to other metal layers. For example, by positioning conductive feature layout patterns 422a or 422b between power layout pattern 404 and power layout pattern 408, conductive feature layout patterns 422a or 422b can be utilized to form corresponding conductive structures which provide additional M1 routing resources and via access points to other metal layers, resulting in a layout design 400 that occupies less area than other designs.

Third region 424 comprises a conductive feature layout pattern 424a and a conductive feature layout pattern 424b.

Conductive feature layout pattern 424a or conductive feature layout pattern 424b is coupled to other elements (not shown) of IC structure 100, 200. Conductive feature layout pattern 424a and conductive feature layout pattern 424b are between first conductive layout pattern 401a and second conductive layout pattern 401b. Conductive feature layout pattern 424b is between power layout pattern 406 and power layout pattern 410. In some embodiments, conductive feature layout pattern 424a is between power layout pattern 406 and power layout pattern 410. In some embodiments, conductive feature layout pattern 424b is aligned with conductive feature layout pattern 406a in the second direction Y. Conductive feature layout pattern 424b has a length $L_3$ in the second direction Y. In some embodiments, length $L_1$ is the same as length $L_3$. In some embodiments, length $L_1$ differs from length $L_3$. Conductive feature layout pattern 424b does not overlap power layout pattern 406 or power layout pattern 410. Conductive feature layout pattern 424a has a first color (e.g., color A) and conductive feature layout pattern 424b has a second color (e.g., color B) different than the first color. In some embodiments, conductive feature layout pattern 424a and conductive feature layout pattern 424b have a same color (e.g., color A or B) as each other.

In some embodiments, by not coupling power layout pattern 406 to power layout pattern 410 on the same metal layer (e.g., M1), the space between power layout pattern 406 and power layout pattern 410 can be utilized to form additional routing resources, and the additional routing resources can provide additional via access points to other metal layers. For example, by positioning conductive feature layout patterns 424a or 424b between power layout pattern 406 and power layout pattern 410, conductive feature layout patterns 424a, 424b can be utilized to form corresponding conductive structures which provide additional M1 routing resources and via access points to other metal layers, resulting in a layout design 400 that occupies less area than other designs.

By power layout pattern 406 being symmetric with respect to second conductive layout pattern 401b, power layout pattern 402 being symmetric with respect to third conductive layout pattern 401c, and power layout pattern 410 being symmetric with respect to first conductive layout pattern 401a, the length $L_1$ of conductive feature layout pattern 420b is less than or equal to distance $D_{4b}$, and the length $L_3$ of conductive feature layout pattern 424b is less than or equal to distance $D_{4a}$. In some embodiments, distance $D_{4a}$ or $D_{4b}$ is based on a height of the first region 420, second region 422, third region 424 or fourth region 426. In some embodiments, a minimum value of distance $D_{4a}$ or $D_{4b}$ is sufficient to provide conductive feature layout pattern 420b, 422b, 424b or 426b with at least two via access points to provide a connection to upper layers (not shown).

Fourth region 426 comprises a conductive feature layout pattern 426a and a conductive feature layout pattern 426b.

Conductive feature layout pattern 426a or conductive feature layout pattern 426b is coupled to other elements (not shown) of IC structure 100, 200. Conductive feature layout pattern 426a and conductive feature layout pattern 426b are between first conductive layout pattern 401a and second conductive layout pattern 401b. Conductive feature layout pattern 426b is between power layout pattern 408 and power layout pattern 412. In some embodiments, conductive feature layout pattern 426a is between power layout pattern 408 and power layout pattern 412. In some embodiments, conductive feature layout pattern 426b is aligned with conductive feature layout pattern 408a in the second direction Y. Conductive feature layout pattern 426b has a length $L_4$ in the second direction Y. In some embodiments, length $L_2$ is the same as length $L_4$. In some embodiments, length $L_2$ differs from length $L_4$.

Conductive feature layout pattern 426b does not overlap power layout pattern 408 or power layout pattern 412. Conductive feature layout pattern 426a has a first color (e.g., color A) and conductive feature layout pattern 426b has a second color (e.g., color B) different than the first color. In some embodiments, conductive feature layout pattern 426a and conductive feature layout pattern 426b have a same color (e.g., color A or B) as each other.

Each of conductive feature layout patterns 402a, 404a, 406a, 408a, 410a, 412a, 420a, 420b, 422a, 422b, 424a, 424b, 426a, and 426b is positioned at the M1 layer of layout design 400. The M1 layer of layout design 400 corresponds to the M1 layer of IC structure 100, 200. In some embodiments, each of the conductive feature layout patterns of layout design 400 that are located at the M1 layer extends in the same direction. Other configurations of via layers or metal layers are within the scope of the present disclosure.

By power layout pattern 408 being symmetric with respect to second conductive layout pattern 401b, power layout pattern 404 being symmetric with respect to third conductive layout pattern 401c, and power layout pattern 412 being symmetric with respect to first conductive layout pattern 401a, the length $L_2$ of conductive feature layout pattern 422b is less than or equal to distance $D_{4b}$, and the length $L_4$ of conductive feature layout pattern 426b is less than or equal to distance $D_{4a}$. In some embodiments, a minimum value of length $L_1$, $L_2$, $L_3$ or $L_4$ is sufficient to provide corresponding conductive feature layout pattern 420b, 422b, 424b or 426b with at least two via access points to provide a connection to upper layers (not shown).

In some embodiments, by not coupling power layout pattern 408 to power layout pattern 412 on the same metal layer (e.g., M1), the space between power layout pattern 408 and power layout pattern 412 can be utilized to form additional routing resources, and the additional routing resources can provide additional via access points to other metal layers. For example, by positioning conductive feature layout patterns 426a or 426b between power layout pattern 408 and power layout pattern 412, conductive feature layout pattern 426a or 426b can be utilized to form corresponding conductive structures which provide additional M1 routing resources and via access points to other metal layers, resulting in a layout design 400 that occupies less area than other designs.

In some embodiments, conductive feature layout patterns 420a, 420b, 422a, 422b, 424a, 424b, 426a or 426b are utilized to form corresponding conductive structures which provide additional M1 routing resources and via access points capable of being electrically coupled to other elements (not shown) than other designs. By providing additional via access points and additional M1 routing resources, layout design 400 occupies less area than other designs, and IC structure 100, 100', 200, 300 occupies less area than other IC structures.

In some embodiments, one or more of first region 420, second region 422, third region 424 or fourth region 426 is a standard cell. In some embodiments, a standard cell is a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, clock cells, or the like. In some embodiments, a standard cell is a memory cell. In some embodiments, a memory cell includes a static random access memory (SRAM), a dynamic RAM (DRAM), a resistive RAM (RRAM), a magnetoresistive RAM (MRAM) read only memory (ROM), or the like. In some embodiments, a standard cell includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, planar MOS transistors with raised source/drain, or the like. Examples of passive elements include, but are not limited to, capacitors, inductors, fuses, resistors, or the like. First region 420, second region 422, third region 424 or fourth region 426 includes other features not shown for ease of illustration.

Layout design 400 is referred to as a stub-symmetric architecture. For example, power layout patterns 402, 404, 406, 408, 410 and 412 are referred to as stubs; power layout patterns 402, 404 are symmetric with respect to third conductive layout pattern 401*c*, power layout patterns 406, 408 are symmetric with respect to second conductive layout pattern 401*b*, and power layout patterns 410, 412 are symmetric with respect to first conductive layout pattern 401*a*.

Figure 4B:
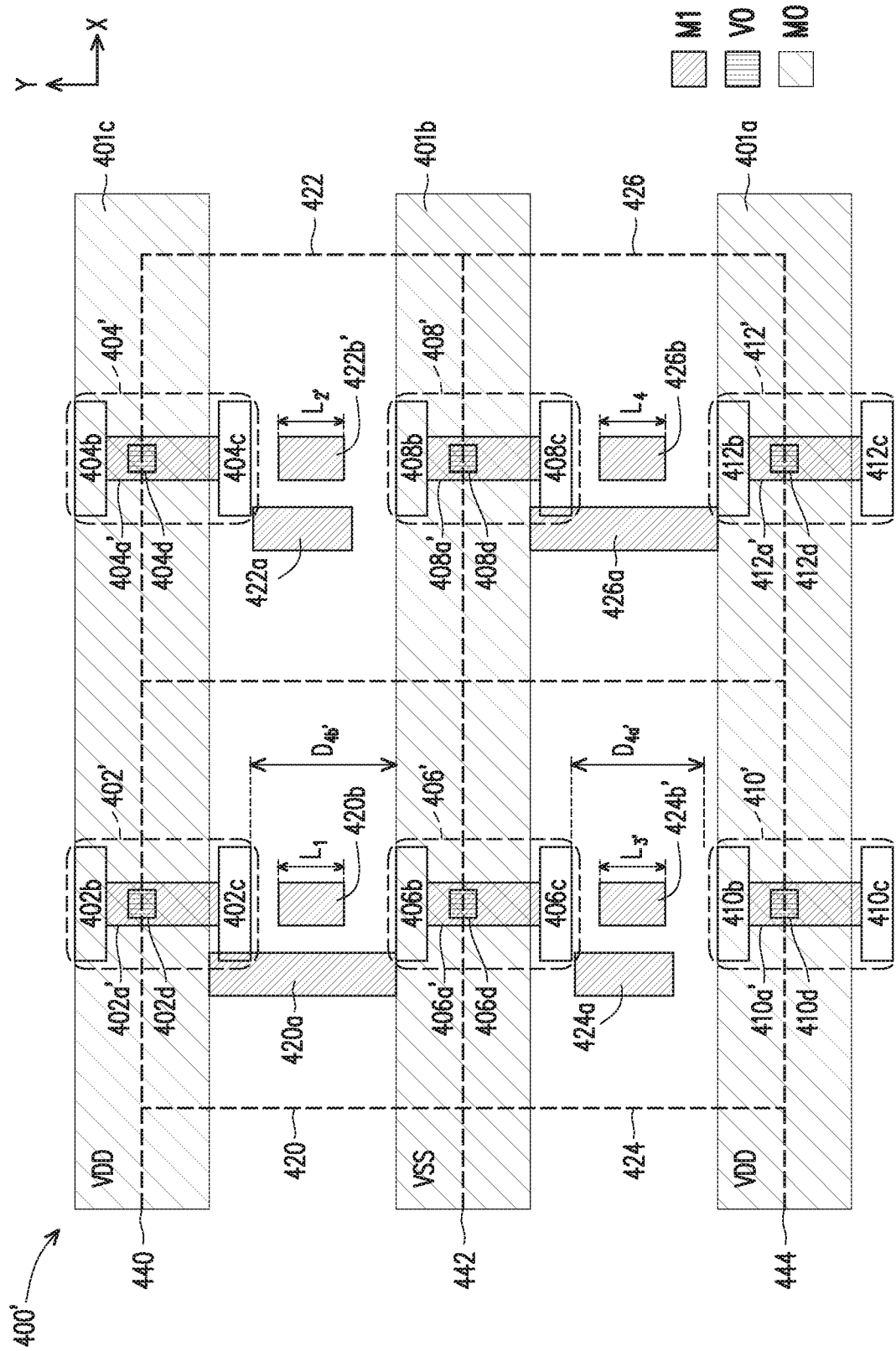
FIG. 4B is a diagram of a layout design, in accordance with some embodiments.

FIG. 4B is a diagram of a layout design 400', in accordance with some embodiments. Layout design 400' is a variation of layout design 400 (FIG. 4A). Components that are the same or similar to those in FIGS. 1A-1B, 2A-2C or 4A are given the same reference numbers, and detailed description thereof is thus omitted. Layout design 400' is usable to manufacture a portion of an IC structure similar to IC structure 200 (FIGS. 2A-2C).

In comparison with layout design 400 of FIG. 4A, layout design 400' includes power layout patterns 402', 404', 406', 408', 410' and 412' instead of corresponding power layout patterns 402, 404, 406, 408, 410 and 412, conductive feature layout pattern 422*b'* instead of conductive feature layout pattern 422*b* (FIG. 4A), and conductive feature layout pattern 424*b'* instead of conductive feature layout pattern 424*b*.

Power layout patterns 402', 404' are asymmetric with respect to third conductive layout pattern 401*c*, power layout patterns 406', 408' are asymmetric with respect to second conductive layout pattern 401*b*, and power layout patterns 410', 412' are asymmetric with respect to first conductive layout pattern 401*a*. In other words, a center of power layout pattern 402' or 404' is not aligned with a center of third conductive layout pattern 401*c*. Similarly, a center of power layout pattern 406' or 408' is not aligned with a center of second conductive layout pattern 401*b*. Similarly, a center of power layout pattern 410' or 412' is not aligned with a center of first conductive layout pattern 401*a*.

Power layout pattern 402' or 404' is separated from corresponding power layout pattern 406' or 408' in the second direction by distance $D_{4b''}$. Distance $D_{4b'}$ is less than distance $D_{4b}$ (FIG. 4A).

Power layout pattern 406' or 408' is separated from corresponding power layout pattern 410' or 412' in the second direction by distance $D_{4a''}$. Distance $D_{4a'}$ is less than distance $D_{4a}$ (FIG. 4A). In some embodiments, distance $D_{4a'}$ or $D_{4b'}$ is based on a height of the first region 420, second region 422, third region 424 or fourth region 426. In some embodiments, a minimum value of distance $D_{4a'}$ or $D_{4b'}$ is sufficient to provide conductive feature layout pattern 420*b*, 422*b'*, 424*b'* or 426*b* with at least two via access points to provide a connection to upper layers (not shown).

Conductive feature layout pattern 422*b'* has a length $L_{2'}$, and conductive feature layout pattern 424*b'* has a length $L_{3''}$.

By the asymmetric orientations of power layout patterns 402', 404', 406', 408', 410' and 412', the length $L_1$ of conductive feature layout pattern 420*b* is less than distance $D_{4b''}$, the length $L_{2'}$ of conductive feature layout pattern 422*b'* is less than distance $D_{4b''}$, the length $L_{3'}$ of conductive feature layout pattern 424*b'* is less than distance $D_{4a''}$, and the length $L_4$ of conductive feature layout pattern 426*b* is less than distance $D_{4a'}$ and one of distance $D_{4a'}$ or $D_{4b'}$ is less than one of distance $D_{4a}$ or $D_{4b}$. In some embodiments, a minimum value of length $L_{2'}$ or $L_{3'}$ is sufficient to provide corresponding conductive feature layout patterns 422*b'* or 424*b'* with at least two via access points to provide a connection to upper layers (not shown).

Layout design 400' is referred to as a stub-asymmetric architecture. For example, power layout patterns 402', 404', 406', 408', 410' and 412' are referred to as stubs; power layout patterns 402', 404', 406', 408', 410', 412' have asymmetric orientations with respect to first, second and third conductive layout patterns 401*a*, 401*b*, 401*c*.

Power layout patterns 402', 404', 406', 408', 410', 412' include corresponding conductive feature layout patterns 402*a'*, 404*a'*, 406*a'*, 408*a'*, 410*a'*, 412*a'* instead of corresponding conductive feature layout pattern 402*a*, 404*a*, 406*a*, 408*a*, 410*a*, 412*a* (FIG. 4A).

One or more of conductive feature layout pattern 402*a'* or 404*a'* or cut feature layout pattern 402*b*, 402*c*, 404*b* or 404*c* is shifted in the second direction Y relative to first line 440.

One or more of conductive feature layout pattern 406*a'* or 408*a'* or cut feature layout pattern 406*b*, 406*c*, 408*b* or 408*c* is shifted in the second direction Y relative to second line 442.

One or more of conductive feature layout pattern 410*a'* or 412*a'* or cut feature layout pattern 410*b*, 410*c*, 412*b* or 412*c* is shifted in the second direction Y relative to third line 444.

In some embodiments, a length of conductive feature layout pattern 402*a'*, 404*a'*, 406*a'*, 408*a'*, 410*a'* or 412*a'* is greater than a length of conductive feature layout pattern 402*a*, 404*a*, 406*a*, 408*a*, 410*a* or 412*a*.

In some embodiments, conductive feature layout patterns 420*a*, 420*b*, 422*a*, 422*b'*, 424*a*, 424*b'*, 426*a* or 426*b* are utilized to form corresponding conductive structures which provide additional M1 routing resources and via access points capable of being electrically coupled to other elements (not shown) than other designs. By providing additional via access points and additional M1 routing resources, layout design 400' occupies less area than other designs, and IC structure 100, 100', 200, 300 occupies less area than other IC structures.

Figure 5A:
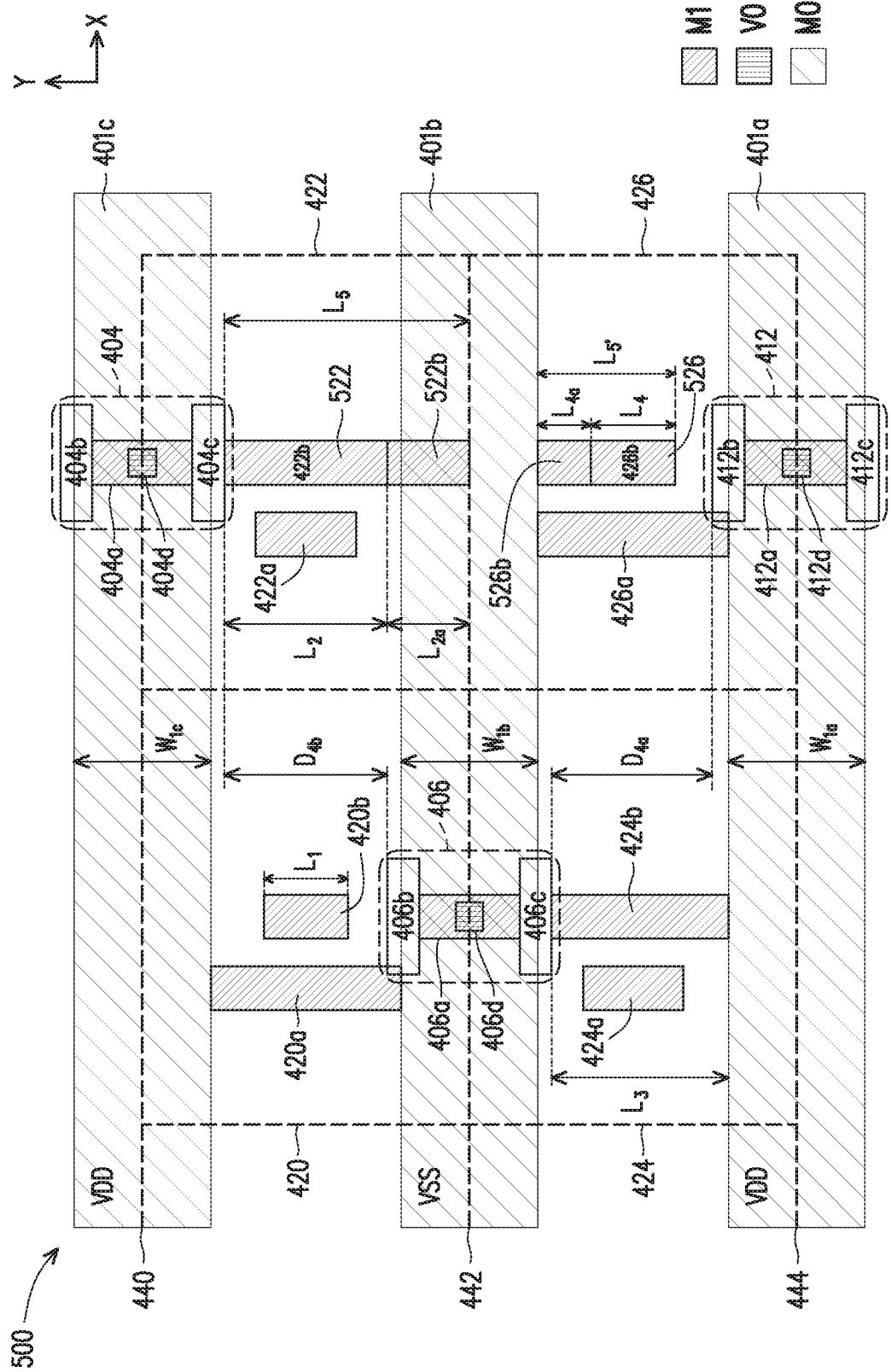
FIG. 5A is a diagram of a layout design, in accordance with some embodiments.

FIG. 5A is a diagram of a layout design 500, in accordance with some embodiments. Layout design 500 is usable to manufacture a portion of IC structure 300 (FIGS. 3A-3C). Components that are the same or similar to those in FIGS. 1A-1B, 2A-2C, 3A-3C or 4A-4B are given the same reference numbers, and detailed description thereof is thus omitted.

Layout design 500 includes portions of layout design 400, a conductive feature layout pattern 522 and a conductive feature layout pattern 526. In comparison with layout design 400 of FIG. 4A, layout design 500 does not include power layout patterns 402, 408 and 410. By removing power layout patterns 402, 408 and 410, layout design 500 provides additional M1 routing resources than other designs.

In some embodiments, by removing power layout patterns 402 or 410, the length $L_1$ of conductive feature layout pattern 420*b* or the length $L_3$ of conductive feature layout pattern 424b is increased to another length provided conductive feature layout pattern 420b and conductive feature layout pattern 424b do not overlap each other.

In some embodiments, by removing power layout pattern 408, at least the length $L_2$ of conductive feature layout pattern 422b or the length $L_4$ of conductive feature layout pattern 426b is increased to another length provided conductive feature layout pattern 422b and conductive feature layout pattern 426b do not overlap each other.

Power layout pattern 406 is separated from power layout pattern 404 in the second direction by distance $D_{4b}$. Power layout pattern 406 is separated from power layout pattern 412 in the second direction by distance $D_{4a}$.

In some embodiments, the length $L_1$ of conductive feature layout pattern 420b of layout design 500 is greater than distance $D_{4b}$ provided conductive feature layout pattern 420b does not overlap other layout features positioned at the M1 layer of layout design 500. The M1 layer of layout design 500 corresponds to the M1 layer of IC structure 100, 100', 200, 300. In some embodiments, the length $L_2$ of conductive feature layout pattern 422b of layout design 500 is greater than distance $D_{4b}$ provided conductive feature layout pattern 422b does not overlap other layout features positioned at the M1 layer of layout design 500. Other configurations of via layers or metal layers are within the scope of the present disclosure.

In some embodiments, the length $L_3$ of conductive feature layout pattern 424b of layout design 500 is greater than distance $D_{4a}$ provided conductive feature layout pattern 424b does not overlap other layout features positioned at the M1 layer of layout design 500. In some embodiments, the length $L_4$ of conductive feature layout pattern 426b of layout design 500 is greater than distance $D_{4a}$ provided conductive feature layout pattern 426b does not overlap other layout features positioned at the M1 layer of layout design 500. Other configurations of via layers or metal layers are within the scope of the present disclosure.

Conductive feature layout pattern 522 has a length $L_5$. Conductive feature layout pattern 522 includes conductive feature layout pattern 422b (FIG. 4A) and conductive feature layout pattern 522b. Conductive feature layout pattern 522b corresponds to an extended portion of conductive feature layout pattern 422b in the second direction Y. Conductive feature layout pattern 522b has a length $L_{2a}$ in the second direction Y. By increasing the length of conductive feature layout pattern 422b to length $L_5$, conductive feature layout pattern 522 has additional routing resources than other approaches.

Conductive feature layout pattern 526 has a length $L_{5'}$. Conductive feature layout pattern 526 includes conductive feature layout pattern 426b (FIG. 4A) and conductive feature layout pattern 526b. Conductive feature layout pattern 526b corresponds to an extended portion of conductive feature layout pattern 426b in the second direction Y. Conductive feature layout pattern 526b has a length $L_{4a}$ in the second direction Y. By increasing the length of conductive feature layout pattern 426b to length $L_{5'}$, conductive feature layout pattern 522 has additional routing resources than other approaches. In some embodiments, a minimum value of length $L_5$ or $L_{5'}$ is sufficient to provide corresponding conductive feature layout patterns 522 or 526 with at least two via access points to provide a connection to upper layers (not shown).

Conductive feature layout pattern 522 and 526 do not overlap each other. Conductive feature layout pattern 522 and conductive feature layout pattern 526 are positioned at the M1 layer of layout design 500. Other configurations of via layers or metal layers are within the scope of the present disclosure.

Layout design 500 is referred to as an alternating stub-symmetric architecture. For example, power layout patterns 404, 406 and 412 are arranged as alternating stubs in the first direction X; power layout patterns 404, 406 and 412 have symmetric orientations with respect to first, second and third conductive layout patterns 401a, 401b, 401c.

In some embodiments, conductive feature layout patterns 420a, 420b, 422a, 522, 424a, 424b, 426a or 526 are utilized to form corresponding conductive structures which provide additional M1 routing resources and via access points capable of being electrically coupled to other elements (not shown) than other designs. By providing additional via access points and additional M1 routing resources, layout design 500 occupies less area than other designs, and IC structure 100, 100', 200, 300 occupies less area than other IC structures.

Figure 5B:
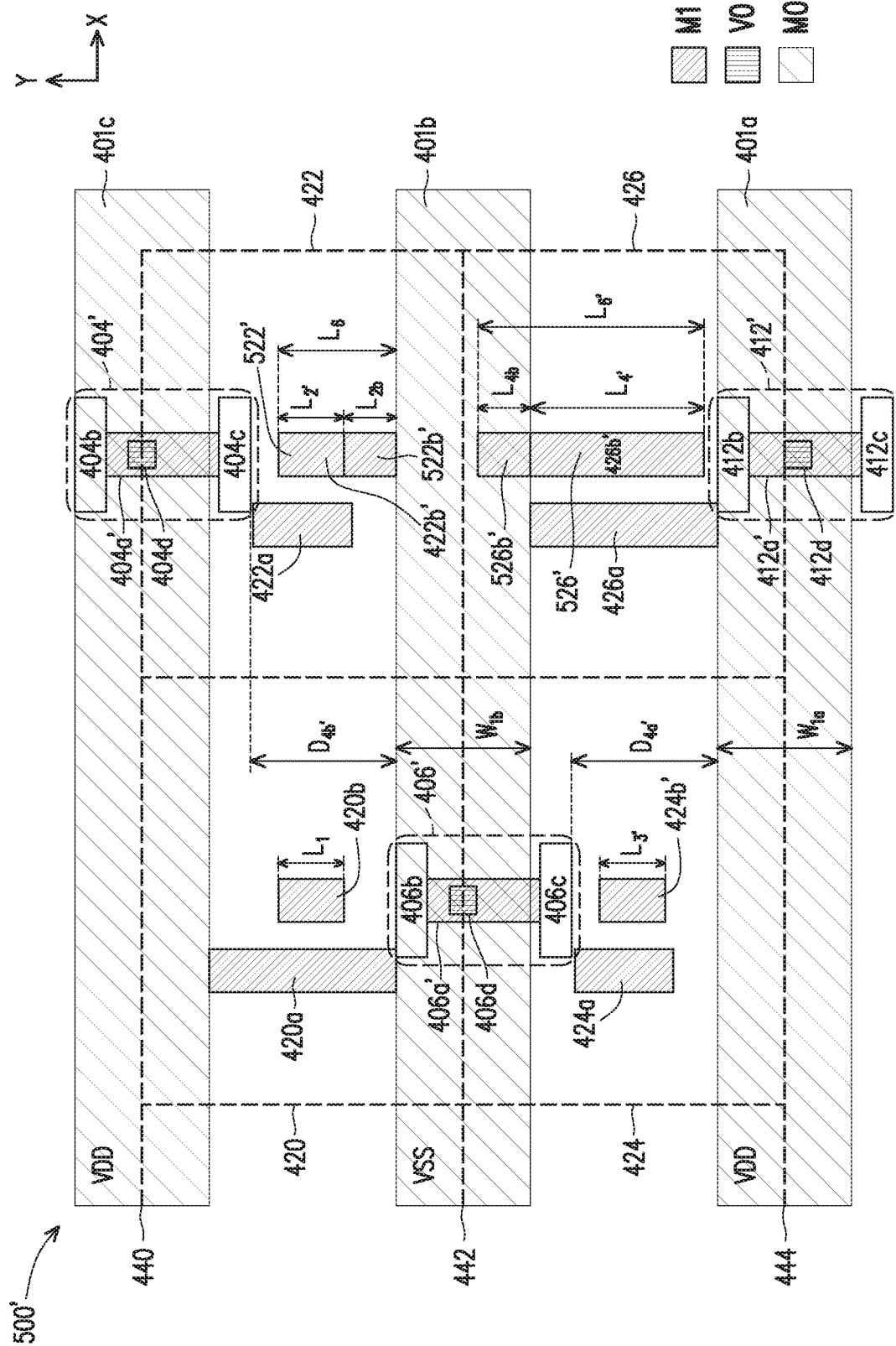
FIG. 5B is a diagram of a layout design, in accordance with some embodiments.

FIG. 5B is a diagram of a layout design 500', in accordance with some embodiments. Layout design 500' is a variation of layout design 400 (FIG. 4A) or layout design 500 (FIG. 5A). Components that are the same or similar to those in FIGS. 1A-1B, 2A-2C, 3A-3C, 4A-4B or 5A are given the same reference numbers, and detailed description thereof is thus omitted. Layout design 500' is usable to manufacture a portion of an IC structure similar to IC structure 300 (FIGS. 3A-3C).

Layout design 500' includes portions of layout design 400', a conductive feature layout pattern 522' and a conductive feature layout pattern 526'. In comparison with layout design 400' of FIG. 4B, layout design 500' does not include power layout patterns 402', 408' and 410', and conductive feature layout pattern 426b' replaces conductive feature layout pattern 426b. By removing power layout patterns 402', 408' and 410', layout design 500' provides additional M1 routing resources than other designs.

In some embodiments, by removing power layout patterns 402' and 410', the length $L_1$ of conductive feature layout pattern 420b or the length $L_{3'}$ of conductive feature layout pattern 424b' is increased to another length provided conductive feature layout pattern 420b and conductive feature layout pattern 424b' do not overlap each other.

In some embodiments, by removing power layout patterns 408', the length $L_{2'}$ of conductive feature layout pattern 422b' or the length $L_{4'}$ of conductive feature layout pattern 426b' is increased to another length (e.g., $L_6$ or $L_{6'}$) provided conductive feature layout pattern 422b' and conductive feature layout pattern 426b' do not overlap each other.

Power layout pattern 406' is separated from power layout pattern 404' in the second direction by distance $D_{4b''}$. Power layout pattern 406' is separated from power layout pattern 412' in the second direction by distance $D_{4a''}$.

In some embodiments, if the length $L_1$ of conductive feature layout pattern 420b of layout design 500' is greater than distance $D_{4b''}$, then the length $L_{3'}$ of conductive feature layout pattern 424b' of layout design 500' is less than distance $D_{4a'}$ and length $L_1$.

In some embodiments, if the length $L_{3'}$ of conductive feature layout pattern 424b' of layout design 500' is greater than distance $D_{4a''}$, then length $L_1$ of conductive feature layout pattern 420b of layout design 500' is less than distance $D_{4b'}$ and length $L_{3'}$.

Conductive feature layout pattern 522' has a length $L_6$ in the second direction Y. Conductive feature layout pattern 522' includes conductive feature layout pattern 422b' (FIG. 4B) and a conductive feature layout pattern 522b'. Conductive feature layout pattern 522b' corresponds to an extended portion of conductive feature layout pattern 422b' in the second direction Y. Conductive feature layout pattern 522b' has a length $L_2b$ in the second direction Y. By increasing the length $L_{2'}$ of conductive feature layout pattern 422b' to length $L_6$, conductive feature layout pattern 522' has additional routing resources than other approaches.

Conductive feature layout pattern 526' has a length $L_{6'}$ in the second direction Y. Conductive feature layout pattern 526' includes conductive feature layout pattern 426b' (FIG. 4B) and a conductive feature layout pattern 526b'. Conductive feature layout pattern 526b' corresponds to an extended portion of conductive feature layout pattern 426b' in the second direction Y. Conductive feature layout pattern 526b' has a length $L_{4b}$ in the second direction Y. By increasing the length $L_{4'}$ of conductive feature layout pattern 426b' to length $L_{6'}$, conductive feature layout pattern 526' has additional routing resources than other approaches.

In some embodiments, if the length $L_6$ of conductive feature layout pattern 522' of layout design 500' is greater than distance $D_{4b''}$ then the length $L_{6'}$ of conductive feature layout pattern 526' of layout design 500' is less than distance $D_{4a'}$ and length $L_6$.

In some embodiments, if the length $L_{6'}$ of conductive feature layout pattern 526' of layout design 500' is greater than distance $D_{4a''}$ then length $L_6$ of conductive feature layout pattern 522' of layout design 500' is less than distance $D_{4b'}$ and length $L_{6'}$. In some embodiments, a minimum value of length $L_6$ or $L_{6'}$ is sufficient to provide corresponding conductive feature layout patterns 522' or 526' with at least two via access points to provide a connection to upper layers (not shown).

Conductive feature layout pattern 522' and conductive feature layout pattern 526' do not overlap each other. Conductive feature layout pattern 522' and conductive feature layout pattern 526' are positioned at the M1 layer of layout design 500', and do not overlap other layout features positioned at the M1 layer of layout design 500'. Other configurations of via layers or metal layers are within the scope of the present disclosure.

Layout design 500' is referred to as an alternating stub-asymmetric architecture. For example, power layout patterns 404', 406' and 412' are arranged as alternating stubs in the first direction X; power layout patterns 404', 406' and 412' have asymmetric orientations with respect to first, second and third conductive layout patterns 401a, 401b, 401c.

In some embodiments, conductive feature layout patterns 420a, 420b, 422a, 522, 424a, 424b', 426a or 526' are utilized to form corresponding conductive structures which provide additional M1 routing resources and via access points capable of being electrically coupled to other elements (not shown) than other designs. By providing additional via access points and additional M1 routing resources, layout design 500' occupies less area than other designs, and IC structure 100, 100', 200, 300 occupies less area than other IC structures.

Figure 6:
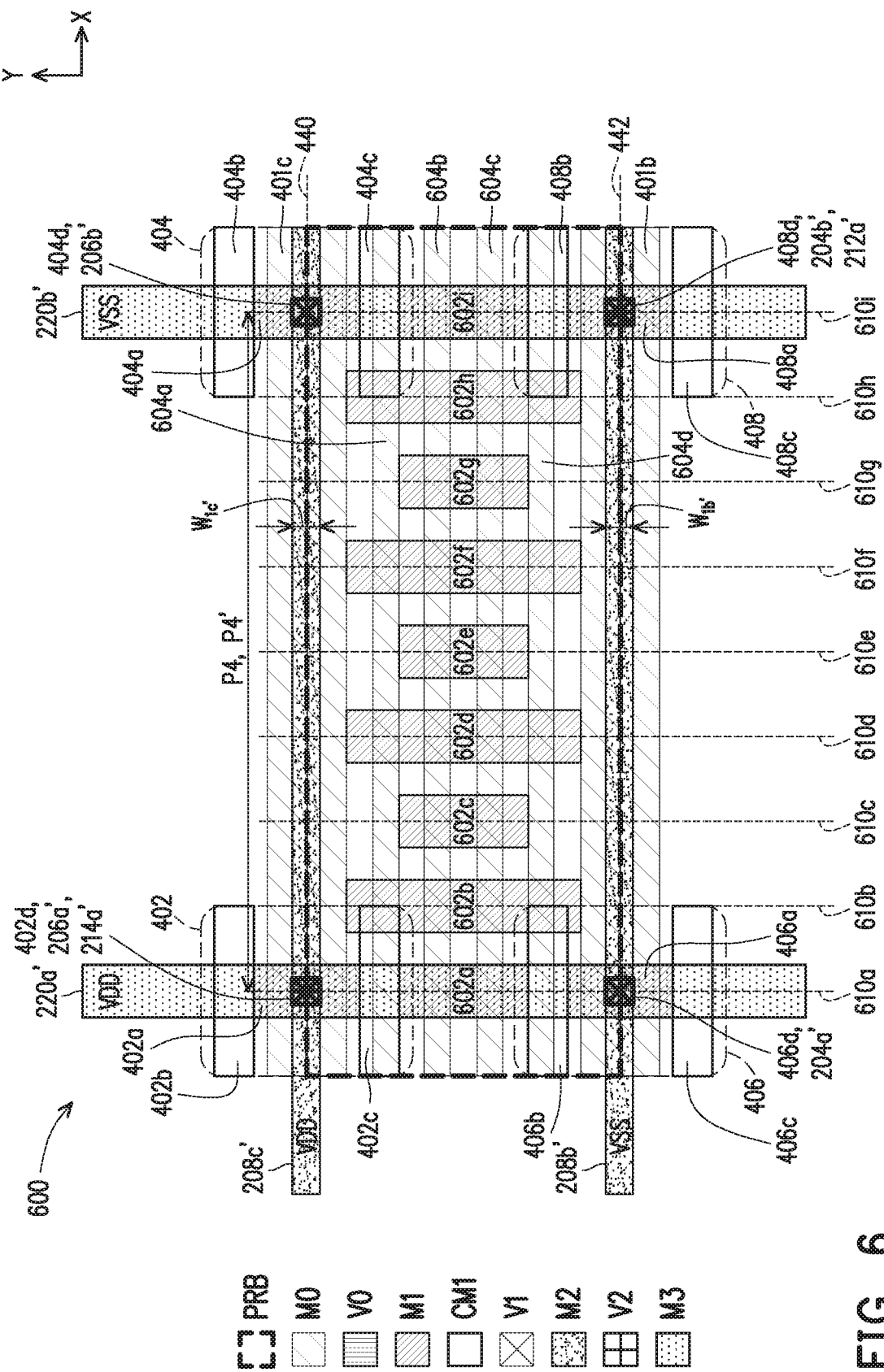
FIG. 6 is a diagram of a layout design, in accordance with some embodiments.

FIG. 6 is a diagram of a layout design 600, in accordance with some embodiments. Layout design 600 is a variation of layout design 400. Components that are the same or similar to those in FIGS. 1A-1B, 2A-2C, 3A-3C, 4A-4B, 5A-5B and 6-18 (shown below) are given the same reference numbers, and detailed description thereof is thus omitted. Layout design 600 is usable to manufacture a portion of an IC structure similar to IC structure 200 (FIGS. 2A-2C).

Layout design 600 includes features of first region 420 and second region 422 of layout design 400 of FIG. 4A. For example, from layout design 400 of FIG. 4A, layout design 600 includes second conductive layout pattern 401b, third conductive layout pattern 401c, power layout patterns 402, 404, 406, 408, first region 420 and second region 422.

In comparison with layout design 400 of FIG. 4A, layout design 600 further includes conductive feature layout pattern 208b', conductive feature layout pattern 208c', via layout patterns 204a', 204b', 206a', 206b', 212a', 214a', conductive feature layout patterns 220a', 220b', conductive feature layout patterns 602a, 602b, ..., 602i, and conductive feature layout patterns 604a, 604b, ..., 604d.

Conductive feature layout pattern 208b' and conductive feature layout pattern 208c' are usable to manufacture second conductive structure 208b and third conductive structure 208c, respectively.

Via layout patterns 204a', 204b', 206a', 206b', 212a', 214a' are usable to manufacture vias 204a, 204b, 206a, 206b, 212a, 214a, respectively.

Conductive feature layout patterns 220a', 220b' are usable to manufacture conductive structures 220a, 220b, respectively.

Conductive feature layout pattern 602a is a variation of conductive feature layout pattern 420b, and conductive feature layout pattern 602i is a variation of conductive feature layout pattern 422b. Conductive feature layout pattern, 602b, ..., 602h are variations of conductive feature layout patterns 420a or 420b.

Each of conductive feature layout patterns 602a, 602b, ..., 602i extend in the second direction Y, and are separated from each other in the first direction X. Each of conductive feature layout patterns 602a, 602b, ..., 602i are aligned with a corresponding gridline 610a, 610b, ..., 610i. A distance between all adjacent conductive feature layout patterns 602a, 602b, ..., 602i is uniform. In some embodiments, a distance between a pair of adjacent conductive feature layout patterns 602a, 602b, ..., 602i differs from a distance between another pair of adjacent conductive feature layout patterns 602a, 602b, ..., 602i. Conductive feature layout patterns 602a, 602b, ..., 602i are positioned at the M1 layer of layout design 600. Other configurations of via layout patterns and corresponding via layers or conductive feature layout patterns and corresponding metal layers are within the scope of the present disclosure. Conductive feature layout patterns 602a, 602b, ..., 602i provide access to other underlying or overlying layers in IC structure 100, 200. In some embodiments, conductive feature layout patterns 602a, 602b, ..., 602i are coupled to via layout patterns (not shown) that couple conductive feature layout patterns 602a, 602b, ..., 602i to other portions of layout design 600.

Conductive feature layout pattern 604a, 604b, ..., 604d extend in the first direction X, and are separated from each other in the second direction Y. A distance between all adjacent conductive feature layout patterns 604a, 604b, ..., 604d is uniform. In some embodiments, a distance between a pair of adjacent conductive feature layout patterns 604a, 604b, ..., 604d differs from a distance between another pair of adjacent conductive feature layout patterns 604a, 604b, ..., 604d. Conductive feature layout patterns 604a, 604b, ..., 604d are positioned at the M0 layer of layout design 600. Other configurations of via layout patterns and corresponding via layers or conductive feature layout patterns and corresponding metal layers are within the scope of the present disclosure.

Conductive feature layout patterns 602a, 602b, ..., 602i or conductive feature layout patterns 604a, 604b, ..., 604i are coupled to other elements (not shown). In some embodiments, a length of a conductive feature layout pattern of conductive feature layout patterns 602a or 602i of FIG. 6 is less than a length of one or more conductive feature layout patterns of conductive feature layout patterns 602b, ..., or 602h.

An M1 stub pitch P4 is the center to center pitch between adjacent power layout patterns of a same row in the first direction X. For example, pitch P4 is the center to center pitch between power layout patterns 402, 406 and corresponding power layout patterns 404, 408.

An M3 strap pitch P4' is the center to center pitch between adjacent M3 straps. For example, pitch P4' is the center to center pitch between conductive feature layout pattern 220a' and conductive feature layout pattern 220b'. In some embodiments, the M1 stub pitch P4 or the M3 strap pitch P4' is measured from gridline 610a to gridline 610i. In some embodiments, the M1 stub pitch P4 is equal to the M3 strap pitch P4'.

In some embodiments, conductive feature layout patterns 602a, 602b, ..., 602i are utilized to form corresponding conductive structures which provide additional M1 routing resources and via access points capable of being electrically coupled to other elements (not shown) than other designs. By providing additional via access points and additional M1 routing resources, layout design 600 occupies less area than other designs, and IC structure 100, 100', 200, 300 occupies less area than other IC structures.

Figure 7:
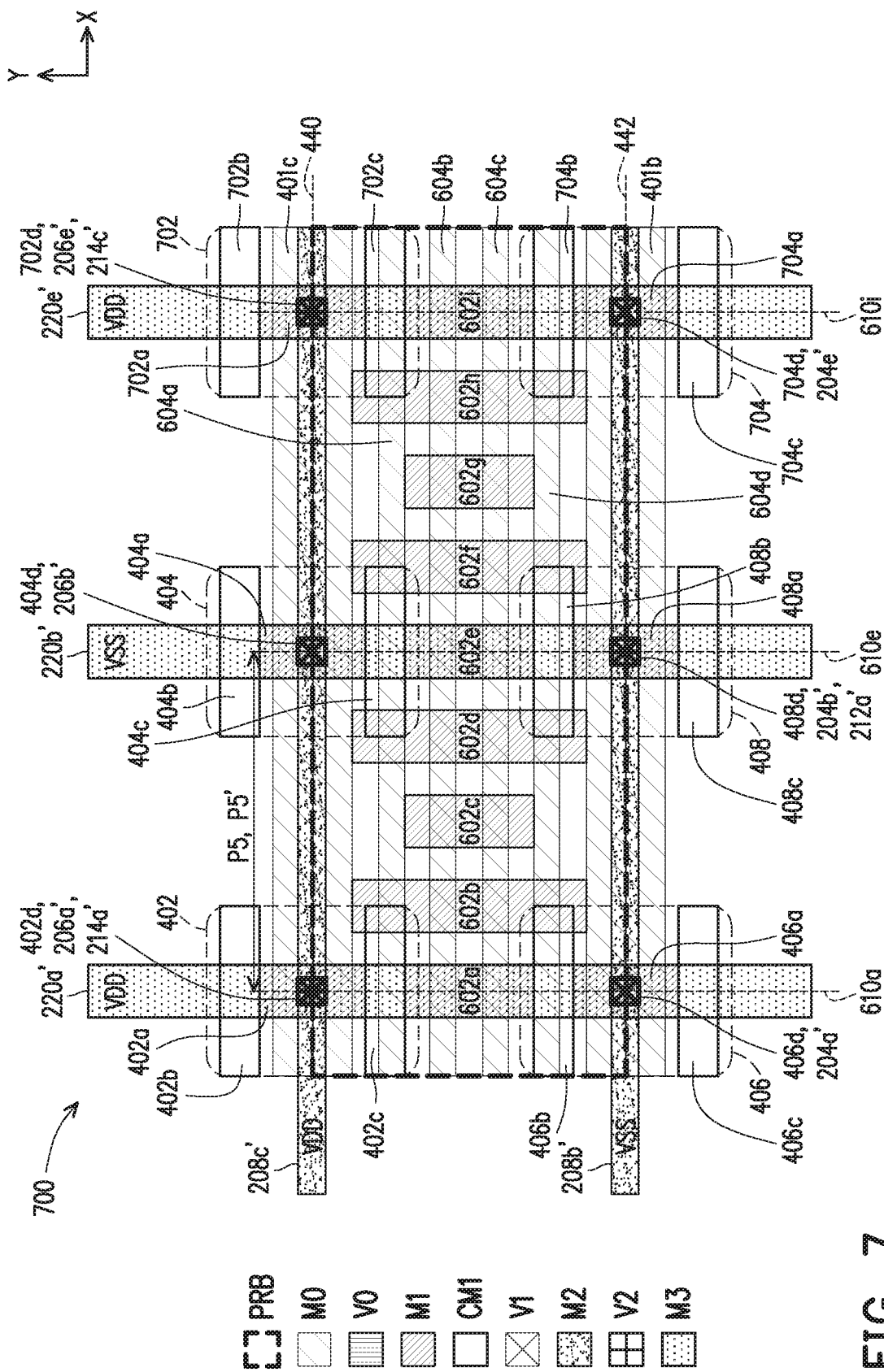
FIG. 7 is a diagram of a layout design, in accordance with some embodiments.

FIG. 7 is a diagram of a layout design 700, in accordance with some embodiments. Layout design 700 is another variation of layout design 400 or 400'. Layout design 700 is usable to manufacture an IC structure similar to IC structure 200 (FIGS. 2A-2C).

In comparison with layout design 600 of FIG. 6, power layout patterns 404, 408 and conductive feature layout pattern 220b' of layout design 700 are shifted from being positioned over gridline 610i to being positioned over gridline 610e, and layout design 700 further includes power layout patterns 702, 704, conductive feature layout pattern 220e' and via layout patterns 204e', 206e', 214c'.

By including additional power layout patterns (e.g., power layout patterns 702, 704), a pitch P5 between adjacent power layout patterns of the same row is reduced and results in additional M1 routing resources or additional via access points than other designs.

Power layout patterns 702, 704, conductive feature layout pattern 220e' and via layout patterns 204e', 206e', 214c' are positioned over gridline 610i.

Via layout patterns 204e', 206e', 214c' are usable to manufacture vias 204e, 206e, 214c, respectively.

Power layout pattern 702 is usable to manufacture conductive structure 114e and via 112e (FIGS. 1A-1B, 2A-2C). Power layout pattern 704 is usable to manufacture conductive structure 110e and via 108e (FIGS. 1A-1B, 2A-2C).

Power layout pattern 702 is similar to power layout pattern 402 with the reference numerals increased by 300. Conductive feature layout pattern 702a is usable to manufacture conductive structure 114e (FIGS. 1A-1B, 2A-2C). Cut feature layout patterns 702b, 702c is similar to cut feature layout patterns 402b, 402c, respectively. In some embodiments, the cut feature layout pattern 702b or 702c identifies a location of the conductive structure 114e that is removed during fabrication of IC structure 100, 100'. Via layout pattern 702d is usable to manufacture via 112e (FIGS. 1A-1B, 2A-2C).

Power layout pattern 704 is similar to power layout pattern 404 with the reference numerals increased by 300. Conductive feature layout pattern 704a is usable to manufacture conductive structure 110e (FIGS. 1A-1B, 2A-2C). Cut feature layout patterns 704b, 704c is similar to cut feature layout patterns 406b, 406c, respectively. In some embodiments, the cut feature layout pattern 704b or 704c identifies a location of the conductive structure 110e that is removed during fabrication of IC structure 100, 100'. Via layout pattern 704d is usable to manufacture via 108e (FIGS. 1A-1B, 2A-2C).

Conductive feature layout pattern 220e' is usable to manufacture conductive structure 220e.

In some embodiments, a length of a conductive feature layout pattern of conductive feature layout patterns 602a, 602e or 602i of FIG. 7 is less than one or more conductive feature layout patterns of conductive feature layout patterns 602b, 602c, 602d, 602f, 602g or 602h.

An M1 stub pitch P5 is the center to center pitch between adjacent power layout patterns of a same row in the first direction X. For example, pitch P5 is the center to center pitch between power layout patterns 402, 406 and corresponding power layout patterns 404, 408. Similarly, P5 is the center to center pitch between power layout patterns 404, 408 and corresponding power layout patterns 702, 704. Other configurations of via layout patterns and corresponding via layers or conductive feature layout patterns and corresponding metal layers are within the scope of the present disclosure.

An M3 strap pitch P5' is the center to center pitch between adjacent M3 straps. For example, pitch P5' is the center to center pitch between either (1) conductive feature layout pattern 220a' and conductive feature layout pattern 220b', or (2) conductive feature layout pattern 220b' and conductive feature layout pattern 220e'.

In some embodiments, the M1 stub pitch P5 or the M3 strap pitch P5' is measured from gridline 610a to gridline 610e, or from gridline 610e to gridline 610i. In some embodiments, the M1 stub pitch P5 is equal to the M3 strap pitch P5'. In some embodiments, the M1 stub pitch P5 differs from the M3 strap pitch P5'.

In some embodiments, conductive feature layout patterns 602a, 602b, ..., 602i are utilized to form corresponding conductive structures which provide additional M1 routing resources and via access points capable of being electrically coupled to other elements (not shown) than other designs. By providing additional via access points and additional M1 routing resources, layout design 700 occupies less area than other designs, and IC structure 100, 100', 200, 300 occupies less area than other IC structures.

Figure 8:
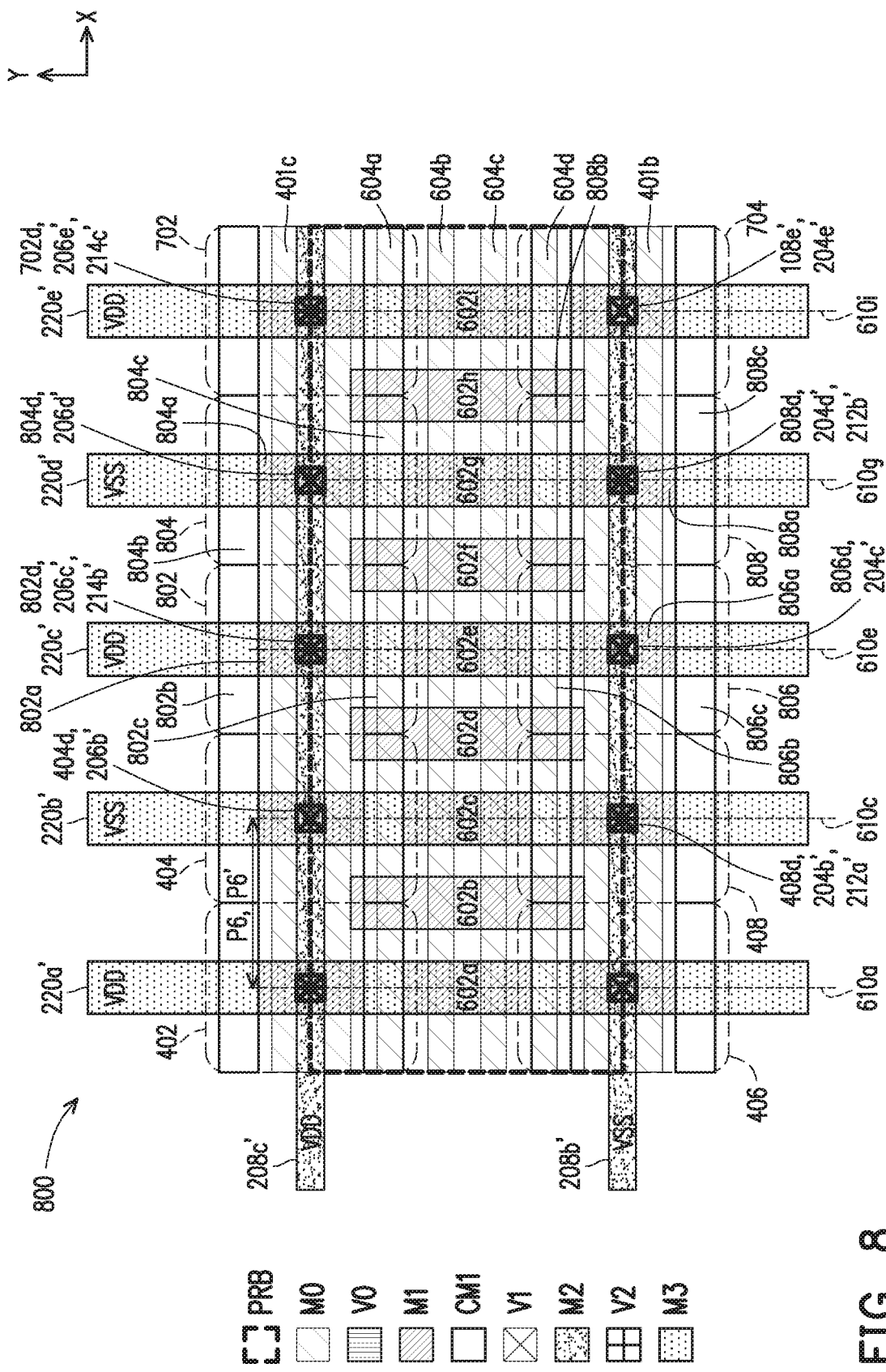
FIG. 8 is a diagram of a layout design, in accordance with some embodiments.

FIG. 8 is a diagram of a layout design 800, in accordance with some embodiments. Layout design 800 is another variation of layout design 400 or 400'. Layout design 800 is usable to manufacture an IC structure similar to IC structure 200 (FIGS. 2A-2C).

In comparison with layout design 700 of FIG. 7, power layout patterns 404, 408 and conductive feature layout pattern 220b' of layout design 800 are shifted from being positioned over gridline 610e to being positioned over gridline 610c, and layout design 800 further includes power layout patterns 802, 804, 806, 808, conductive feature layout patterns 220c', 220d' and via layout patterns 204c', 204d', 206c', 206d', 212b', 214b'.

By including additional power layout patterns (e.g., power layout patterns 802, 804, 806, 808), a pitch P6 between adjacent power layout patterns of the same row is reduced and results in additional M1 routing resources or additional via access points than other designs.

Power layout patterns 802, 806, conductive feature layout pattern 220c' and via layout patterns 204c', 206c', 214b' are positioned over gridline 610e.

Power layout patterns 804, 808, conductive feature layout pattern 220d' and via layout patterns 204d', 206d', 212b' are positioned over gridline 610g.

Via layout patterns 204c', 204d', 206c', 206d', 212b', 214b' are usable to manufacture vias 204c, 204d, 206c, 206d, 212b, 214b, respectively.

Power layout patterns 802, 804, 806, 808 are corresponding power layout patterns 402, 404, 406, 408 with the reference numerals increased by 400.

Power layout pattern 802 is usable to manufacture conductive structure 114c and via 112c (FIGS. 1A-1B, 2A-2C). Power layout pattern 804 is usable to manufacture conductive structure 114d and via 112d (FIGS. 1A-1B, 2A-2C). Power layout pattern 806 is usable to manufacture conductive structure 110c and via 108c (FIGS. 1A-1B, 2A-2C). Power layout pattern 808 is usable to manufacture conductive structure 110d and via 108d (FIGS. 1A-1B, 2A-2C).

Conductive feature layout patterns 802a, 804a, 806a, 808a are usable to manufacture corresponding conductive structures 114c, 114d, 110c, 110d (FIGS. 1A-1B, 2A-2C).

Via layout patterns 802d, 804d, 806d, 808d are usable to manufacture corresponding vias 112c, 112d, 108c, 108d (FIGS. 1A-1B, 2A-2C).

Cut feature layout patterns 802b, 802c, 804b, 804c, 806b, 806c, 808b, 808c are corresponding cut feature layout patterns 402b, 402c, 404b, 404c, 406b, 406c, 408b, 408c with the reference numerals increased by 400. In some embodiments, the cut feature layout pattern 802b or 802c identifies a location of the conductive structure 114c that is removed during fabrication of IC structure 100, 100', 200 or 300. In some embodiments, the cut feature layout pattern 804b or 804c identifies a location of the conductive structure 114d that is removed during fabrication of IC structure 100, 100', 200 or 300. In some embodiments, the cut feature layout pattern 806b or 806c identifies a location of the conductive structure 110c that is removed during fabrication of IC structure 100, 100', 200 or 300. In some embodiments, the cut feature layout pattern 808b or 808c identifies a location of the conductive structure 110d that is removed during fabrication of IC structure 100, 100', 200 or 300.

Conductive feature layout patterns 220c', 220d' are usable to manufacture corresponding conductive structures 220c, 220d.

In some embodiments, a length of a conductive feature layout pattern of conductive feature layout patterns 602a, 602c, 602e, 602g or 602i of FIG. 7 is less than one or more conductive feature layout patterns of conductive feature layout patterns 602b, 602d, 602f or 602h.

An M1 stub pitch P6 is the center to center pitch between adjacent power layout patterns of a same row in the first direction X. For example, pitch P6 is the center to center pitch between power layout pattern 402, 406 and corresponding power layout patterns 404, 408. Similarly, P6 is the center to center pitch between power layout patterns 404, 408 and corresponding power layout patterns 802, 806. Other configurations of via layout patterns and corresponding via layers or conductive feature layout patterns and corresponding metal layers are within the scope of the present disclosure.

An M3 strap pitch P6' is the center to center pitch between adjacent M3 straps. For example, pitch P6' is the center to center pitch between conductive feature layout pattern 220a' and conductive feature layout pattern 220b'. Similarly, pitch P6' is the center to center pitch between conductive feature layout pattern 220b' and conductive feature layout pattern 220c'.

In some embodiments, the M1 stub pitch P6 or the M3 strap pitch P6' is measured from: gridline 610a to gridline 610c, gridline 610c to gridline 610e, gridline 610e to gridline 610g, or gridline 610g to gridline 610i. In some embodiments, the M1 stub pitch P6 is equal to the M3 strap pitch P6'. In some embodiments, the M1 stub pitch P6 differs from the M3 strap pitch P6'.

Figure 9:
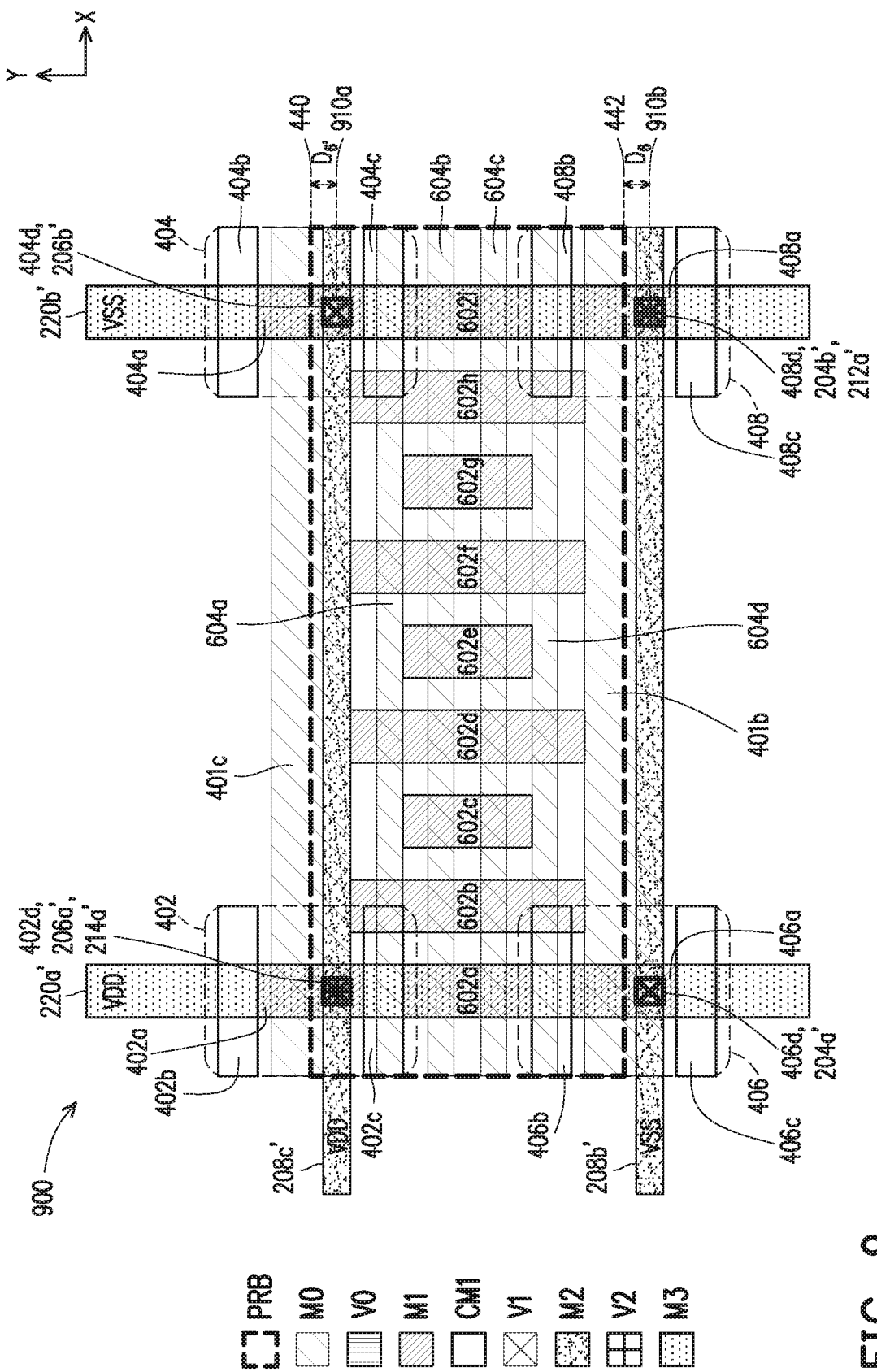
FIG. 9 is a diagram of a layout design, in accordance with some embodiments.

FIG. 9 is a diagram of a layout design 900, in accordance with some embodiments. Layout design 900 is a variation of layout design 400 or 400'. Layout design 900 is usable to manufacture an IC structure similar to IC structure 200 (FIGS. 2A-2C).

In comparison with layout design 600 of FIG. 6, conductive feature layout pattern 208c' and via layout patterns 206a', 206b', 214a', 402d, 404d of layout design 900 are shifted in the second direction Y from first line 440 to a boundary 910a by an offset distance $D_{6'}$, and conductive feature layout pattern 208b' and via layout patterns 204a', 204b', 212a', 406d, 408d of layout design 900 are shifted in the second direction Y from second line 442 to a boundary 910b by an offset distance $D_6$.

By offsetting conductive feature layout pattern 208c', 208b' by corresponding offset distances $D_{6'}$, $D_6$, and second and third conductive feature layout patterns 401b, 401c are exposed to form corresponding conductive structures that provide additional M0 via access points and additional M1 routing resources than other designs.

A center of conductive feature layout pattern 208c' and a center of via layout patterns 206a', 206b', 214a', 402d, 404d of layout design 900 are aligned with boundary 910a. In some embodiments, a center of conductive feature layout pattern 208c' and a center of each of via layout patterns 206a', 206b', 214a', 402d, 404d is aligned with one another in the first direction X.

A center of conductive feature layout pattern 208b' and a center of via layout patterns 204a', 204b', 212a', 406d, 408d of layout design 900 are aligned with boundary 910b. In some embodiments, a center of conductive feature layout pattern 208b' and a center of each of via layout patterns 204a', 204b', 212a', 406d, 408d is aligned with one another in the first direction X.

In some embodiments, offset distance $D_{6'}$ is equal to offset distance $D_6$. In some embodiments, offset distance $D_{6'}$ is not equal to offset distance $D_6$.

Figure 10:
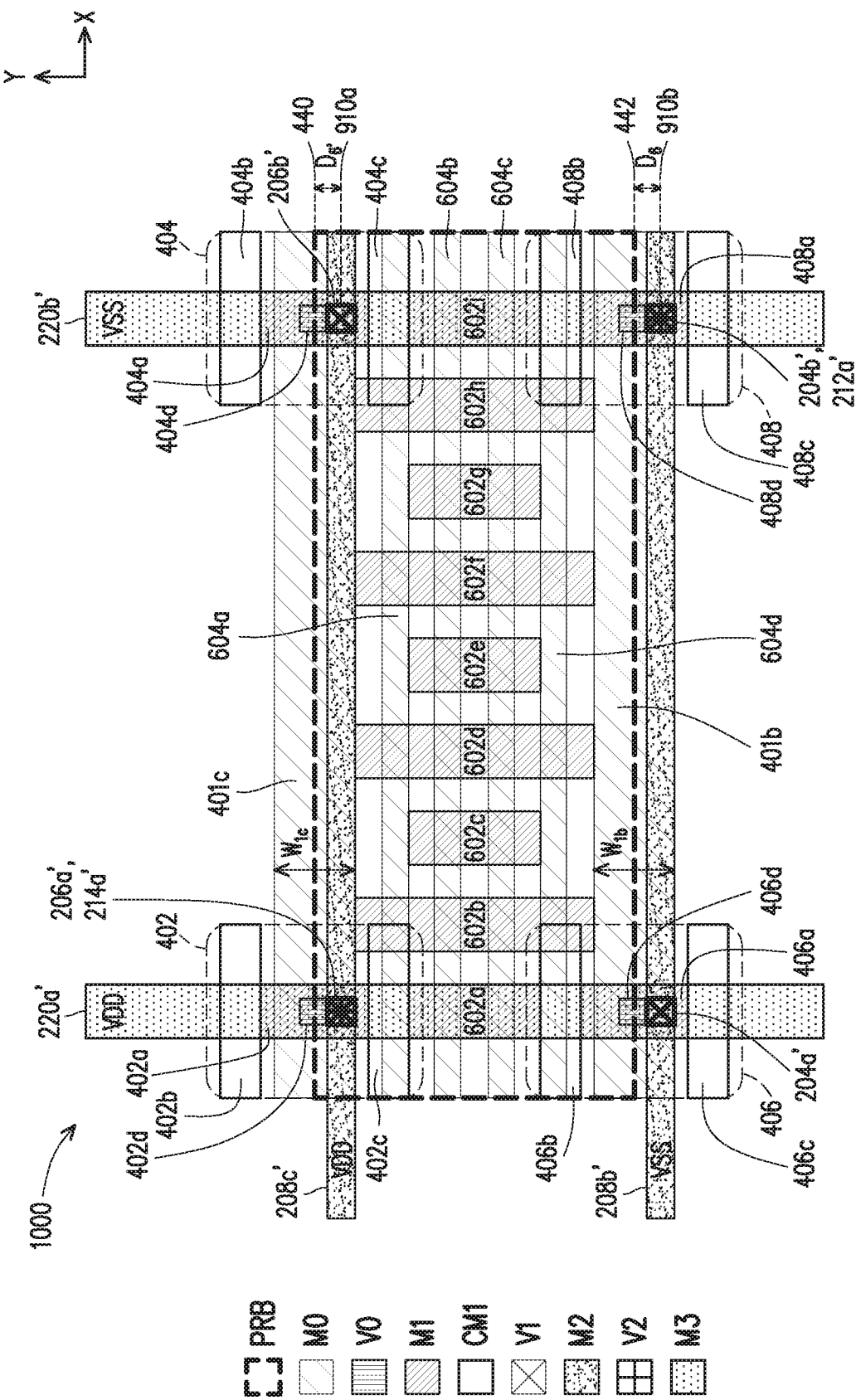
FIG. 10 is a diagram of a layout design, in accordance with some embodiments.

FIG. 10 is a diagram of a layout design 1000, in accordance with some embodiments. Layout design 1000 is another variation of layout design 400 or 400'. Layout design 1000 is usable to manufacture an IC structure similar to IC structure 200 (FIGS. 2A-2C).

In comparison with layout design 900 of FIG. 9, via layout patterns 402d, 404d of layout design 1000 are shifted in the second direction Y from boundary 910a to first line 440 by offset distance $D_{6'}$, and via layout patterns 406d, 408d of layout design 1000 are shifted in the second direction Y from boundary 910b to second line 442 by offset distance $D_6$.

By offsetting via layout patterns 402d, 404d, 406d, 408d by offset distances $D_{6'}$, $D_6$, conductive feature layout patterns 402a, 404a, 406a, 408a are exposed to form corresponding conductive structures that provide additional M1 via access points and additional M1 routing resources than other designs.

A center of via layout patterns 402d, 404d of layout design 1000 is aligned with first line 440. A center of conductive feature layout pattern 208c' and a center of via layout patterns 206a', 206b', 214a' of layout design 1000 are aligned with boundary 910a. In some embodiments, a center of conductive feature layout pattern 208c' and a center of each of via layout patterns 206a', 206b', 214a' is aligned with one another in the first direction X.

A center of via layout patterns 406d, 408d of layout design 1000 are aligned with second line 442. A center of conductive feature layout pattern 208b' and a center of via layout patterns 204a', 204b', 212a' of layout design 1000 are aligned with boundary 910b. In some embodiments, a center of conductive feature layout pattern 208b' and a center of each of via layout patterns 204a', 204b', 212a' is aligned with one another in the first direction X.

Figure 11:
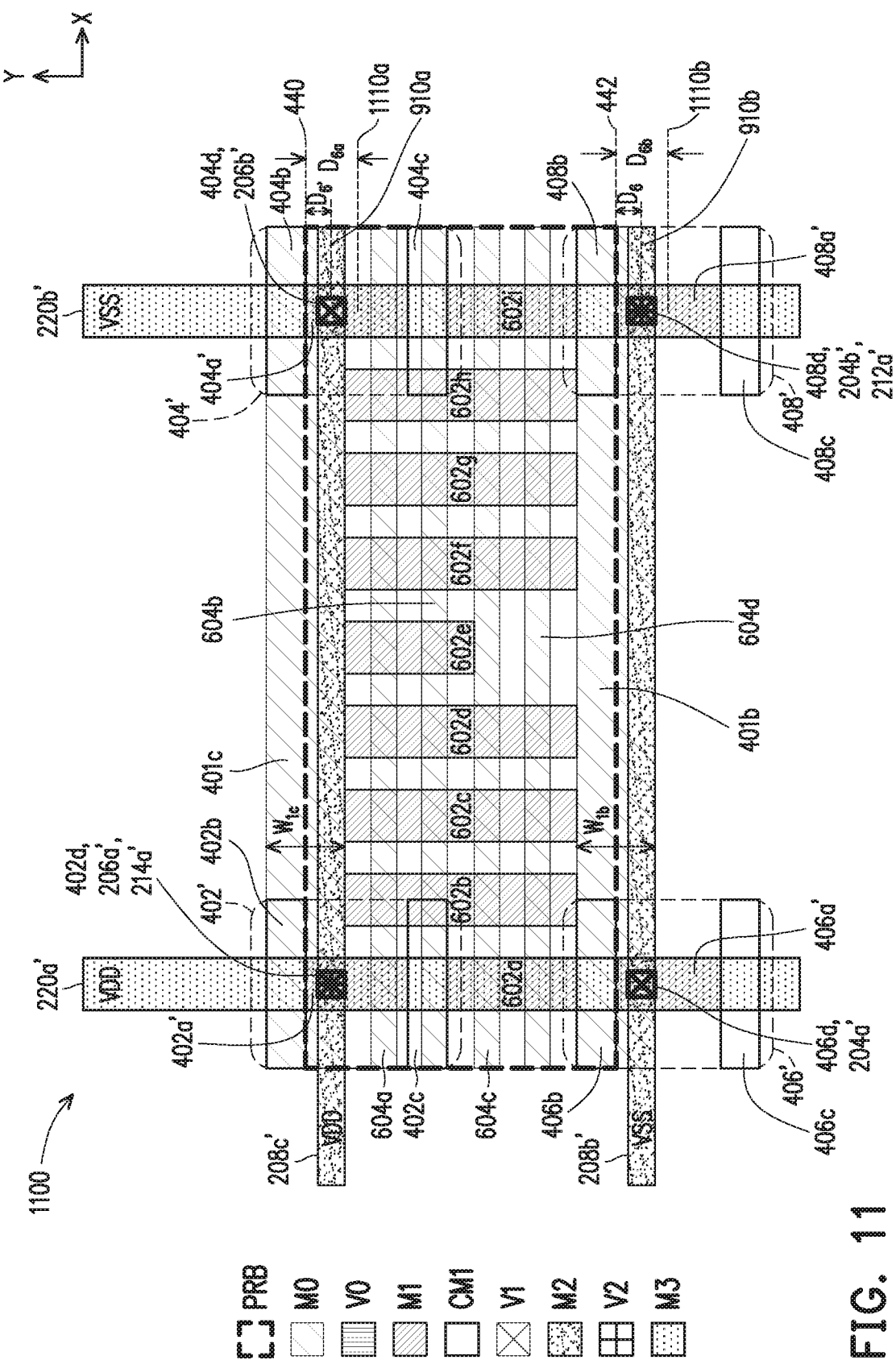
FIG. 11 is a diagram of a layout design, in accordance with some embodiments.

FIG. 11 is a diagram of a layout design 1100, in accordance with some embodiments. Layout design 1100 is another variation of layout design 400 or 400'. Layout design 1100 is usable to manufacture an IC structure similar to IC structure 200 (FIGS. 2A-2C).

In comparison with layout design 900 of FIG. 9, layout design 1100 includes power layout patterns 402', 404', 406' and 408' instead of corresponding power layout patterns 402, 404, 406 and 408.

Power layout patterns 402', 404' are asymmetric with respect to third conductive layout pattern 401c. For example, in comparison with layout design 900 of FIG. 9, power layout patterns 402' and 404' of layout pattern 1100 are shifted in the second direction Y from corresponding power layout patterns 402 and 404 by an offset distance $D_{6a}$ such that a center of power layout patterns 402' or 404' is aligned with a center of third conductive layout pattern 401c along first line 440. First line 440 is separated from a boundary 1110a by offset distance $D_{6a}$. While power layout patterns 402', 404' are shifted in the second direction Y with respect to boundary 1110a, a center of conductive feature layout pattern 208c' and a center of via layout patterns 206a', 206b', 214a', 402d, 404d of layout design 1100 are aligned with boundary 910a.

Power layout patterns 406', 408' are asymmetric with respect to second conductive layout pattern 401b. For example, in comparison with layout design 900 of FIG. 9, power layout patterns 406' and 408' of layout pattern 1100 are shifted in the second direction Y from corresponding power layout patterns 406 and 408 by an offset distance $D_{6b}$ such that a center of power layout patterns 406' or 408' is aligned with a center of second conductive layout pattern 401b along second line 442. Second line 442 is separated from a boundary 1110b by offset distance $D_{6b}$. While power layout patterns 406', 408' are shifted in the second direction Y with respect to boundary 1110b, a center of conductive feature layout pattern 208b' and a center of via layout patterns 204a', 204b', 212a', 406d, 408d of layout design 1100 are aligned with boundary 910b.

By offsetting power layout patterns 402', 404', 406', 408' by corresponding offset distances $D_{6a}$, $D_{6b}$, second and third conductive feature layout patterns 401b, 401c are exposed to form corresponding conductive structures that provide additional M0 via access points, and conductive feature layout patterns 402a', 404a', 406a', 408a' are exposed to form corresponding conductive structures that provide additional M1 via access points and additional M1 routing resources than other designs.

In some embodiments, one or more distances of offset distance $D_{6a}$ or $D_{6b}$ is equal to a distance of distance $D_{6'}$ or $D_6$. In some embodiments, one or more distances of offset distance $D_{6a}$ or $D_{6b}$ differs from a distance of distance $D_{6'}$ or $D_6$.

In some embodiments, a length of conductive feature layout patterns 602a or 602i of FIG. 11 is less than one or more of conductive feature layout patterns 602b, 602c, . . . , or 602h. In some embodiments, a length of conductive feature layout patterns 602a or 602i of layout pattern 1100 is less than one or more of conductive feature layout patterns 602a or 602i of layout pattern 900.

Figure 12:
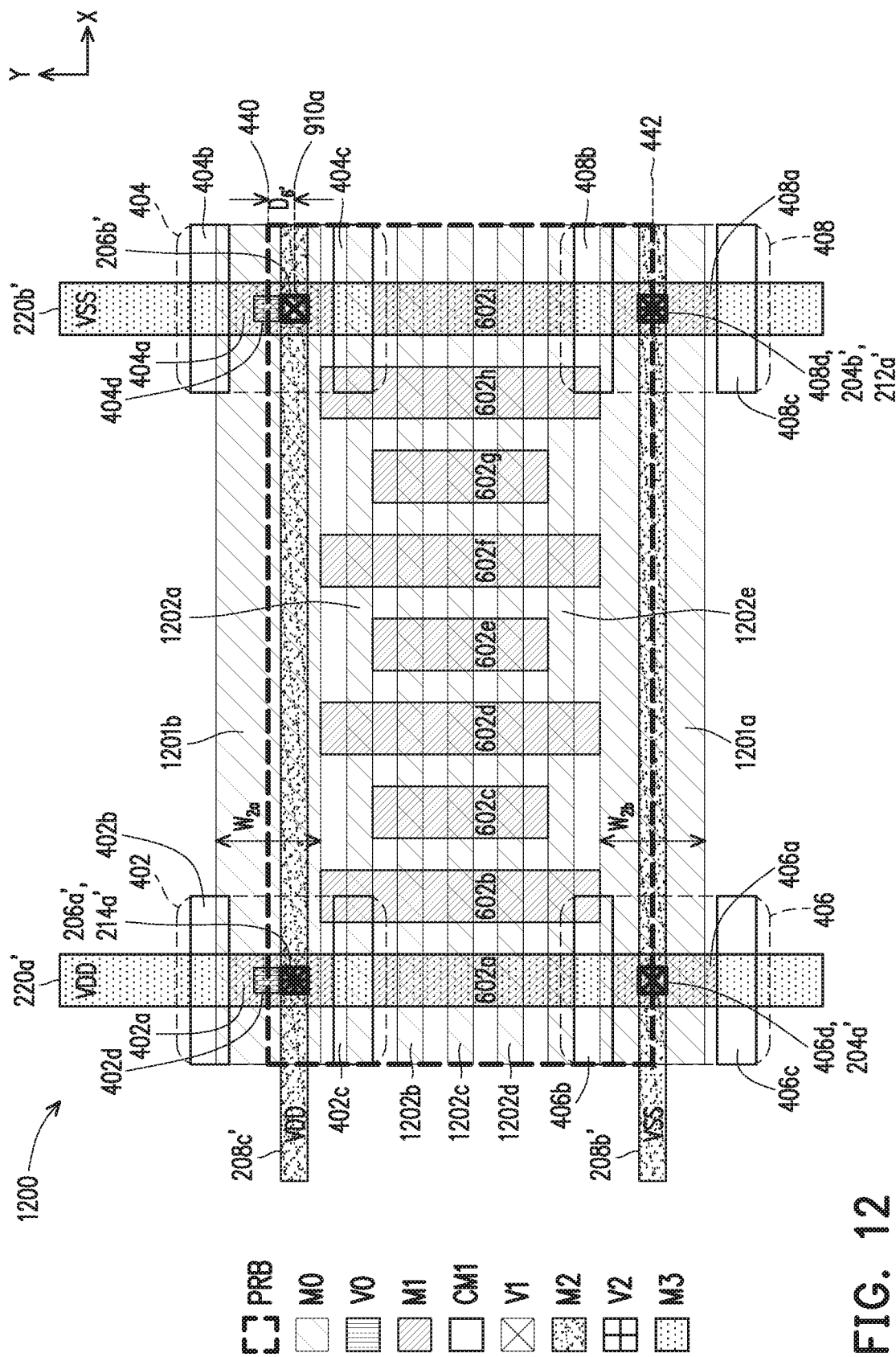
FIG. 12 is a diagram of a layout design, in accordance with some embodiments.

FIG. 12 is a diagram of a layout design 1200, in accordance with some embodiments. Layout design 1200 is another variation of layout design 400 or 400'. Layout design 1200 is usable to manufacture an IC structure similar to IC structure 200 (FIGS. 2A-2C).

In comparison with layout design 1000 of FIG. 10, layout design 1200 includes: a second conductive layout pattern 1201a instead of second conductive layout pattern 401b, a third conductive layout pattern 1201b instead of third conductive layout pattern 401c and conductive feature layout patterns 1202a, 1202b, . . . , 1202e instead of conductive feature layout patterns 604a, 604b, . . . , 604d.

Conductive feature layout patterns 1202a, 1202b, . . . , 1202e are conductive feature layout patterns 604a, 604b, . . . , 604d.

Second conductive layout pattern 1201a is a variation of second conductive layout pattern 401b, and is usable to manufacture second rail 102b (FIGS. 1A-1B, 2A-2C, 3A-3C). Second conductive layout pattern 1201a has a width $W_{2a}$ in the second direction Y.

Third conductive layout pattern 1201b is a variation of third conductive layout pattern 401c, and is usable to manufacture third rail 102c (FIGS. 1A-1B, 2A-2C, 3A-3C). Third conductive layout pattern 1201b has a width $W_2b$ in the second direction Y.

By offsetting conductive feature layout pattern 208c' by offset distance $D_{6'}$, and increasing the widths $W_{2a}$, $W_{2b}$ of corresponding second and third conductive layout patterns 1201a, 1201b, conductive feature layout patterns 402a, 404a, 406a, 408a, and second and third conductive layout patterns 1201a, 1201b are further exposed to form corresponding conductive structures that provide additional via access points, and additional M1 routing resources than other designs.

In some embodiments, width $W_{2a}$ is the same as width $W_{2b}$. In some embodiments, width $W_{2a}$ differs from width $W_{2b}$. In some embodiments, at least one width of widths $W_{1a}$ or $W_{1b}$ of layout pattern 1200 is less than at least one width of width $W_{2a}$ or $W_{2b}$.

In FIG. 12, the center of conductive feature layout pattern 208b' and the center of via layout patterns 204a', 204b', 212a', 406d and 408d are aligned with the second line 442. By using conductive feature layout patterns 1202a, 1202b, . . . , 1202e, second conductive layout pattern 1201a and third conductive layout pattern 1201b, a height of layout design 1200 is greater than a height of layout design 1000.

Figure 13:
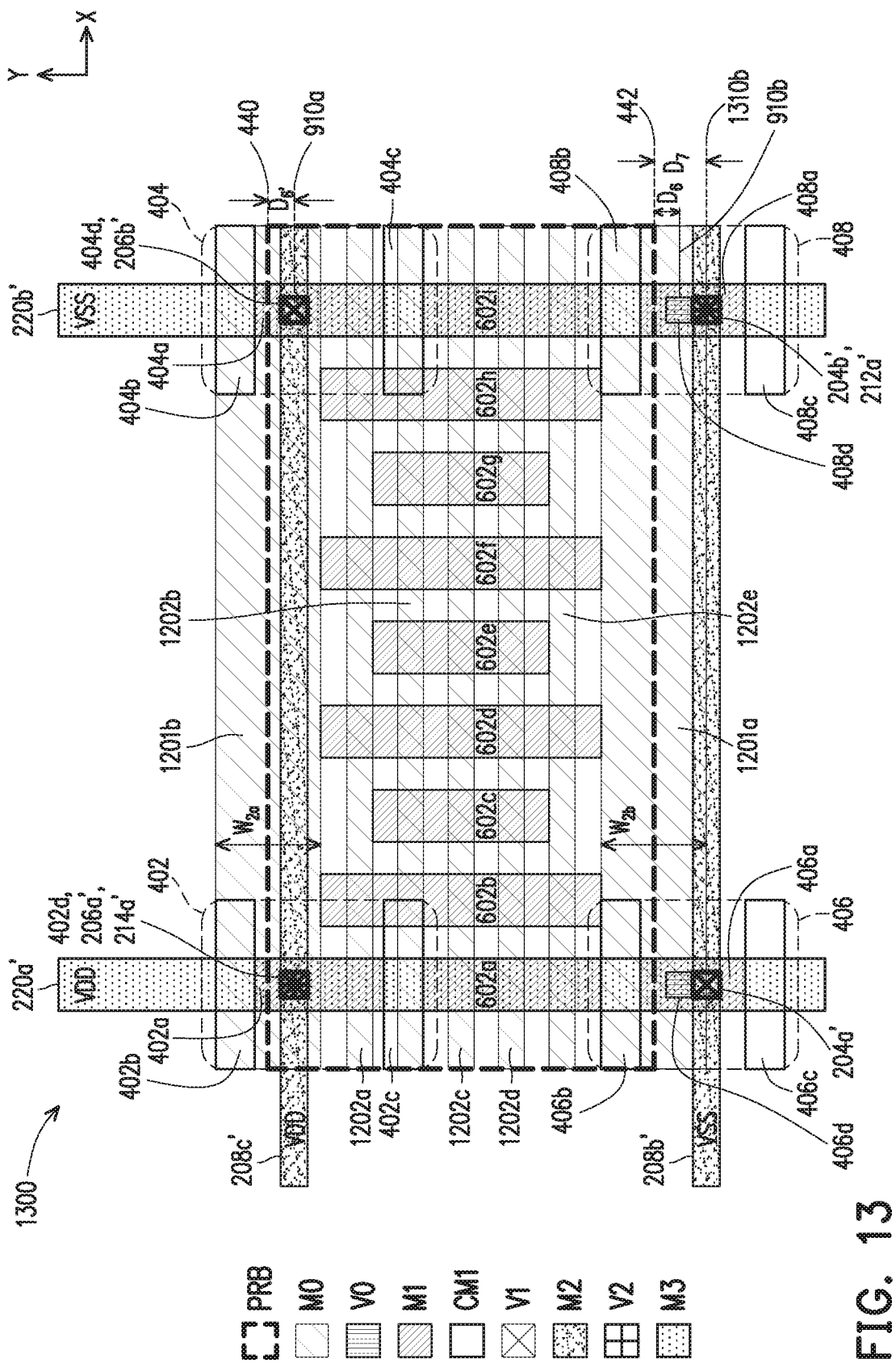
FIG. 13 is a diagram of a layout design, in accordance with some embodiments.

FIG. 13 is a diagram of a layout design 1300, in accordance with some embodiments. Layout design 1300 is another variation of layout design 400 or 400'. Layout design 1300 is usable to manufacture an IC structure similar to IC structure 200 (FIGS. 2A-2C).

In comparison with layout design 1200 of FIG. 12, via layout patterns 402d, 404d of layout design 1300 are shifted in the second direction Y from first line 440 to boundary 910a by an offset distance $D_{6'}$, via layout patterns 406d, 408d of layout design 1300 are shifted in the second direction Y from second line 442 to boundary 910b by an offset distance $D_6$, and conductive feature layout pattern 208b' and via layout patterns 204a', 204b', 212a' of layout design 1300 are shifted in the second direction Y from second line 442 to a boundary 1310b by an offset distance $D_7$. Boundary 1310b is separated from second line 442 in the second direction Y by distance $D_7$.

By offsetting conductive feature layout pattern 208b', 208c' by corresponding offset distances $D_7$, $D_6$, and increasing the widths $W_{2a}$, $W_{2b}$ of corresponding second and third conductive layout patterns 1201a, 1201b, conductive feature layout patterns 402a, 404a, 406a, 408a, and second and third conductive layout patterns 1201a, 1201b are further exposed to form corresponding conductive structures that provide additional via access points, and additional M1 routing resources than other designs.

A center of conductive feature layout pattern 208c' and a center of via layout patterns 206a', 206b', 214a', 402d, 404d of layout design 1300 are aligned with boundary 910a. A center of third conductive layout pattern 1201b is aligned with first line 440. In some embodiments, a center of conductive feature layout pattern 208c' and a center of each of via layout patterns 206a', 206b', 214a', 402d, 404d is aligned with one another in the first direction X.

A center of via layout patterns 406d, 408d of layout design 1300 is aligned with boundary 910b. A center of second conductive layout pattern 1201a is aligned with second line 442.

A center of conductive feature layout pattern 208b' and a center of via layout patterns 204a', 204b', 212a' of layout design 1300 are aligned with boundary 1310b. In some embodiments, a center of conductive feature layout pattern 208b' and a center of each of via layout patterns 204a', 204b', 212a' is aligned with one another in the first direction X.

Figure 14:
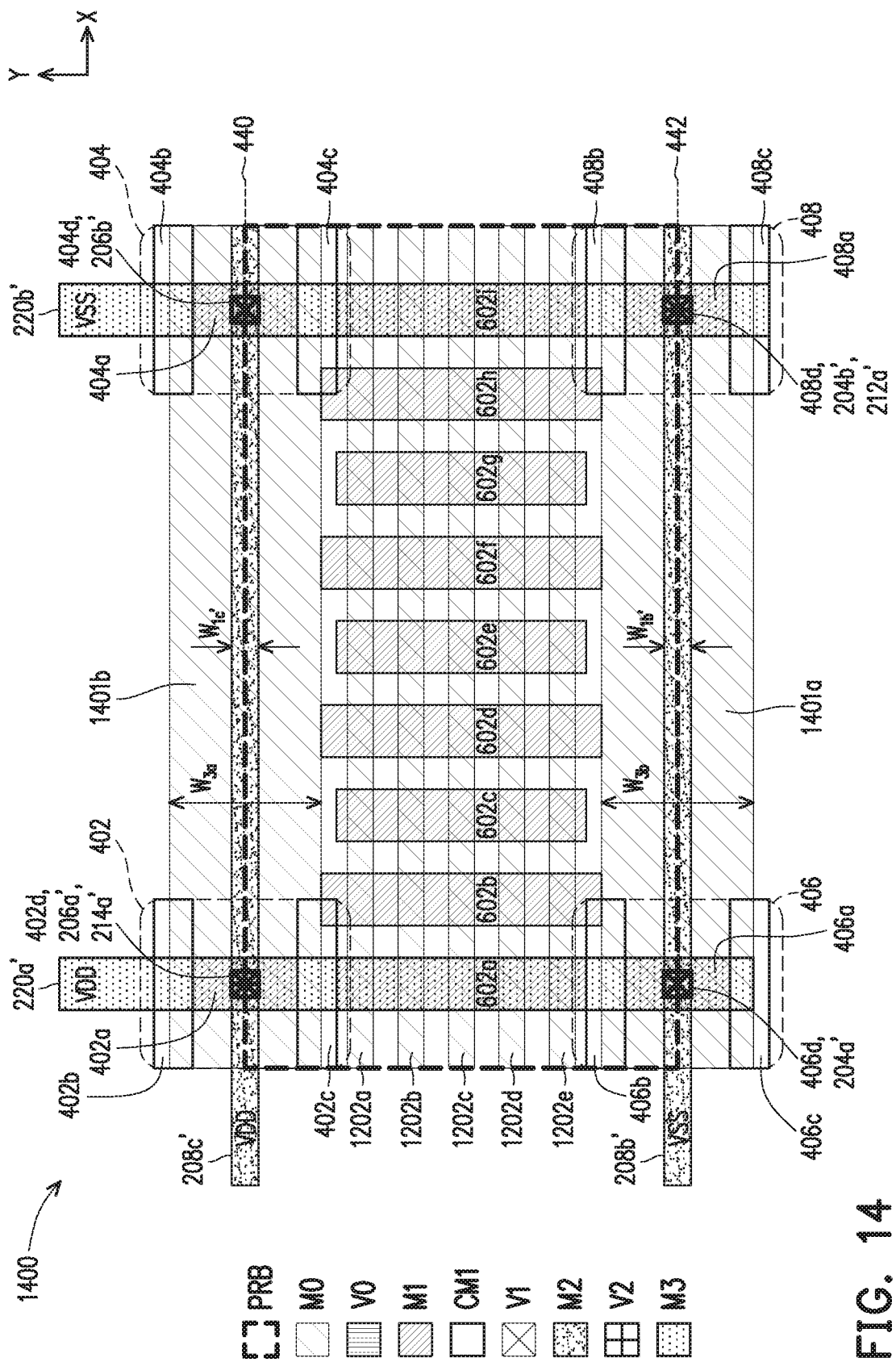
FIG. 14 is a diagram of a layout design, in accordance with some embodiments.

FIG. 14 is a diagram of a layout design 1400, in accordance with some embodiments. Layout design 1400 is another variation of layout design 400 or 400'. Layout design 1400 is usable to manufacture an IC structure similar to IC structure 200 (FIGS. 2A-2C).

In comparison with layout design 1200 of FIG. 12, layout design 1400 includes a second conductive layout pattern 1401a instead of second conductive layout pattern 1201a and a third conductive layout pattern 1401b instead of third conductive layout pattern 1201b.

Second conductive layout pattern 1401a is a variation of second conductive layout pattern 401b, and is usable to manufacture second rail 102b (FIGS. 1A-1B, 2A-2C). Second conductive layout pattern 1401a has a width $W_{3a}$ in the second direction Y.

Third conductive layout pattern 1401b is a variation of third conductive layout pattern 401c, and is usable to manufacture third rail 102c (FIGS. 1A-1B, 2A-2C). Third conductive layout pattern 1401b has a width $W_{3b}$ in the second direction Y.

By increasing the widths $W_{3a}$, $W_{3b}$ of corresponding second and third conductive layout patterns 1401a, 1401b, second and third conductive layout patterns 1401a, 1401b are further exposed to form corresponding conductive structures that provide additional via access points, and additional M1 routing resources than other designs.

In some embodiments, width $W_{3a}$ is the same as width $W_{3b}$. In some embodiments, width $W_{3a}$ differs from width $W_{3b}$. In some embodiments, at least one width of widths $W_{1b}$, $W_{1c}$, $W_{2a}$, and $W_{2b}$ of FIGS. 6-13 is less than at least one width of width $W_{3a}$ and $W_{3b}$.

In FIG. 14, a center of conductive feature layout pattern 208c' and a center of via layout patterns 206a', 206b', 214a', 402d, 404d are aligned with first line 440. In some embodiments, a center of conductive feature layout pattern 208c' and a center of each of via layout patterns 206a', 206b', 214a', 402d, 404d is aligned with one another in the first direction X.

Figure 15:
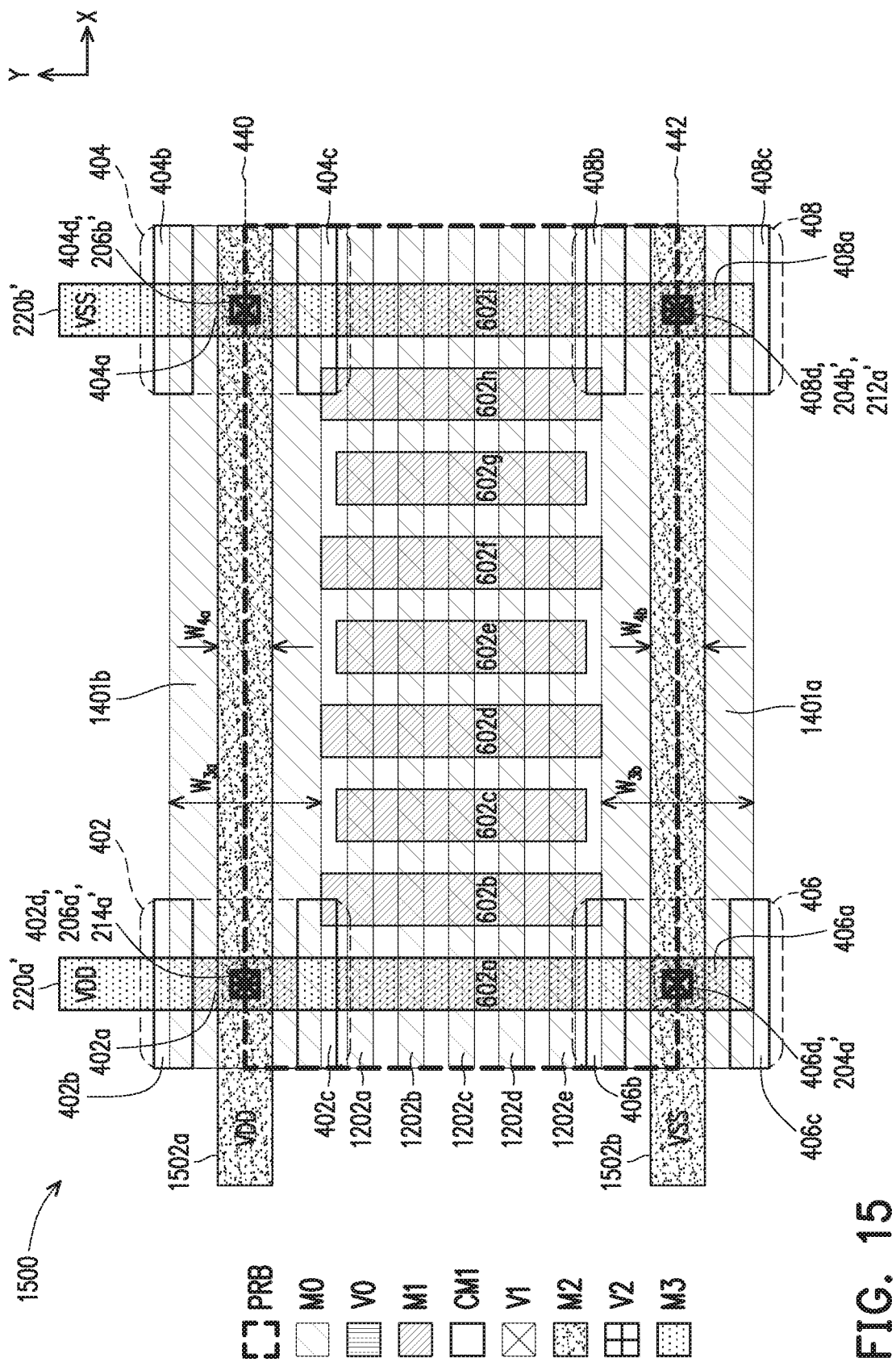
FIG. 15 is a diagram of a layout design, in accordance with some embodiments.

FIG. 15 is a diagram of a layout design 1500, in accordance with some embodiments. Layout design 1500 is another variation of layout design 400 or 400'. Layout design 1500 is usable to manufacture an IC structure similar to IC structure 200 (FIGS. 2A-2C).

In comparison with layout design 1400 of FIG. 14, layout design 1500 includes a conductive feature layout pattern 1502a instead of conductive feature layout pattern 208c' and a conductive feature layout pattern 1502b instead of conductive feature layout pattern 208b'.

Conductive feature layout pattern 1502a is a variation of conductive layout pattern 208c', and is usable to manufacture third conductive structure 208c (FIGS. 1A-1B, 2A-2C). Conductive feature layout pattern 1502a has a width $W_{4a}$ in the second direction Y.

Conductive feature layout pattern 1502b is a variation of conductive layout pattern 208b', and is usable to manufacture second conductive structure 208b (FIGS. 1A-1B, 2A-2C). Conductive feature layout pattern 1502b has a width $W_{4b}$ in the second direction Y.

By increasing the widths $W_{3a}$, $W_{3b}$ of corresponding second and third conductive layout patterns 1401a, 1401b, and the widths $W_{4a}$, $W_{4b}$ of corresponding conductive feature layout patterns 1502a, 1502b, second and third conductive layout patterns 1401a, 1401b and conductive feature layout patterns 1502a, 1502b are further exposed to form corresponding conductive structures that provide additional M0, M2 via access points, and additional M1 routing resources than other designs.

In some embodiments, width $W_{4a}$ is the same as width $W_{4b}$. In some embodiments, width $W_{4a}$ differs from width $W_{4b}$. In some embodiments, at least one width of widths $W_{1b'}$ and $W_{1c'}$ of FIGS. 6-14 & 16-17 is less than at least one width of width $W_{4a}$ and $W_{4b}$. In some embodiments, at least one width of widths $W_{3a}$ or $W_{3b}$ is greater than or equal to at least one width of width $W_{4a}$ or $W_{4b}$.

Figure 16:
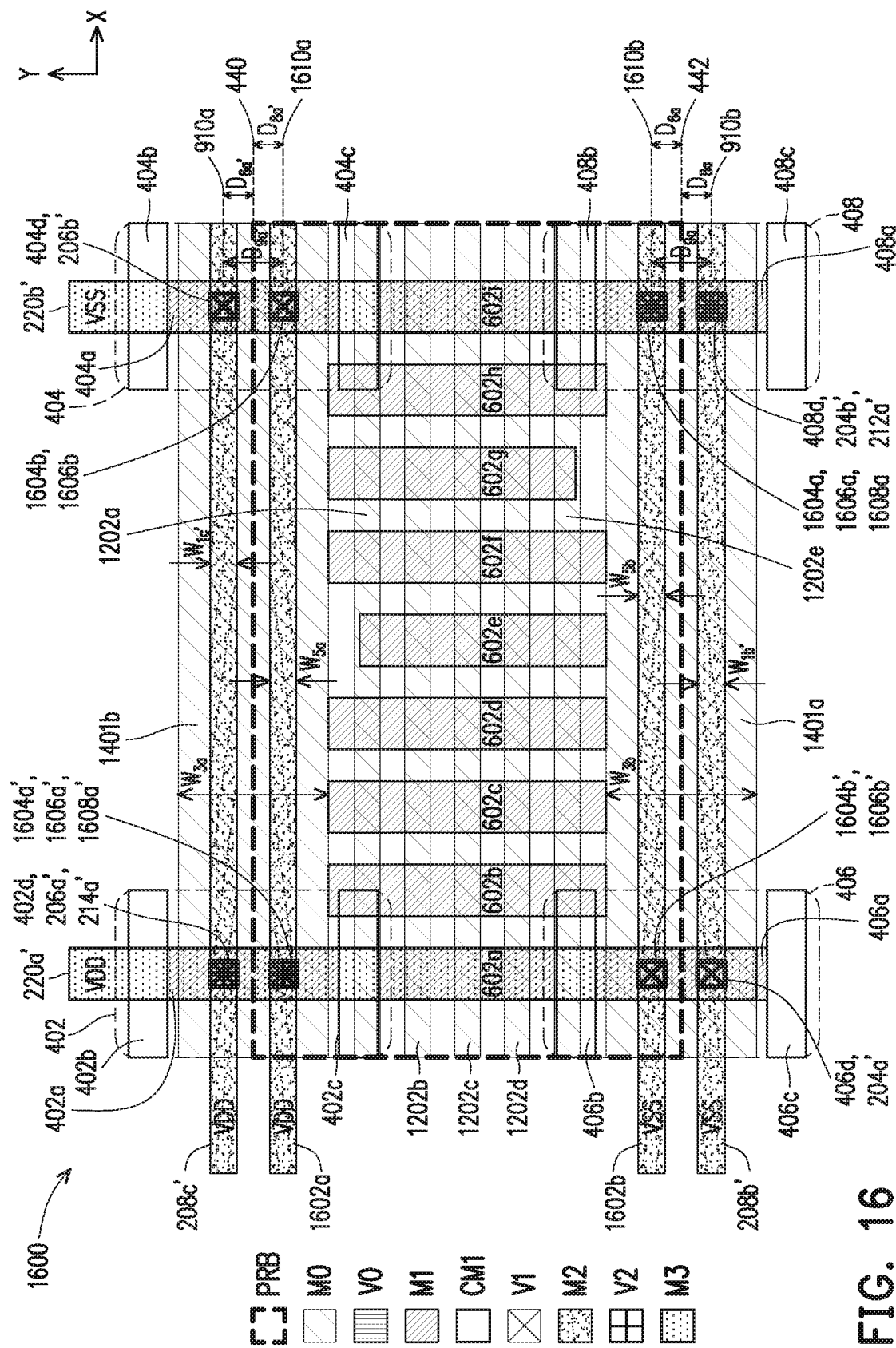
FIG. 16 is a diagram of a layout design, in accordance with some embodiments.

FIG. 16 is a diagram of a layout design 1600, in accordance with some embodiments. Layout design 1600 is another variation of layout design 400 or 400'. Layout design 1600 is usable to manufacture an IC structure similar to IC structure 200 (FIGS. 2A-2C).

In comparison with layout design 1400 of FIG. 14, layout design 1600 further includes a conductive feature layout pattern 1602a, via layout patterns 1604a', 1606a', 1608a', via layout patterns 1604b, 1606b, conductive feature layout pattern 1602b, via layout patterns 1604a, 1606a, 1608a, and via layout patterns 1604b', 1606b'.

Conductive feature layout pattern 1602a is a variation of conductive layout pattern 208c', and is usable to manufacture third conductive structure 208c (FIGS. 1A-1B, 2A-2C). Conductive feature layout pattern 1602a has a width $W_{5a}$ in the second direction Y.

Via layout patterns 1604a', 1606a', 1608a' are vias 402d, 206a', 214a', respectively. Via layout patterns 1604a', 1606a', 1608a' are usable to manufacture vias 112a, 206a, 214a, respectively.

Via layout patterns 1604b, 1606b are corresponding vias 404d, 206b', and are usable to manufacture corresponding vias 112b, 206b.

In FIG. 16, a center of conductive feature layout pattern 208c' and a center of via layout patterns 206a', 206b', 214a', 402d, 404d are aligned with boundary 910a. In some embodiments, a center of conductive feature layout pattern 208c' and a center of each of via layout patterns 206a', 206b', 214a', 402d, 404d are aligned with one another in the first direction X. Boundary 910a is separated from first line 440 in the second direction Y by a distance $D_{6a''}$.

A center of conductive feature layout pattern 1602a and a center of via layout patterns 1604a', 1606a', 1608a', 1604b, 1606b are aligned with boundary 1610a. In some embodiments, a center of conductive feature layout pattern 1602a and a center of each of via layout patterns 1604a', 1606a', 1608a', 1604b, 1606b are aligned with one another in the first direction X. Boundary 1610a is separated from first line 440 in the second direction Y by a distance $D_{8a''}$. Boundary 1610a and boundary 910a are separated from each other in the second direction Y by a distance $D_{9a''}$.

Conductive feature layout pattern 1602b is a variation of conductive layout pattern 208b', and is usable to manufacture second conductive structure 208b (FIGS. 1A-1B, 2A-2C). Conductive feature layout pattern 1602b has a width $W_{5b}$ in the second direction Y.

Via layout patterns 1604b', 1606b' are corresponding vias 406d, 204a', and are usable to manufacture corresponding vias 108a, 204a.

Via layout patterns 1604a, 1606a, 1608a are embodiments of corresponding vias 408d, 204b', 212a', and are usable to manufacture corresponding vias 108b, 204b, 212a.

In FIG. 16, a center of conductive feature layout pattern 208b' and a center of via layout patterns 204a', 204b', 212a', 406d, 408d are aligned with boundary 910b. In some embodiments, a center of conductive feature layout pattern 208b' and a center of each of via layout patterns 204a', 204b', 212a', 406d, 408d are aligned with one another in the first direction X. Boundary 910b is separated from second line 442 in the second direction Y by a distance $D_{8a}$.

A center of conductive feature layout pattern 1602b and a center of via layout patterns 1604a, 1606a, 1608a, 1604b', 1606b' are aligned with boundary 1610b. In some embodiments, a center of conductive feature layout pattern 1602b and a center of each of via layout patterns 1604a, 1606a, 1608a, 1604b', 1606b' are aligned with one another in the first direction X. Boundary 1610b is separated from second line 442 in the second direction Y by a distance $D_{6a}$. Boundary 1610b and boundary 910b are separated from each other in the second direction Y by a distance $D_{9a}$.

By increasing the widths $W_{3a}$, $W_{3b}$ of corresponding second and third conductive layout patterns 1401a, 1401b, second and third conductive layout patterns 1401a, 1401b are further exposed to form corresponding conductive structures that provide additional M0 via access points. By adding conductive feature layout patterns 1602a, 1602b, and separating conductive feature layout patterns 1602a, 1602b from corresponding conductive feature layout patterns 208c', 208b' in the second direction Y to form corresponding conductive structures that provide additional M2 via access points than other designs, without also reducing M0 via access points by not covering the center portion of second and third conductive layout patterns 1401a, 1401b.

In some embodiments, a width of widths $W_{1b''}$, $W_{1c''}$, $W_{5a'}$ or $W_{5b}$ is the same as a different width of widths $W_{1b''}$, $W_{1c''}$, $W_{5a'}$, or $W_{5b}$. In some embodiments, a width of widths $W_{3a}$ or $W_{3b}$ is greater than or equal to a width of widths $W_{1b''}$, $W_{1c''}$, $W_{5a'}$, or $W_{5b}$.

In some embodiments, distance $D_{9a}$ is the same as distance $D_{9a''}$. In some embodiments, distance $D_{9a}$ differs from distance $D_{9a''}$. In some embodiments, a distance of distances $D_{6a}$, $D_{8a}$, $D_{6a'}$ or $D_{8a''}$ is the same as a different distance of distances $D_{6a}$, $D_{8a}$, $D_{6a'}$ or $D_{8a''}$. In some embodiments, a distance of distances $D_{6a}$, $D_{8a}$, $D_{6a'}$ or $D_{8a''}$ differs from a different distance of distances $D_{6a}$, $D_{8a}$, $D_{6a'}$ or $D_{8a''}$.

Figure 17:
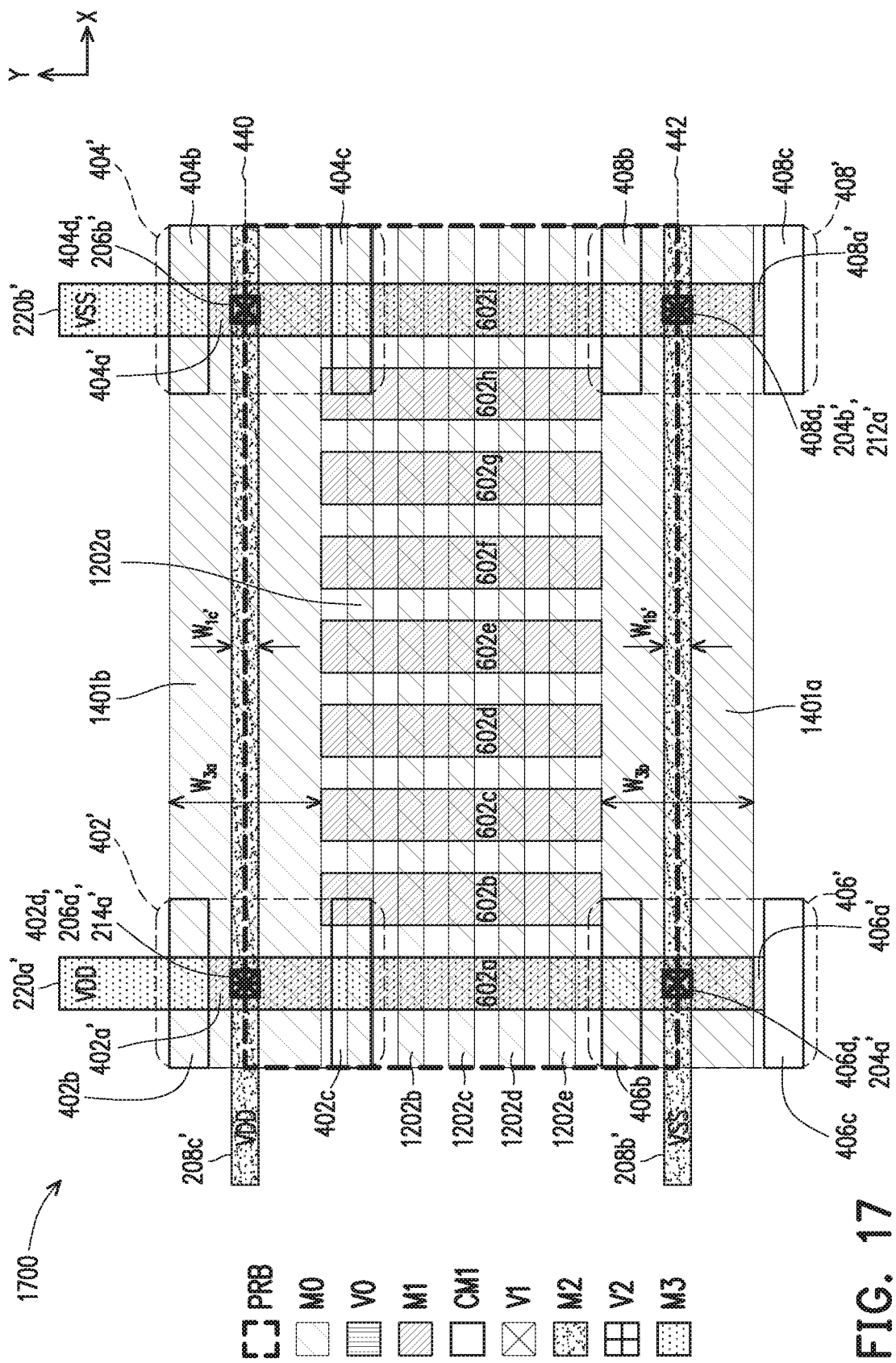
FIG. 17 is a diagram of a layout design, in accordance with some embodiments.

FIG. 17 is a diagram of a layout design 1700, in accordance with some embodiments. Layout design 1700 is another variation of layout design 400 or 400'. Layout design 1700 is usable to manufacture an IC structure similar to IC structure 200 (FIGS. 2A-2C).

In comparison with layout design 1400 of FIG. 14, layout design 1700 includes power layout patterns 402', 404', 406' and 408' instead of corresponding power layout patterns 402, 404, 406 and 408. Power layout patterns 402', 404' are asymmetric with respect to first line 440, and power layout patterns 406', 408' are asymmetric with respect to second line 442.

Power layout patterns 402', 404', 406' and 408' of layout pattern 1700 include corresponding conductive feature layout patterns 402a', 404a', 406a' and 408a' instead of corresponding conductive feature layout patterns 402a, 404a, 406a and 408a shown in FIG. 14.

By utilizing power layout patterns 402', 404', 406', 408', conductive feature layout patterns 402a', 404a', 406a', 408a' are exposed to form corresponding conductive structures that provide additional M1 via access points and additional M1 routing resources, and second and third conductive layout patterns 1401a, 1401b are further exposed to form corresponding conductive structures that provide additional M0 via access points than other designs. By increasing the widths $W_{3a}$, $W_{3b}$ of corresponding second and third conductive layout patterns 1401a, 1401b, to form corresponding conductive structures provide additional M0 via access points.

A length of a conductive feature layout pattern of the conductive feature layout patterns 402a', 404a', 406a' or 408a' is greater than a length of a corresponding conductive feature layout pattern of the conductive feature layout patterns 402a, 404a, 406a or 408a shown in FIG. 14.

In some embodiments, a length of conductive feature layout patterns 602a or 602i of FIG. 17 is less than one or more of conductive feature layout patterns 602b, 602c, . . . , or 602h. In some embodiments, a length of conductive feature layout patterns 602a or 602i of layout pattern 1700 is less than a length of conductive feature layout patterns 602a or 602i of layout pattern 1400.

Figure 18:
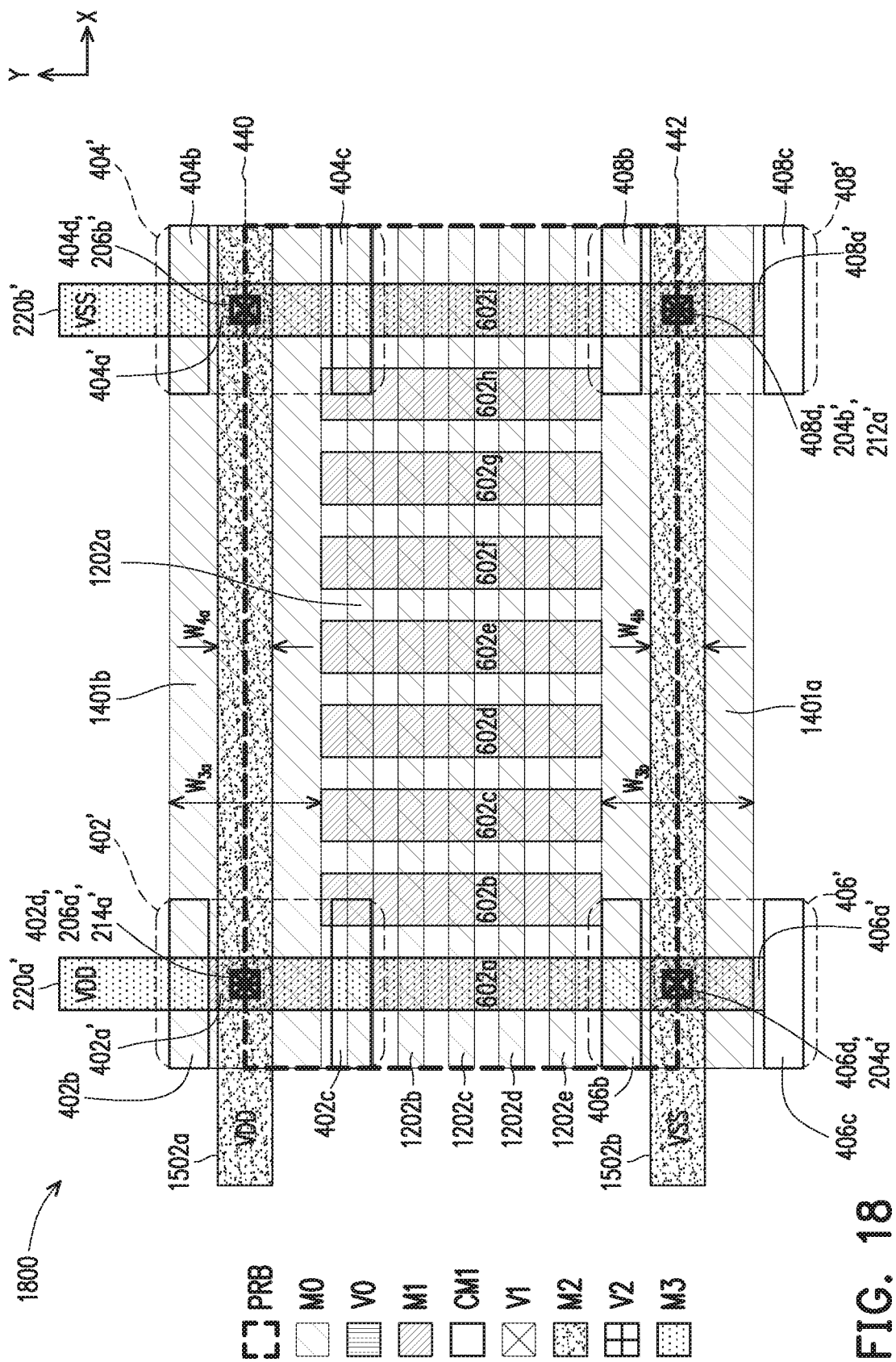
FIG. 18 is a diagram of a layout design, in accordance with some embodiments.

FIG. 18 is a diagram of a layout design 1800, in accordance with some embodiments. Layout design 1800 is another variation of layout design 400 or 400'. Layout design 1800 is usable to manufacture an IC structure similar to IC structure 200 (FIGS. 2A-2C).

In comparison with layout design 1700 of FIG. 17, layout design 1800 includes conductive feature layout pattern 1502a instead of conductive feature layout pattern 208c' and conductive feature layout pattern 1502b instead of conductive feature layout pattern 208b'. In some embodiments, at least one width of widths $W_{1b'}$ or $W_{1c'}$ of FIG. 17 is less than at least one width of width $W_{4a}$ or $W_{4b}$. In some embodiments, at least one width of widths $W_{3a}$ or $W_{3b}$ is greater than or equal to at least one width of width $W_{4a}$ or $W_{4b}$.

By increasing the widths $W_{3a}$, $W_{3b}$ of corresponding second and third conductive layout patterns 1401a, 1401b, and the widths $W_{4a}$, $W_{4b}$ of corresponding conductive feature layout patterns 1502a, 1502b, second and third conductive layout patterns 1401a, 1401b and conductive feature layout patterns 1502a, 1502b are further exposed to form corresponding conductive structures that provide additional M0, M2 via access points, and additional M1 routing resources than other designs.

In some embodiments, layout design 600, 700, 800, 900, 1000, 1100, 1200, 1300, 1400, 1500, 1600, 1700 or 1800 is a layout design of first region 420, second region 422, third region 424 or fourth region 426 (FIGS. 4A-4B or 5A-5B). In some embodiments, layout design 600, 700, 800, 900, 1000, 1100, 1200, 1300, 1400, 1500, 1600, 1700 or 1800 is a layout design of a standard cell.

By providing additional via access points or additional M1 routing resources, one or more layout designs 600-1800 occupy less area than other designs, and one or more IC structures 100, 100', 200, 300 occupy less area than other IC structures. Other configurations of via layout patterns and corresponding via layers or conductive feature layout patterns and corresponding metal layers are within the scope of the present disclosure.

Figure 19A:
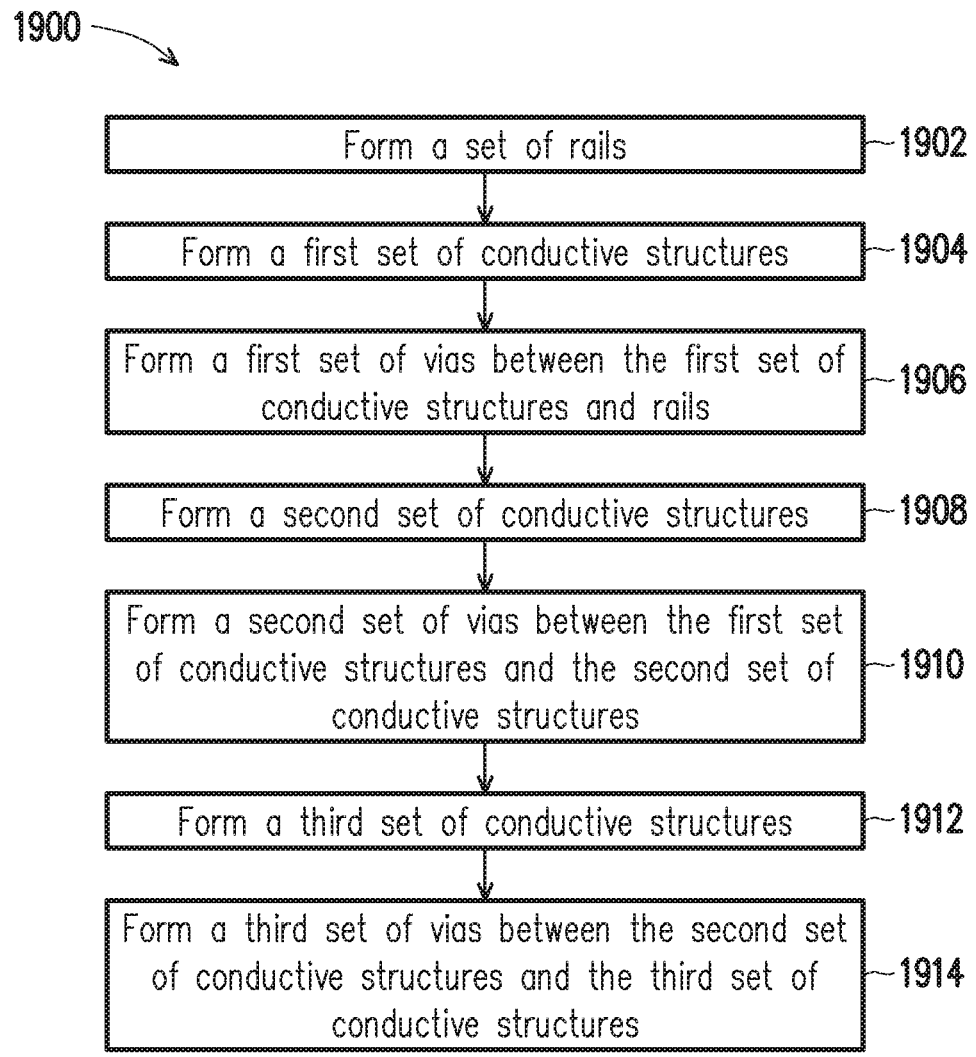
FIG. 19A is a flowchart of a method of forming an IC structure, in accordance with some embodiments.

FIG. 19A is a flowchart of a method 1900 of forming or manufacturing an IC in accordance with some embodiments. It is understood that additional operations may be performed before, during, and/or after the method 1900 depicted in FIG. 19, and that some other processes may only be briefly described herein. In some embodiments, the method 1900 is usable to form integrated circuits, such as IC structure 100, 100', 200 or 300 (FIGS. 1A-1B, 2A-2C or 3A-3C). In some embodiments, the method 1900 is usable to form integrated circuits having similar structural relationships as one or more of layout patterns 400-1800 (FIGS. 4A-4B, 5A-5B or 6-18).

In operation 1902 of method 1900, a set of rails 120 are formed. In some embodiments, the set of rails 120 includes first rail 102a, second rail 102b or third rail 102c. In some embodiments, the set of rails 120 extends in the first direction X and is located at a first level. In some embodiments, the first level is M0. Other configurations of via levels or metal levels are within the scope of the present disclosure. In some embodiments, each rail of the set of rails 120 is separated from one another in second direction Y. In some embodiments, operation 1902 of method 1900 includes at least operation 1920 or 1922 of method 1900' (shown below).

In operation 1904, a first set of conductive structures 130 are formed. In some embodiments, the first set of conductive structures 130 includes one or more of conductive structures 106a, 106b, . . . , 106f; conductive structures 110a, 110b, . . . , 110f, or conductive structures 114a, 114b, . . . , 114f. In some embodiments, the first set of conductive structures 130 extends in the second direction Y, overlaps the set of rails 120 and is located at a second level different than the first level. In some embodiments, the second level is M1. Other configurations of levels are within the scope of the present disclosure. In some embodiments, the first set of conductive structures 130 includes a first sub-set of conductive structures and a second sub-set of conductive structures. In some embodiments, the first sub-set of conductive structures includes conductive structures 106a, 106b, . . . , 106f, and the second sub-set of conductive structures includes conductive structures 114a, 114b, . . . , 114f. In some embodiments, at least one conductive structure of the first sub-set of conductive structures is aligned with at least one conductive structure of the second sub-set of conductive structures in the second direction. In some embodiments, operation 1904 of method 1900 includes at least operation 1924 or 1926 of method 1900' (shown below).

In operation 1906, a first set of vias 125 is formed between the set of rails 120 and the first set of conductive structures 130. In some embodiments, the first set of vias 125 includes one or more of vias 104a, 104b, . . . , 104f, vias 108a, 108b, . . . , 108f or vias 112a, 112b, . . . , 112f. In some embodiments, each via of the first set of vias 125 is located where each conductive structure of the first set of conductive structures 130 overlaps each rail of the set of rails 120. In some embodiments, the first set of vias 125 couple the set of rails 120 to the first set of conductive structures 130. In some embodiments, operation 1906 of method 1900 includes at least operation 1928 or 1930 of method 1900' (shown below). In some embodiments, the first set of vias 125 are located at V0. In some embodiments, the first set of vias 125 are located between M0 and M1. Other configurations of via levels or metal levels are within the scope of the present disclosure.

In operation 1908, a second set of conductive structures 230 is formed over the set of rails 120. In some embodiments, the second set of conductive structures 230 includes first conductive structure 208a, second conductive structure 208b or third conductive structure 208c. In some embodiments, the second set of conductive structures 230 extends in the first direction X, and is located at a third level different than the first level and the second level. In some embodiments, the third level is M2. Other configurations of levels are within the scope of the present disclosure. In some embodiments, each conductive structure of the second set of conductive structures 230 is separated from one another in the second direction Y. In some embodiments, operation 1908 of method 1900 includes at least operation 1932 or 1934 of method 1900' (shown below).

In operation 1910, a second set of vias 225 is formed between the second set of conductive structures 230 and the first set of conductive structures 130. In some embodiments, the second set of vias 225 includes one or more of vias 202a, 202b, . . . , 202f, vias 204a, 204b, . . . , 204f or vias 206a, 206b, . . . , 206f. In some embodiments, the second set of vias 225 couple the second set of conductive structures 230 to the first set of conductive structures 130. In some embodiments, each via of the second set of vias 225 is located where each conductive structure of the second set of conductive structures 230 overlaps each conductive structure of the first set of conductive structures 130. In some embodiments, operation 1910 of method 1900 includes at least operation 1936 or 1938 of method 1900' (shown below). In some embodiments, the second set of vias 225 are located at V1. In some embodiments, the second set of vias 225 are located between M1 and M2. Other configurations of via levels or metal levels are within the scope of the present disclosure.

In operation 1912, a third set of conductive structures 240 is formed. In some embodiments, the third set of conductive structures 240 includes one or more of conductive structures 220a, 220b, . . . , 220f. In some embodiments, the third set of conductive structures 240 extends in the second direction Y, and overlaps the set of rails 120 and the first set of conductive structures 130. In some embodiments, the third set of conductive structures 240 is located at a fourth level different than the first level, the second level and the third level. In some embodiments, the fourth level is M3. Other configurations of levels are within the scope of the present disclosure. In some embodiments, each conductive structure of the third set of conductive structures 240 is separated from one another in the first direction X. In some embodiments, operation 1912 of method 1900 includes at least operation 1940 or 1942 of method 1900'.

In operation 1914, a third set of vias 235 is formed between the third set of conductive structures 240 and the second set of conductive structures 230. In some embodiments, the third set of vias 235 includes one or more of vias 210a, 210b, 210c, vias 212a, 212b, 212c or vias 214a, 214b, 214c. In some embodiments, the third set of vias 235 couple the third set of conductive structures 240 to the second set of conductive structures 230. In some embodiments, operation 1914 of method 1900 includes at least operation 1944 or 1946 of method 1900' (shown below). In some embodiments, the third set of vias 235 are located at V2. In some embodiments, the third set of vias 235 are located between M2 and M3 (not shown). Other configurations of via levels or metal levels are within the scope of the present disclosure. In some embodiments, method 1900 further includes one or more operations to manufacture a set of masks based on one or more layout patterns of method 1900' (shown below), and using the set of masks to manufacture the one or more structural elements in method 1900.

Figure 19B:
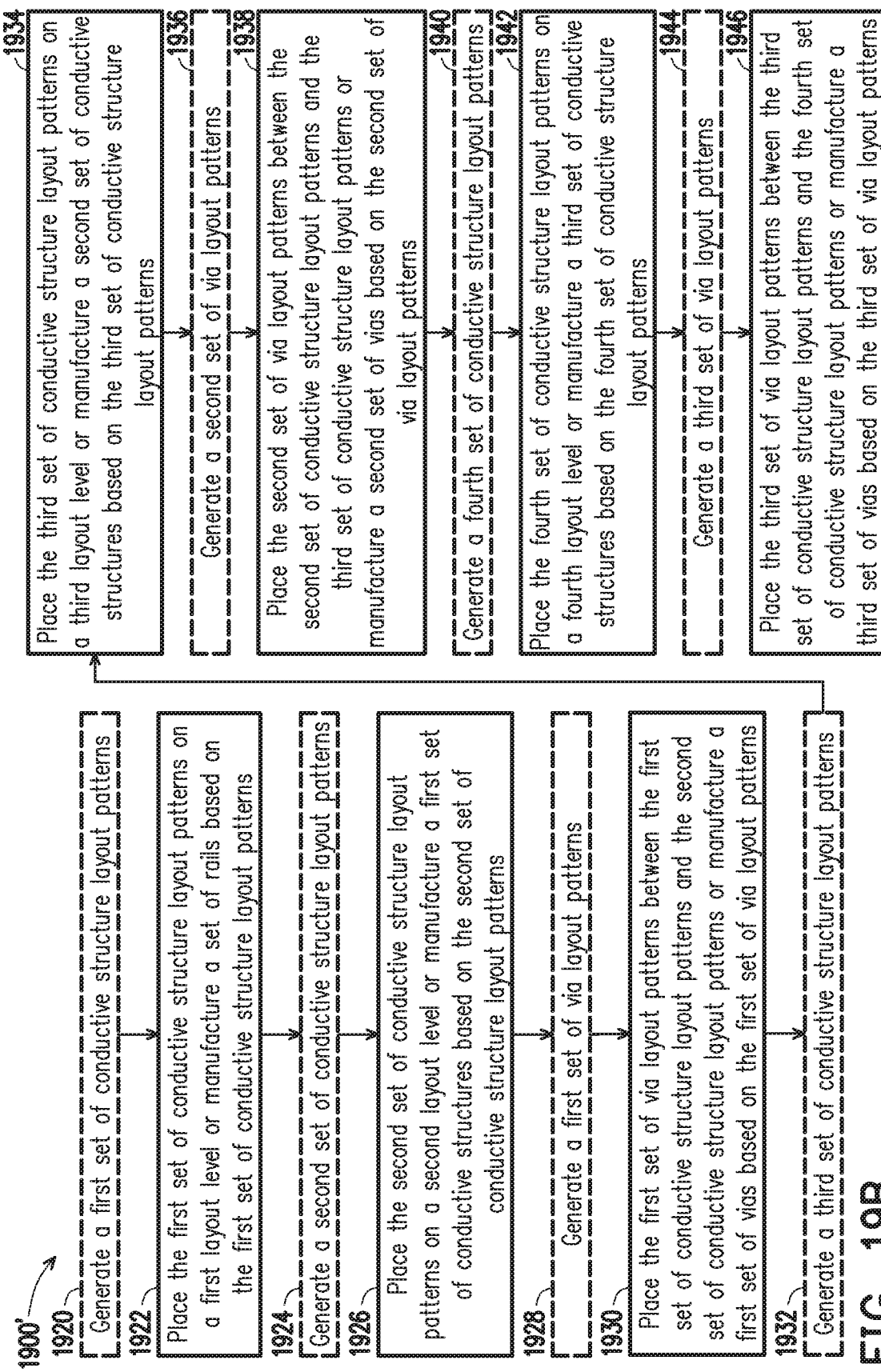
FIG. 19B is a flowchart of a method of manufacturing an IC, in accordance with some embodiments.

FIG. 19B is a flowchart of a method 1900' of manufacturing an IC in accordance with some embodiments. It is understood that additional operations may be performed before, during, and/or after the method 1900' depicted in FIG. 19B, and that some other processes may only be briefly described herein. In some embodiments, the method 1900' is usable to form ICs, such as IC structure 100, 100', 200 or 300 (FIGS. 1A-1B, 2A-2C or 3A-3C). In some embodiments, the method 1900' is usable to form integrated circuits having similar structural relationships as one or more of layout patterns 400-1800 (FIGS. 4A-4B, 5A-5B or 6-18).

In operation 1920 of method 1900', a first set of conductive structure layout patterns are generated. The first set of conductive structure layout patterns correspond to fabricating a set of rails 120 of IC structure 100, 100', 200 or 300. In some embodiments, the first set of conductive structure layout patterns includes one or more of first conductive layout pattern 401a, second conductive layout pattern 401b, third conductive layout pattern 401c, second conductive layout pattern 1201a, third conductive layout pattern 1201b, second conductive layout pattern 1401a or third conductive layout pattern 1401b. In some embodiments, the set of rails 120 includes first rail 102a, second rail 102b or third rail 102c. The first set of conductive structure layout patterns extend in a first direction X. In some embodiments, each conductive structure layout pattern of the first set of conductive structure layout patterns is separated from one another in a second direction Y.

In operation 1922 of method 1900', the first set of conductive structure layout patterns are placed on a first layout level. In some embodiments, operation 1922 further includes manufacturing a set of rails 120 based on the first set of conductive structure layout patterns. In some embodiments, the set of rails 120 includes first rail 102a, second rail 102b or third rail 102c. In some embodiments, the first layout level is M0 of IC structure 100, 200, 300. Other configurations of levels are within the scope of the present disclosure.

In operation 1924, a second set of conductive structure layout patterns is generated. The second set of conductive structure layout patterns correspond to fabricating a first set of conductive structures 130 of IC structure 100, 100', 200 or 300. In some embodiments, the second set of conductive structure layout patterns includes one or more of conductive feature layout pattern 402a, 404a, 406a, 408a, 410a, 412a, 402a', 404a', 406a', 408a', 410a', 412a', 702a, 704a, 802a, 804a, 806a or 808a. In some embodiments, the second set of conductive structure layout patterns includes one or more of power layout patterns 402, 404, 406, 408, 410, 412, 402', 404', 406', 408', 410', 412', 702, 704, 802, 804, 806 or 808. In some embodiments, the first set of conductive structures 130 includes one or more of conductive structures 106a, 106b, . . . , 106f, conductive structures 110a, 110b, . . . , 110f, or conductive structures 114a, 114b, . . . , 114f. In some embodiments, the second set of conductive structure layout patterns extend in the second direction Y and overlap the first set of conductive structure layout patterns.

In operation 1926, the second set of conductive structure layout patterns is placed on a second layout level different than the first layout level. In some embodiments, operation 1926 further includes manufacturing a first set of conductive structures 130 based on the second set of conductive structure layout patterns. In some embodiments, the first set of conductive structures 130 includes one or more of conductive structures 106a, 106b, . . . , 106f, conductive structures 110a, 110b, . . . , 110f, or conductive structures 114a, 114b, . . . , 114f. In some embodiments, the second layout level is M1 of IC structure 100, 200, 300. Other configurations of levels are within the scope of the present disclosure.

In operation 1928, a first set of via layout patterns are generated. The first set of via layout patterns correspond to fabricating a first set of vias 125 of IC structure 100, 100', 200 or 300. In some embodiments, the first set of via layout patterns includes one or more of via layout pattern 402d, 404d, 406d, 408d, 410d, 412d, 702d, 704d, 802d, 804d, 806d, 808d, 1604a, 1604b, 1604a' or 1604b'. In some embodiments, the first set of vias 125 includes one or more of vias 104a, 104b, . . . , 104f, vias 108a, 108b, . . . , 108f or vias 112a, 112b, . . . , 112f.

In operation 1930, the first set of via layout patterns are placed between the first layout level and the second layout level. In some embodiments, operation 1930 further includes manufacturing a first set of vias 125 based on the first set of via layout patterns. In some embodiments, the first set of vias 125 includes one or more of vias 104a, 104b, . . . , 104f, vias 108a, 108b, . . . , 108f or vias 112a, 112b, . . . , 112f. In some embodiments, each via layout pattern of the first set of via layout patterns is located where each conductive structure layout pattern of the second set of conductive structure layout patterns overlaps each conductive structure layout pattern of the first set of conductive structure layout patterns. In some embodiments, the first set of via layout patterns couple the first set of conductive structure layout patterns to the second set of conductive structure layout patterns. Other configurations of levels are within the scope of the present disclosure.

In operation 1932, a third set of conductive structure layout patterns are generated. The third set of conductive structure layout patterns correspond to fabricating a second set of conductive structures 230 of IC structure 100, 100', 200 or 300. In some embodiments, the third set of conductive structure layout patterns includes one or more of conductive feature layout pattern 208b', 208c', 1502a, 1502b, 1602a or 1602b. In some embodiments, the second set of conductive structures 230 includes one or more of first conductive structure 208a, second conductive structure 208b or third conductive structure 208c. In some embodiments, the third set of conductive structure layout patterns extend in the first direction X and is directly over the first set of conductive structure layout patterns. In some embodiments, each conductive structure layout pattern of the third set of conductive structure layout patterns is separated from one another in the second direction Y.

In operation 1934, the third set of conductive structure layout patterns are placed on a third layout level. In some embodiments, operation 1934 further includes manufacturing a second set of conductive structures 230 based on the third set of conductive structure layout patterns. In some embodiments, the second set of conductive structures 230 includes first conductive structure 208a, second conductive structure 208b or third conductive structure 208c. In some embodiments, the third layout level is M2 of IC structure 100, 200, 300. Other configurations of levels are within the scope of the present disclosure.

In operation 1936, a second set of via layout patterns are generated. The second set of via layout patterns correspond to fabricating a second set of vias 225 of IC structure 100, 100', 200 or 300. In some embodiments, the second set of via layout patterns includes one or more of 204a', 204b', 204c', 204d', 204e', 206a', 206b', 206c', 206d', 206e', 1606a, 1606b, 1606a' or 1606b'. In some embodiments, the second set of vias 225 includes one or more of vias 202a, 202b, ..., 202f, vias 204a, 204b, ..., 204f or vias 206a, 206b, ..., 206f.

In operation 1938, the second set of via layout patterns is placed between the second layout level and the third layout level. In some embodiments, operation 1938 further includes manufacturing a second set of vias 225 based on the second set of via layout patterns. In some embodiments, the second set of vias 225 includes one or more of vias 202a, 202b, ..., 202f, vias 204a, 204b, ..., 204f or vias 206a, 206b, ..., 206f. In some embodiments, the second set of via layout patterns couple the third set of conductive structure layout patterns to the second set of conductive structure layout patterns. In some embodiments, each via layout pattern of the second set of via layout patterns is located where each conductive structure layout pattern of the third set of conductive structure layout patterns overlaps each conductive structure layout pattern of the second set of conductive structure layout patterns. Other configurations of levels are within the scope of the present disclosure.

In operation 1940, a fourth set of conductive structure layout patterns is generated. The fourth set of conductive structure layout patterns correspond to fabricating a third set of conductive structures 240 of IC structure 100, 100', 200 or 300. In some embodiments, the fourth set of conductive structure layout patterns includes one or more of conductive feature layout patterns 220a', 220b', 220c', 220d' or 220e'. In some embodiments, the fourth set of conductive structures includes one or more of conductive structures 220a, 220b, ..., or 220f. In some embodiments, the fourth set of conductive structure layout patterns extend in the second direction Y and overlap the first set of conductive structure layout patterns and the second set of conductive structure layout patterns. In some embodiments, each conductive structure layout pattern of the fourth set of conductive structure layout patterns is separated from one another in the first direction X.

In operation 1942, the fourth set of conductive structure layout patterns is placed on a fourth layout level. In some embodiments, operation 1942 further includes manufacturing a third set of conductive structures 240 based on the fourth set of conductive structure layout patterns. In some embodiments, the third set of conductive structures 240 includes one or more of conductive structures 220a, 220b, ..., 220f. In some embodiments, the fourth layout level is M3 of IC structure 100, 200, 300. Other configurations of levels are within the scope of the present disclosure.

In operation 1944, a third set of via layout patterns is generated. The third set of via layout patterns correspond to fabricating a third set of vias 235 of IC structure 100, 100', 200 or 300. In some embodiments, the third set of via layout patterns includes one or more of 214a', 214b', 214c', 212a', 212b', 212c', 1608a or 1608a'. In some embodiments, the third set of vias 235 includes one or more of vias 210a, 210b, 210c, vias 212a, 212b, 212c or vias 214a, 214b, 214c.

In operation 1946, the third set of via layout patterns is placed between the third layout level and the fourth layout level. In some embodiments, operation 1946 further includes manufacturing a third set of vias 235 based on the third set of via layout patterns. In some embodiments, the third set of vias 235 includes one or more of vias 210a, 210b, 210c, vias 212a, 212b, 212c or vias 214a, 214b, 214c. In some embodiments, the third set of via layout patterns couple the fourth set of conductive structure layout patterns to the third set of conductive structure layout patterns. Other configurations of levels are within the scope of the present disclosure.

In some embodiments, one or more of operations 1920, 1922, 1924, 1926, 1928, 1930, 1932, 1934, 1936, 1938, 1940, 1942 or 1944 are optional. In some embodiments, method 1900' further includes one or more operations to manufacture a set of masks based on one or more layout patterns of method 1900'. In these embodiments, method 1900' further includes one or more operations to manufacture integrated circuit IC structure 100, 100', 200 or 300 using the set of masks.

One or more of operations 1920, 1922, 1924, 1926, 1928, 1930, 1932, 1934, 1936, 1938, 1940, 1942, 1944 or 1946 is performed by a processing device configured to execute instructions for manufacturing an IC, such as IC structure 100, 100', 200, or 300. In some embodiments, one or more of operations 1920, 1922, 1924, 1926, 1928, 1930, 1932, 1934, 1936, 1938, 1940, 1942, 1944 or 1946 is performed using a same processing device as that used in a different one or more of operations 1920, 1922, 1924, 1926, 1928, 1930, 1932, 1934, 1936, 1938, 1940, 1942, 1944 or 1946. In some embodiments, a different processing device is used to perform one or more of operations 1920, 1922, 1924, 1926, 1928, 1930, 1932, 1934, 1936, 1938, 1940, 1942, 1944 or 1946 from that used to perform a different one or more of operations 1920, 1922, 1924, 1926, 1928, 1930, 1932, 1934, 1936, 1938, 1940, 1942, 1944 or 1946.

Figure 20:
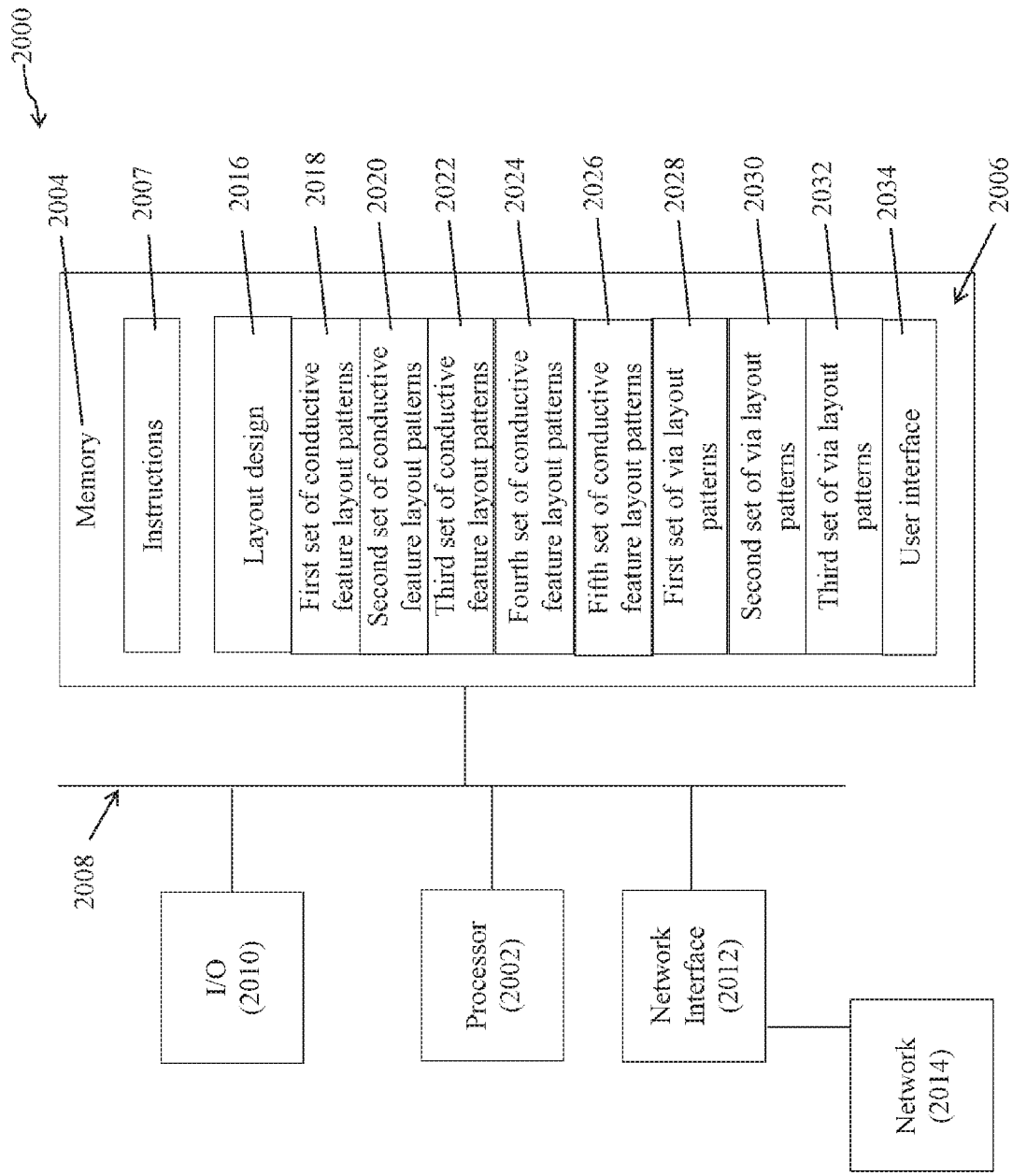
FIG. 20 is a block diagram of a system of designing an IC layout design, in accordance with some embodiments.

FIG. 20 is a schematic view of a system 2000 for designing an IC layout design in accordance with some embodiments. System 2000 includes a hardware processor 2002 and a non-transitory, computer readable storage medium 2004 encoded with, i.e., storing, the computer program code 2006, i.e., a set of executable instructions. Computer readable storage medium 2004 is also encoded with instructions 2007 for interfacing with manufacturing machines for producing the integrated circuit. The processor 2002 is electrically coupled to the computer readable storage medium 2004 via a bus 2008. The processor 2002 is also electrically coupled to an I/O interface 2010 by bus 2008. A network interface 2012 is also electrically connected to the processor 2002 via bus 2008. Network interface 2012 is connected to a network 2014, so that processor 2002 and computer readable storage medium 2004 are capable of connecting to external elements via network 2014. The processor 2002 is configured to execute the computer program code 2006 encoded in the computer readable storage medium 2004 in order to cause system 2000 to be usable for performing a portion or all of the operations as described in method 1900'.

In some embodiments, the processor 2002 is a central processing unit (CPU), a multi-processor, a distributed processing system, an application specific integrated circuit (ASIC), and/or a suitable processing unit.

In some embodiments, the computer readable storage medium 2004 is an electronic, magnetic, optical, electromagnetic, infrared, and/or a semiconductor system (or apparatus or device). For example, the computer readable storage medium 2004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2004 includes a compact disk-read only memory (CD-ROM), a compact disk-read/write (CD-R/W), and/or a digital video disc (DVD).

In some embodiments, the storage medium 2004 stores the computer program code 2006 configured to cause system 2000 to perform method 1900 or 1900'. In some embodiments, the storage medium 2004 also stores information needed for performing method 1900 or 1900' as well as information generated during performing method 1900 or 1900', such as layout design 2016, first set of conductive feature layout patterns 2018, second set of conductive feature layout patterns 2020, third set of conductive feature layout patterns 1222, fourth set of conductive feature layout patterns 2024, fifth set of conductive feature layout patterns 2026, first set of via layout patterns 2028, second set of via layout patterns 2030, third set of via layout patterns 2032 and user interface 2034, and/or a set of executable instructions to perform the operation of method 1900 or 1900'.

In some embodiments, the storage medium 2004 stores instructions 2007 for interfacing with manufacturing machines. The instructions 2007 enable processor 2002 to generate manufacturing instructions readable by the manufacturing machines to effectively implement method 1900 or 1900' during a manufacturing process.

System 2000 includes I/O interface 2010. I/O interface 2010 is coupled to external circuitry. In some embodiments, I/O interface 2010 includes a keyboard, keypad, mouse, trackball, trackpad, and/or cursor direction keys for communicating information and commands to processor 2002.

System 2000 also includes network interface 2012 coupled to the processor 2002. Network interface 2012 allows system 2000 to communicate with network 2014, to which one or more other computer systems are connected. Network interface 2012 includes wireless network interfaces such as BLUETOOTH, WIFI, WIMAX, GPRS, or WCDMA; or wired network interface such as ETHERNET, USB, or IEEE-1394. In some embodiments, method 1900 or 1900' is implemented in two or more systems 2000, and information such as layout design, first set of conductive feature layout patterns, second set of conductive feature layout patterns, third set of conductive feature layout patterns, fourth set of conductive feature layout patterns, fifth set of conductive feature layout patterns, first set of via layout patterns, second set of via layout patterns, third set of via layout patterns and user interface are exchanged between different systems 2000 by network 2014.

System 2000 is configured to receive information related to a layout design through I/O interface 2010 or network interface 2012. The information is transferred to processor 2002 by bus 2008 to determine a layout design for producing integrated circuit structure 100, 100', 200 or 300. The layout design is then stored in computer readable medium 2004 as layout design 2016. System 2000 is configured to receive information related to a first set of conductive feature layout patterns through I/O interface 2010 or network interface 2012. The information is stored in computer readable medium 2004 as first set of conductive feature layout patterns 2018. System 2000 is configured to receive information related to a second set of conductive feature layout patterns through I/O interface 2010 or network interface 2012. The information is stored in computer readable medium 2004 as second set of conductive feature layout patterns 2020. System 2000 is configured to receive information related to a third set of conductive feature layout patterns through I/O interface 2010 or network interface 2012. The information is stored in computer readable medium 2004 as third set of conductive feature layout patterns 2022. System 2000 is configured to receive information related to a fourth set of conductive feature layout patterns through I/O interface 2010 or network interface 2012. The information is stored in computer readable medium 2004 as fourth set of conductive feature layout patterns 2024. System 2000 is configured to receive information related to a fifth set of conductive feature layout patterns through I/O interface 2010 or network interface 2012. The information is stored in computer readable medium 2004 as fifth set of conductive feature layout patterns 2026. System 2000 is configured to receive information related to a first set of via layout patterns through I/O interface 2010 or network interface 2012. The information is stored in computer readable medium 2004 as first set of via layout patterns 2028. System 2000 is configured to receive information related to a second set of via layout patterns through I/O interface 2010 or network interface 2012. The information is stored in computer readable medium 2004 as second set of via layout patterns 2030. System 2000 is configured to receive information related to a third set of via layout patterns through I/O interface 2010 or network interface 2012. The information is stored in computer readable medium 2004 as third set of via layout patterns 2032. System 2000 is configured to receive information related to a user interface through I/O interface 2010 or network interface 2012. The information is stored in computer readable medium 2004 as user interface 2034.

In some embodiments, method 1900 or 1900' is implemented as a standalone software application for execution by a processor. In some embodiments, method 1900 or 1900' is implemented as a software application that is a part of an additional software application. In some embodiments, method 1900 or 1900' is implemented as a plug-in to a software application. In some embodiments, method 1900 or 1900' is implemented as a software application that is a portion of an EDA tool. In some embodiments, method 1900 or 1900' is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1900 is implemented by a manufacturing device to manufacture an integrated circuit (e.g., integrated circuit 100, 200 or 300) using a set of masks manufactured based on one or more layout designs (e.g., layout design 400, 400', 500, 500', 600, 700, 800, 900, 1000, 1100, 1200, 1300, 1400, 1500, 1600, 1700 or 1800) generated by system 2000.

System 2000 of FIG. 20 generates layout designs (e.g., layout design 400, 400', 500, 500', 600, 700, 800, 900, 1000, 1100, 1200, 1300, 1400, 1500, 1600, 1700 or 1800) of integrated circuit structure 100, 100', 200 or 300 that occupy less area and provide better routing resources than other approaches.

One aspect of this description relates to an integrated circuit structure. The integrated circuit structure comprising a set of rails, a first set of conductive structures, a first set of vias and a second set of conductive structures. The set of rails extending in a first direction and being located at a first level. Each rail of the set of rails being separated from one another in a second direction. The first set of conductive structures extending in the second direction, overlapping the set of rails and being located at a second level different than the first level. The first set of vias being between the set of rails and the first set of conductive structures. Each via of the first set of vias being located where each conductive structure of the first set of conductive structures overlaps each rail of the set of rails. The first set of vias coupling the set of rails to the first set of conductive structures. The second set of conductive structures is between the set of rails, extend in the second direction, and is located at the second level.

Another aspect of this description relates to an integrated circuit designing system. The system comprises a non-transitory storage medium encoded with a set of instructions; and a hardware processor communicatively coupled with the non-transitory storage medium and configured to execute the set of instructions. The set of instructions being configured to cause the processor to: place a first set of conductive structure layout patterns on a first layout level, the first set of conductive structure layout patterns corresponding to fabricating a set of rails of an integrated circuit structure, the first set of conductive structure layout patterns extending in a first direction, each conductive structure layout pattern of the first set of conductive structure layout patterns being separated from one another in a second direction; place a second set of conductive structure layout patterns on a second layout level different than the first layout level, the second set of conductive structure layout patterns corresponding to fabricating a first set of conductive structures of the integrated circuit structure, the second set of conductive structure layout patterns extending in the second direction and overlapping the first set of conductive structure layout patterns, and place a first set of via layout patterns between the first layout level and the second layout level, the first set of via layout patterns corresponding to fabricating a first set of vias of the integrated circuit structure, each via layout pattern of the first set of via layout patterns being located where each conductive structure layout pattern of the second set of conductive structure layout patterns overlaps each conductive structure layout pattern of the first set of conductive structure layout patterns, the first set of via layout patterns couple the first set of conductive structure layout patterns to the second set of conductive structure layout patterns. The second layout level is above the first layout level.

Still another aspect of this description relates to a method of forming an integrated circuit structure. The method including generating a first set of conductive structure layout patterns and manufacturing a set of rails based on the first set of conductive structure layout patterns. The first set of conductive structure layout patterns extends in a first direction. Each conductive structure layout pattern of the first set of conductive structure layout patterns is separated from one another in a second direction different from the first direction. The set of rails extending in a first direction and being located at a first level. Each rail of the set of rails being separated from one another in a second direction. The method further includes generating a second set of conductive structure layout patterns and manufacturing a first set of conductive structures based on the second set of conductive structure layout patterns. The second set of conductive structure layout patterns extends in the second direction and overlaps the first set of conductive structure layout patterns. The first set of conductive structures extending in a second direction, overlapping the set of rails and being located at a second level different than the first level. The first set of conductive structures comprising a first sub-set of conductive structures and a second sub-set of conductive structures. At least one conductive structure of the first sub-set of conductive structures being aligned with at least one conductive structure of the second sub-set of conductive structures in the second direction. The method further includes manufacturing a first set of vias based on a first set of via layout patterns. The first set of vias is between the set of rails and the first set of conductive structures. Each via of the first set of vias being located where each conductive structure of the first set of conductive structures overlaps each rail of the set of rails. The first set of vias coupling the set of rails to the first set of conductive structures. In some embodiments, at least one of the generating operations of the method of forming the integrated circuit structure is executed by a processor of a computer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
    a set of rails extending in a first direction and being located at a first level, each rail of the set of rails being separated from one another in a second direction;
    a first set of conductive structures extending in the second direction, overlapping the set of rails and being located at a second level different than the first level;
    a first set of vias between the set of rails and the first set of conductive structures, each via of the first set of vias being located where each conductive structure of the first set of conductive structures overlaps each rail of the set of rails, and the first set of vias coupling the set of rails to the first set of conductive structures;
    a second set of conductive structures between the set of rails, extending in the second direction, and being located at the second level; and
    a third set of conductive structures extending in the first direction, covering a portion of the set of rails and being located at a third level different than the first level and the second level, each conductive structure of the third set of conductive structures being separated from one another in the second direction.

2. The integrated circuit structure of claim 1, wherein the second set of conductive structures do not overlap the first set of conductive structures and the set of rails, and at least one conductive structure of the second set of conductive structures is aligned with at least one conductive structure of the first set of conductive structures in the second direction.

3. The integrated circuit structure of claim 2, wherein the second set of conductive structures comprises:
    a first conductive structure having a first length; and
    a second conductive structure having a second length, the second conductive structure of the second set of conductive structures being aligned with the first conductive structure of the second set of conductive structures in the second direction;
    wherein the second set of conductive structures has at least one of the following configurations:
        (a) the first length being greater than the second length; or (b) the first length being substantially equal to the second length.

4. The integrated circuit structure of claim 1, wherein the set of rails comprises:
a first rail extending in the first direction and configured to supply a first supply voltage;
a second rail extending in the first direction and configured to supply a second supply voltage; and
a third rail extending in the first direction and configured to supply the first supply voltage.

5. The integrated circuit structure of claim 4, wherein the first set of conductive structures comprises:
a first sub-set of conductive structures extending in the second direction and overlapping the first rail of the set of rails, the first sub-set of conductive structures comprising:
a first structure, and
a second structure being separated from the first structure in the first direction;
a second sub-set of conductive structures extending in the second direction and overlapping the second rail of the set of rails, the second sub-set of conductive structures comprising:
a third structure, and
a fourth structure being separated from the third structure in the first direction; and
a third sub-set of conductive structures extending in the second direction and overlapping the third rail of the set of rails, the third sub-set of conductive structures comprising:
a fifth structure, and
a sixth structure being separated from the fifth structure in the first direction.

6. The integrated circuit structure of claim 5, wherein
the first sub-set of conductive structures of the first set of conductive structures does not overlap the second rail of the set of rails or the third rail of the set of rails;
the second sub-set of conductive structures of the first set of conductive structures does not overlap the first rail of the set of rails or the third rail of the set of rails, and
the third sub-set of conductive structures of the first set of conductive structures does not overlap the first rail of the set of rails or the second rail of the set of rails.

7. The integrated circuit structure of claim 5, wherein
the first rail of the set of rails has a first width;
the second rail of the set of rails has a second width;
the third rail of the set of rails has a third width;
the first or second structure of the first sub-set of conductive structures has a fourth width, the fourth width being greater than the first width;
the third or fourth structure of the second sub-set of conductive structures has a fifth width, the fifth width being greater than the second width, and
the fifth or sixth structure of the third sub-set of conductive structures has a sixth width, the sixth width being greater than the third width.

8. The integrated circuit structure of claim 5, wherein
the first sub-set of conductive structures, the second sub-set of conductive structures and the third sub-set of conductive structures are aligned in the second direction.

9. The integrated circuit structure of claim 5, wherein
the first sub-set of conductive structures and the third sub-set of conductive structures are aligned in the second direction, and
either the first sub-set of conductive structures or the third sub-set of conductive structures is not aligned with the second sub-set of conductive structures in the second direction.

10. The integrated circuit structure of claim 5, further comprising:
a second set of vias between the third set of conductive structures and the first set of conductive structures, the second set of vias coupling the third set of conductive structures to the first set of conductive structures, each via of the second set of vias being located where each conductive structure of the third set of conductive structures overlaps each conductive structure of the first set of conductive structures.

11. The integrated circuit structure of claim 10, further comprising:
a fourth set of conductive structures extending in the second direction, overlapping the set of rails and the first set of conductive structures, and being located at a fourth level different than the first level, the second level and the third level, each conductive structure of the fourth set of conductive structures being separated from one another in the first direction, and
a third set of vias between the fourth set of conductive structures and the third set of conductive structures, and the third set of vias coupling the fourth set of conductive structures to the third set of conductive structures.

12. The integrated circuit structure of claim 11, wherein the third set of vias comprises:
a first sub-set of vias over the first rail of the set of rails, and being separated from one another in the first direction;
a second sub-set of vias over the second rail of the set of rails, and being separated from one another in the first direction,
a third sub-set of vias over the third rail of the set of rails, and being separated from one another in the first direction, and
the second sub-set of vias alternating in the first direction with the first sub-set of vias or the third sub-set of vias.

13. The integrated circuit structure of claim 12, wherein
the second sub-set of conductive structures of the first set of conductive structures alternate in the first direction with either: (1) the first sub-set of conductive structures of the first set of conductive structures, or (2) the third sub-set of conductive structures of the first set of conductive structures, and
the third set of vias being located where the third set of conductive structures overlap the second set of vias.

14. An integrated circuit designing system, comprising:
a non-transitory storage medium encoded with a set of instructions;
a hardware processor communicatively coupled with the non-transitory storage medium and configured to execute the set of instructions, the set of instructions being configured to cause the hardware processor to:
place a first set of conductive structure layout patterns on a first layout level, the first set of conductive structure layout patterns corresponding to fabricating a set of rails of an integrated circuit structure, the first set of conductive structure layout patterns extending in a first direction, each conductive structure layout pattern of the first set of conductive structure layout patterns being separated from one another in a second direction;
place a second set of conductive structure layout patterns on a second layout level different than the first layout level, the second layout level being above the first layout level, the second set of conductive structure layout patterns corresponding to fabricating a first set of conductive structures of the integrated circuit structure, the second set of conductive structure layout patterns extending in the second direction and overlapping the first set of conductive structure layout patterns;

place a cut feature layout pattern on the second layout level, the cut feature layout pattern corresponding to a cut region of the first set of conductive structures, the cut feature layout pattern extending in the first direction and overlapping at least a first layout pattern of the second set of conductive structure layout patterns;

place a first set of via layout patterns between the first layout level and the second layout level, the first set of via layout patterns corresponding to fabricating a first set of vias of the integrated circuit structure, each via layout pattern of the first set of via layout patterns being located where each conductive structure layout pattern of the second set of conductive structure layout patterns overlaps each conductive structure layout pattern of the first set of conductive structure layout patterns, the first set of vias couple the first set of conductive structures to the set of rails; and place a third set of conductive structure layout patterns on a third layout level, the third set of conductive structure layout patterns corresponding to fabricating a second set of conductive structures of the integrated circuit structure, the third set of conductive structure layout patterns extending in the first direction and covering a portion of the first set of conductive structure layout patterns, the third layout level being different than the first layout level and the second layout level, each conductive structure layout pattern of the third set of conductive structure layout patterns being separated from one another in the second direction.

15. The integrated circuit designing system of claim 14, wherein the set of instructions is configured to cause the hardware processor to:

place a fourth set of conductive structure layout patterns on the second layout level, the fourth set of conductive structure layout patterns corresponding to fabricating a third set of conductive structures of the integrated circuit structure, the fourth set of conductive structure layout patterns extending in the second direction, the fourth set of conductive structure layout patterns do not overlap with the second set of conductive structure layout patterns, and at least one conductive structure layout pattern of the fourth set of conductive structure layout patterns being aligned with at least one conductive structure layout pattern of the second set of conductive structure layout patterns in the second direction.

16. The integrated circuit designing system of claim 14, wherein the set of instructions is configured to cause the hardware processor to:

place a second set of via layout patterns between the second layout level and the third layout level, the second set of via layout patterns corresponding to fabricating a second set of vias of the integrated circuit structure, the second set of vias couple the first set of conductive structures to the second set of conductive structures, each via layout pattern of the second set of via layout patterns being located where each conductive structure layout pattern of the third set of conductive structure layout patterns overlaps each conductive structure layout pattern of the second set of conductive structure layout patterns.

17. The integrated circuit designing system of claim 16, wherein the set of instructions is configured to cause the hardware processor to:

place a fourth set of conductive structure layout patterns on a fourth layout level, the fourth set of conductive structure layout patterns corresponding to fabricating a third set of conductive structures of the integrated circuit structure, the fourth set of conductive structure layout patterns extending in the second direction and overlapping the first set of conductive structure layout patterns and the second set of conductive structure layout patterns, the fourth layout level being different than the first layout level, the second layout level and the third layout level, each conductive structure layout pattern of the fourth set of conductive structure layout patterns being separated from one another in the first direction; and place a third set of via layout patterns between the third layout level and the fourth layout level, the third set of via layout patterns corresponding to fabricating a third set of vias of the integrated circuit structure, the third set of vias couple the second set of conductive structures to the third set of conductive structures.

18. A method of forming an integrated circuit structure, the method comprising:

generating a first set of conductive structure layout patterns, the first set of conductive structure layout patterns extending in a first direction, each conductive structure layout pattern of the first set of conductive structure layout patterns being separated from one another in a second direction different from the first direction;

manufacturing a set of rails based on the first set of conductive structure layout patterns, the set of rails extending in the first direction and being located at a first level, each rail of the set of rails being separated from one another in the second direction;

generating a second set of conductive structure layout patterns, the second set of conductive structure layout patterns extending in the second direction and overlapping the first set of conductive structure layout patterns;

manufacturing a first set of conductive structures based on the second set of conductive structure layout patterns, the first set of conductive structures extending in the second direction, overlapping the set of rails and being located at a second level different than the first level, the first set of conductive structures comprising a first sub-set of conductive structures and a second sub-set of conductive structures, at least one conductive structure of the first sub-set of conductive structures being aligned with at least one conductive structure of the second sub-set of conductive structures in the second direction, manufacturing a first set of vias based on a first set of via layout patterns, the first set of vias being between the set of rails and the first set of conductive structures, each via of the first set of vias being located where each conductive structure of the first set of conductive structures overlaps each rail of the set of rails, and the first set of vias coupling the set of rails to the first set of conductive structures; and generating a third set of conductive structure layout patterns, the third set of conductive structure layout patterns extending in the first direction, and covering a portion of the first set of conductive structure layout patterns, each conductive structure layout pattern of the third set of conductive structure layout patterns being separated from one another in the second direction, wherein at least one of the generating operations is executed by a processor of a computer.

19. The method of claim 18, further comprising:

manufacturing a second set of conductive structures based on the third set of conductive structure layout patterns, the second set of conductive structures covering a portion of the set of rails, the second set of conductive structures extending in the first direction, and being located at a third level different than the first level and the second level, each conductive structure of the second set of conductive structures being separated from one another in the second direction, and manufacturing a second set of vias based on a second set of via layout patterns, the second set of vias being between the second set of conductive structures and the first set of conductive structures, the second set of vias coupling the second set of conductive structures to the first set of conductive structures, each via of the second set of vias being located where each conductive structure of the second set of conductive structures overlaps each conductive structure of the first set of conductive structures.

20. The method of claim 19, further comprising:

generating a fourth set of conductive structure layout patterns, the fourth set of conductive structure layout patterns extending in the second direction, and overlapping the first set of conductive structure layout patterns and the second set of conductive structure layout patterns;

manufacturing a third set of conductive structures based on the fourth set of conductive structure layout patterns, the third set of conductive structures extending in the second direction, overlapping the set of rails and the first set of conductive structures, and being located at a fourth level different than the first level, the second level and the third level, each conductive structure of the third set of conductive structures being separated from one another in the first direction; and manufacturing a third set of vias based on a third set of via layout patterns, the third set of vias being between the third set of conductive structures and the second set of conductive structures, and the third set of vias coupling the third set of conductive structures to the second set of conductive structures.

* * * * *